(12) United States Patent
Han et al.

(10) Patent No.: US 8,923,053 B2
(45) Date of Patent: Dec. 30, 2014

(54) NONVOLATILE MEMORY DEVICE, OPERATING METHOD THEREOF, AND MEMORY SYSTEM INCLUDING THE SAME

(71) Applicants: Jinman Han, Seongnam-si (KR); Sunil Shim, Seoul (KR); Hansoo Kim, Suwon-si (KR); Jae-Hoon Jang, Seongnam-si (KR); Byoungkeun Son, Suwon-si (KR)

(72) Inventors: Jinman Han, Seongnam-si (KR); Sunil Shim, Seoul (KR); Hansoo Kim, Suwon-si (KR); Jae-Hoon Jang, Seongnam-si (KR); Byoungkeun Son, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/029,100

(22) Filed: Sep. 17, 2013

(65) Prior Publication Data

US 2014/0016413 A1    Jan. 16, 2014

Related U.S. Application Data

(62) Division of application No. 13/028,918, filed on Feb. 16, 2011, now Pat. No. 8,559,224.

(60) Provisional application No. 61/371,431, filed on Aug. 6, 2010.

(30) Foreign Application Priority Data

Feb. 17, 2010 (KR) .......................... 10-2010-0014271
Aug. 3, 2010 (KR) .......................... 10-2010-0075065

(51) Int. Cl.
| | | |
|---|---|---|
| G11C 16/04 | (2006.01) | |
| G11C 16/34 | (2006.01) | |
| H01L 27/115 | (2006.01) | |
| G11C 16/16 | (2006.01) | |
| G11C 16/10 | (2006.01) | |
| H01L 29/792 | (2006.01) | |

(52) U.S. Cl.
CPC ............ *G11C 16/04* (2013.01); *G11C 16/3418* (2013.01); *H01L 27/11582* (2013.01); *G11C 16/16* (2013.01); *G11C 16/10* (2013.01); *H01L 29/7926* (2013.01); *H01L 27/11578* (2013.01)
USPC .................................. 365/185.11; 365/185.17

(58) Field of Classification Search
USPC ........................................ 365/185.11, 185.17
See application file for complete search history.

(56) References Cited

U.S. PATENT DOCUMENTS

| | | | |
|---|---|---|---|
| 5,511,022 | A | 4/1996 | Yim et al. |
| 5,673,223 | A | 9/1997 | Park |

(Continued)

FOREIGN PATENT DOCUMENTS

| | | |
|---|---|---|
| CN | 1906700 A | 1/2007 |
| CN | 101106140 A | 1/2008 |

(Continued)

OTHER PUBLICATIONS

Notice of Allowance dated Oct. 11, 2013 in corresponding U.S. Appl. No. 13/967,455.

(Continued)

*Primary Examiner* — Huan Hoang
(74) *Attorney, Agent, or Firm* — Harness, Dickey & Pierce, P.L.C.

(57) ABSTRACT

Provided is a method of operating a nonvolatile memory device that includes a substrate and memory blocks having a plurality of memory cells stacked along a direction perpendicular to the substrate. The method includes: reading data from a selected sub block among sub blocks of a selected memory block and selectively refreshing each sub block of the selected memory block in response to the reading of the selected sub block, wherein each sub block of the selected memory block is separately erased.

21 Claims, 57 Drawing Sheets

(56) References Cited

U.S. PATENT DOCUMENTS

| | | |
|---|---|---|
| 5,715,193 A | 2/1998 | Norman |
| 5,740,107 A | 4/1998 | Lee |
| 5,923,587 A | 7/1999 | Choi |
| 6,009,014 A | 12/1999 | Hollmer et al. |
| 6,028,788 A | 2/2000 | Choi et al. |
| 6,285,587 B1 | 9/2001 | Kwon |
| 6,295,227 B1 | 9/2001 | Sakui et al. |
| 6,650,566 B2 | 11/2003 | Jeong et al. |
| 6,850,439 B1 | 2/2005 | Tanaka |
| 6,894,924 B2 | 5/2005 | Choi et al. |
| 6,975,542 B2 | 12/2005 | Roohparvar |
| 7,064,981 B2 | 6/2006 | Roohparvar |
| 7,064,986 B2 | 6/2006 | Lee et al. |
| 7,079,419 B2 | 7/2006 | Roohparvar |
| 7,149,124 B2 | 12/2006 | Nazarian |
| 7,177,192 B2 | 2/2007 | Yoon et al. |
| 7,233,522 B2 | 6/2007 | Chen et al. |
| 7,292,476 B2 | 11/2007 | Goda et al. |
| 7,403,422 B2 | 7/2008 | Kim et al. |
| 7,403,429 B2 | 7/2008 | Chae et al. |
| 7,408,806 B2 | 8/2008 | Park et al. |
| 7,417,904 B2 | 8/2008 | Sivero et al. |
| 7,450,433 B2 | 11/2008 | Wan et al. |
| 7,480,178 B2 | 1/2009 | Park et al. |
| 7,489,556 B2 | 2/2009 | Tanzawa |
| 7,518,920 B2 | 4/2009 | Kang |
| 7,529,138 B2 | 5/2009 | Park et al. |
| 7,532,514 B2 | 5/2009 | Cernea et al. |
| 7,551,477 B2 | 6/2009 | Mokhlesi et al. |
| 7,551,487 B2 | 6/2009 | Park et al. |
| 7,551,492 B2 | 6/2009 | Kim |
| 7,566,927 B2 | 7/2009 | Kim et al. |
| 7,606,074 B2 | 10/2009 | Wan et al. |
| 7,633,803 B2 | 12/2009 | Lee |
| 7,652,931 B2 * | 1/2010 | Park et al. ............... 365/185.29 |
| 7,668,014 B2 | 2/2010 | Hwang |
| 7,724,577 B2 | 5/2010 | Goda et al. |
| 7,778,078 B2 | 8/2010 | Nagadomi et al. |
| 7,778,084 B2 | 8/2010 | Kim et al. |
| 7,813,184 B2 | 10/2010 | Kim et al. |
| 7,859,902 B2 | 12/2010 | Maejima |
| 7,888,731 B2 | 2/2011 | Kim |
| 7,924,629 B2 | 4/2011 | Park et al. |
| 7,933,151 B2 | 4/2011 | Maeda et al. |
| 7,936,004 B2 | 5/2011 | Kito et al. |
| 7,936,617 B2 | 5/2011 | Sudo |
| 7,940,572 B2 | 5/2011 | Kim |
| 7,952,136 B2 | 5/2011 | Kito et al. |
| 7,983,084 B2 | 7/2011 | Tokiwa et al. |
| 8,013,389 B2 | 9/2011 | Oh et al. |
| 8,023,321 B2 | 9/2011 | Kim |
| 8,125,825 B2 | 2/2012 | Seol |
| 8,149,635 B2 | 4/2012 | Lee |
| 8,169,826 B2 | 5/2012 | Hishida et al. |
| 8,189,391 B2 | 5/2012 | Itagaki et al. |
| 8,228,733 B2 | 7/2012 | Tokiwa et al. |
| 8,243,518 B2 | 8/2012 | Oh et al. |
| 8,274,108 B2 | 9/2012 | Katsumata et al. |
| 8,318,602 B2 | 11/2012 | Kito et al. |
| 8,467,246 B2 | 6/2013 | Kim et al. |
| 8,570,805 B2 | 10/2013 | Lee |
| 8,582,372 B2 | 11/2013 | Kim |
| 8,638,608 B2 | 1/2014 | Lai et al. |
| 2002/0071311 A1 | 6/2002 | Jeong et al. |
| 2005/0006692 A1 | 1/2005 | Kim et al. |
| 2005/0128807 A1 | 6/2005 | Chen et al. |
| 2005/0141283 A1 | 6/2005 | Lee et al. |
| 2005/0248991 A1 | 11/2005 | Lee et al. |
| 2006/0050594 A1 | 3/2006 | Park |
| 2006/0140012 A1 | 6/2006 | Wan et al. |
| 2007/0070701 A1 | 3/2007 | Kim et al. |
| 2007/0158736 A1 | 7/2007 | Arai et al. |
| 2007/0159886 A1 | 7/2007 | Kang |
| 2007/0183204 A1 | 8/2007 | Kim et al. |
| 2007/0230253 A1 | 10/2007 | Kim |
| 2007/0247912 A1 | 10/2007 | Kamigaichi et al. |
| 2007/0252201 A1 | 11/2007 | Kito et al. |
| 2007/0297234 A1 | 12/2007 | Cernea et al. |
| 2008/0007999 A1 | 1/2008 | Park et al. |
| 2008/0013377 A1 | 1/2008 | Sel et al. |
| 2008/0099819 A1 | 5/2008 | Kito et al. |
| 2008/0173928 A1 | 7/2008 | Arai et al. |
| 2008/0173933 A1 | 7/2008 | Fukuzumi et al. |
| 2008/0181020 A1 | 7/2008 | Yu et al. |
| 2008/0253183 A1 | 10/2008 | Mizukami et al. |
| 2008/0279012 A1 | 11/2008 | Lee |
| 2008/0310230 A1 | 12/2008 | Kim et al. |
| 2009/0002182 A1 | 1/2009 | Knox et al. |
| 2009/0003075 A1 | 1/2009 | Kim et al. |
| 2009/0021983 A1 | 1/2009 | Wan et al. |
| 2009/0021988 A1 | 1/2009 | Hong et al. |
| 2009/0097309 A1 | 4/2009 | Mizukami et al. |
| 2009/0122613 A1 | 5/2009 | Kim et al. |
| 2009/0168533 A1 | 7/2009 | Park et al. |
| 2009/0172267 A1 * | 7/2009 | Oribe et al. ............... 711/103 |
| 2009/0175081 A1 | 7/2009 | Kim |
| 2009/0180323 A1 | 7/2009 | Park et al. |
| 2009/0268523 A1 | 10/2009 | Maejima |
| 2009/0268524 A1 | 10/2009 | Maejima |
| 2009/0279359 A1 | 11/2009 | Goda et al. |
| 2009/0316491 A1 | 12/2009 | Park et al. |
| 2010/0038703 A1 | 2/2010 | Fukuzumi et al. |
| 2010/0107021 A1 | 4/2010 | Nagadomi et al. |
| 2010/0124120 A1 | 5/2010 | Park et al. |
| 2010/0159657 A1 | 6/2010 | Arai et al. |
| 2010/0177566 A1 * | 7/2010 | Kim et al. ............... 365/185.17 |
| 2010/0195395 A1 | 8/2010 | Jeong et al. |
| 2010/0238732 A1 | 9/2010 | Hishida et al. |
| 2011/0063913 A1 | 3/2011 | Maejima |
| 2011/0170352 A1 | 7/2011 | Kim |
| 2011/0189853 A1 | 8/2011 | Kito et al. |
| 2011/0199825 A1 | 8/2011 | Han et al. |
| 2011/0216603 A1 | 9/2011 | Han et al. |
| 2011/0238913 A1 | 9/2011 | Kurashige et al. |
| 2012/0045890 A1 | 2/2012 | Sel et al. |
| 2012/0060066 A1 | 3/2012 | Nagadomi et al. |
| 2012/0099377 A1 | 4/2012 | Maejima |
| 2012/0275234 A1 | 11/2012 | Lee et al. |
| 2013/0182502 A1 | 7/2013 | Cheo et al. |
| 2014/0022846 A1 | 1/2014 | Kim |

FOREIGN PATENT DOCUMENTS

| | | |
|---|---|---|
| CN | 101165909 A | 4/2008 |
| CN | 101627444 A | 1/2010 |
| JP | 08-279295 | 10/1996 |
| JP | 9007383 A | 1/1997 |
| JP | 10-032269 A | 2/1998 |
| JP | H10-093083 A | 4/1998 |
| JP | 2000-222895 A | 8/2000 |
| JP | 2002-203393 A | 7/2002 |
| JP | 2005-032430 A | 2/2005 |
| JP | 2005-116119 A | 4/2005 |
| JP | 2005-196931 A | 7/2005 |
| JP | 2006-073168 A | 3/2006 |
| JP | 2007-087569 A | 4/2007 |
| JP | 2007-180389 A | 7/2007 |
| JP | 2007-184090 A | 7/2007 |
| JP | 2007-200540 A | 8/2007 |
| JP | 2007-266143 A | 10/2007 |
| JP | 2007-272952 A | 10/2007 |
| JP | 2007-293986 A | 11/2007 |
| JP | 2007-323716 A | 12/2007 |
| JP | 2008-103429 A | 5/2008 |
| JP | 2008-172164 A | 7/2008 |
| JP | 2008-310949 A | 12/2008 |
| JP | 2008-311650 A | 12/2008 |
| JP | 2009-026369 A | 2/2009 |
| JP | 2009-088446 A | 4/2009 |
| JP | 2009-124107 A | 6/2009 |
| JP | 2009-266281 A | 11/2009 |
| JP | 2009-266946 A | 11/2009 |
| JP | 2011-508937 A | 3/2011 |
| KR | 10-0157342 B1 | 7/1998 |

(56) References Cited

FOREIGN PATENT DOCUMENTS

| | | |
|---|---|---|
| KR | 10-0390145 B1 | 7/2003 |
| KR | 10-0541819 B1 | 1/2006 |
| KR | 2006-0129806 A | 12/2006 |
| KR | 10-0672151 B1 | 1/2007 |
| KR | 10-0688494 B1 | 3/2007 |
| KR | 10-0706797 B1 | 4/2007 |
| KR | 10-0729359 B1 | 6/2007 |
| KR | 2007-0078355 A | 7/2007 |
| KR | 2007-0096972 A | 10/2007 |
| KR | 10-0784862 B1 | 12/2007 |
| KR | 2008-0005765 A | 1/2008 |
| KR | 2008-0110168 A | 12/2008 |
| KR | 2009-0002471 A | 1/2009 |
| KR | 10-0884861 A | 2/2009 |
| KR | 10-0890016 B1 | 3/2009 |
| KR | 2009-0034776 A | 4/2009 |
| KR | 10-0897415 B1 | 5/2009 |
| KR | 2009-0048877 A | 5/2009 |
| KR | 2009-0072406 A | 7/2009 |
| KR | 2009-0079037 A | 7/2009 |
| WO | WO-2009/086618 A1 | 7/2009 |

OTHER PUBLICATIONS

Office Action dated Nov. 5, 2013 in corresponding U.S. Appl. No. 14/043,256.
Office Action dated Aug. 30, 2013 in corresponding U.S. Appl. No. 12/985,695.
Office Action dated Nov. 1, 2013 in corresponding U.S. Appl. No. 13/545,588.
US Office Action dated Dec. 24, 2013 for related U.S. Appl. No. 13/867,716.
US Office Action dated Jan. 2, 2014 for related U.S. Appl. No. 12/985,695.
US Office Action dated Jan. 15, 2013 for related U.S. Appl. No. 13/023,934.
US Office Action dated Mar. 12, 2013 for related U.S. Appl. No. 12/985,695.
US Office Action dated Apr. 5, 2010 for related U.S. Appl. No. 13/029,518.
Jaehoon Jang et al, "Vertical Cell Array using TCAT (Terabit Cell Array Transistor) Technology for Ultra High Density NAND Flash Memory", VLSI Symp. Tech. Dig., pp. 192-193, 2009.
Office Action dated Feb. 28, 2014 for related U.S. Appl. No. 13/721,963.
Office Action dated Mar. 21, 2014 in copending U.S. Appl. No. 13/607,038.
Japanese Examination report for corresponding Japanese application No. 2011-012074.
Japanese Office Action for corresponding Japanese application No. 2011-012074.
Notice of Allowance dated Feb. 7, 2014 for related U.S. Appl. No. 13/967,455.
Office Action dated Jun. 12, 2014 for corresponding U.S. Appl. No. 14/043,256.
Notice of Allowance for corresponding U.S. Appl. No. 13/607,038 dated Aug. 1, 2014.
T. Maeda et al. "Multi-stacked 1G cell/layer Pipe-shaped BiCS Flash Memory"; 2009 Symposium on VLSI Circuits, p. 22-23; Jun. 2009.

\* cited by examiner

Fig. 9

| SSL | Float |
|---|---|
| WLs of unselected sub block | Float |
| WLs of selected sub block | Vwe |
| DWL | Vdwl1 |
| GSL | Float |
| Substrate | Vers |

Fig. 13

| SSL | Float |
|---|---|
| WLs of unselected sub block | Vwei |
| WLs of selected sub block | Vwe |
| DWL | Vdwl2 |
| GSL | Float |
| Substrate | Vers |

Fig. 24

| SSL | Float |
|---|---|
| WLs of unselected sub block | Float |
| WLs of selected sub block | Vwe |
| GSL | Float |
| Substrate | Vers |

Fig. 45

| SSL | Float |
|---|---|
| WLs of unselected sub block | Float |
| WLs of selected sub block | Float → Vwe2 |
| DWL | Vdwl3 |
| GSL | Vss → Float |
| Substrate | Vpre → Vers2 |

Fig. 47

| SSL | Float |
|---|---|
| WLs of unselected sub block | Float |
| WLs of selected sub block | Float → Vwe2 |
| GSL | Vss → Float |
| Substrate | Vpre → Vers2 |

NONVOLATILE MEMORY DEVICE, OPERATING METHOD THEREOF, AND MEMORY SYSTEM INCLUDING THE SAME

CROSS-REFERENCE TO RELATED APPLICATIONS

This application is a divisional application of U.S. application Ser. No. 13/028,918, filed Feb. 16, 2011, which claims priority under 35 U.S.C. §119 to Korean Patent Application No. 10-2010-0014271 filed on Feb. 17, 2010 and Korean Patent Application No. 10-2010-0075065 filed on Aug. 3, 2010 in the Korean Intellectual Property Office (KIPO) and U.S. Provisional Ser. No. 61/371,431, filed on Aug. 6, 2010, the entire contents of each of which are herein incorporated by reference.

BACKGROUND

The present disclosure herein relates to a semiconductor memory, and more particularly, to a nonvolatile memory device having a 3-dimensional structure, an operating method thereof, and a memory system including the same.

A semiconductor memory device is a memory device that is implemented with semiconductor materials such as silicon (Si), germanium (Ge), gallium arsenide (GaAs) and indium phosphide (InP). Semiconductor memory devices may be largely divided into a volatile memory device and a nonvolatile memory device.

A volatile memory device is a memory device in which stored data are erased when a power source is shut off. Examples of volatile memory devices include Static Random Access Memory (SRAM), Dynamic Random Access Memory (DRAM) and Synchronous Dynamic Random Access Memory (SDRAM). A non-volatile memory device is a memory device that retains stored data even when a power source is shut off. Examples of nonvolatile memory devices include Read-Only Memory (ROM), Programmable Read Only Memory (PROM), Erasable Programmable Read Only Memory (EPROM), Electrical Erasable Programmable Read Only Memory (EEPROM), flash memory devices, Phase-change Random Access Memory (PRAM), Magnetoresistive Random Access Memory (MRAM), Resistive Random Access Memory (RRAM) and Ferroelectric Random Access Memory (FRAM). Flash memory devices may be largely categorized into a NOR type and a NAND type.

SUMMARY

The present disclosure provides a nonvolatile memory device, for example, having a 3-dimensional array structure, an operating method thereof, and a memory system including the nonvolatile memory device.

Example embodiments of inventive concepts provide methods of operating a nonvolatile of operating a nonvolatile memory device that includes a substrate and memory blocks having a plurality of memory cells stacked along a direction perpendicular to the substrate, the method comprising reading data from a selected sub block among sub blocks of a selected memory block and selectively refreshing each sub block of the selected memory block in response to the reading of the selected sub block, wherein each sub block of the selected memory block is separately erased.

In example embodiments, the selectively refreshing of each sub block of the selected memory block in response to the reading of the selected sub block includes backing up data of a specific sub block among sub blocks of the selected memory block; and erasing the specific sub block.

In example embodiments, the backing up of the data of a specific sub block among sub blocks of the selected memory block includes reading data of the specific sub block and writing the read data into a sub block among sub blocks of the memory blocks.

In example embodiments, the erasing of the specific sub block includes applying a word line erase voltage to word lines corresponding to the specific sub block among word lines of the selected memory block, floating the remaining word lines of the selected memory block; and applying an erase voltage to the substrate.

In example embodiments, the erasing of the specific sub block further includes applying a medium voltage to at least one dummy word line between the specific sub block and at least one sub block adjacent to the specific sub block.

In example embodiments, the medium voltage has a level between the word line erase voltage and the erase voltage.

In example embodiments, the erasing of the specific sub block includes applying a word line erase voltage to word lines corresponding to the specific sub block among word lines of the selected memory block, applying a word line erase-inhibit voltage to the remaining word lines of the selected memory block, and applying an erase voltage to the substrate.

Example embodiments of inventive concepts also provide nonvolatile memory devices comprising a memory cell array including a substrate and memory blocks, the memory blocks including a plurality of memory cells stacked along a direction perpendicular to the substrate, a decoder connected to the memory blocks through word lines, and a read and write circuit connected to the memory blocks through bit lines, wherein each memory block is divided into a plurality of sub blocks along a direction perpendicular to the substrate and each sub block is separately erased.

In example embodiments, memory cells in each sub block are spaced from each other by a first distance, along the direction perpendicular to the substrate and memory cells at an interface of sub blocks adjacent along the direction perpendicular to the substrate are spaced from each other by a longer second distance than the first distance.

In example embodiments, in each sub block, each of the first and last memory cells has a first size along the direction perpendicular to the substrate and each of the remaining memory cells has a second size smaller than the first size.

Example embodiments of inventive concepts also provide memory systems comprising a nonvolatile memory device including a substrate and memory blocks, the memory blocks having a plurality of memory cells stacked along a direction perpendicular to perpendicular to the substrate and a controller controlling the nonvolatile memory device, wherein each memory block is divided into a plurality of sub blocks along the direction perpendicular to the substrate, each sub block is separately erased and based on the number of reading operations performed on a selected memory block among the memory blocks, the controller selectively refreshes each sub block of the selected memory block.

In example embodiments, when the number of reading operations performed on the selected memory block reaches a reference value after data are written into a selected sub block of the selected memory block, the controller selectively refreshes each sub block of the selected memory block.

In example embodiments, wherein when a specific sub block among sub blocks of the selected memory block is refreshed, the controller reads data of the specific sub block and writes the read data into one of sub blocks of the memory blocks.

In example embodiments, wherein in each memory block, at least one dummy memory cell is provided between sub blocks adjacent along the direction perpendicular to the substrate.

In example embodiments, wherein the nonvolatile memory device and the controller constitute a solid state drive (SSD).

Example embodiments of inventive concepts also provide nonvolatile memory devices comprising a memory cell array including a substrate and a plurality of memory blocks, each of the plurality of memory blocks including a plurality of memory cells stacked in a direction perpendicular to the substrate, each of the plurality of memory cells further including at least one separator, separating the memory cells into a plurality of sub blocks being separately erasable.

In example embodiments, the at least one separator is a dummy memory cell between any two of the plurality of sub blocks.

In example embodiments, each of the plurality of memory blocks includes at least one ground select transistor, at least one string select transistor.

In example embodiments, the nonvolatile memory devices further comprise first insulating material between the plurality of memory cells, wherein the at least one separator between any two of the plurality of memory cells is second insulating material, thicker than the first insulating material.

In example embodiments, electrodes of some of the plurality of memory cells have a first thickness and electrodes of each of the plurality of memory cells adjacent to the at least one separator have a second thickness, thicker than the first thickness.

In example embodiments, each of the plurality of memory blocks includes at least one ground select transistor and at least one string select transistor, and electrodes of each of the plurality of memory cells adjacent to at least one string select transistor and the at least one ground select transistor have the second thickness, thicker than the first thickness.

In example embodiments, each of the plurality of memory blocks includes at least two ground select transistors and the at least one separator is at least two dummy memory cells between any two of the plurality of memory cells.

In example embodiments, each of the plurality of memory blocks includes at least two string select transistors and at least two ground select transistors.

In example embodiments, gate electrodes of the at least two string select transistors are not connected.

In example embodiments, the gate electrodes of the at least two string select transistors are connected commonly.

In example embodiments, each of the plurality of memory blocks includes at least one ground select transistor and at least one string select transistor and the at least one separator further includes at least one dummy memory cell between the at least one ground select transistor and an adjacent memory cell.

In example embodiments, each of the plurality of memory blocks includes at least one ground select transistor and at least one string select transistor and the at least one separator further includes at least one dummy memory cell between the at least one string select transistor and an adjacent memory cell.

In example embodiments, each of the plurality of memory blocks includes at least one ground select transistor and at least one string select transistor and the at least one separator further includes at least one dummy memory cell between the at least one ground select transistor and an adjacent memory cell and at least one dummy memory cell between the at least one string select transistor and an adjacent memory cell.

In example embodiments, the nonvolatile memory devices further comprise a decoder connected to the plurality of memory cells through a plurality of word lines and a read and write circuit connected to the plurality of memory cells through a plurality of bit lines and at least one string select transistor.

In example embodiments, the plurality of memory cells each include a plurality of transistors, each acting as an individual memory cell, wherein a common active pillar acts as a channel for the plurality of transistors.

In example embodiments, each of the plurality of memory blocks includes at least one ground select transistor and at least one string select transistor and a first active pillar and a second active pillar act as a channel for the at least one ground select transistor and the at least one string select transistor, respectively.

In example embodiments, the first active pillar, the second active pillar and the common active pillar are a single common active pillar.

In example embodiments, the first active pillar, the second active pillar and the common active pillar are at least two common active pillars, wherein a boundary between the at least two common active pillars corresponds with the at least one separator.

In example embodiments, the single common active pillar is a cylindrical in shape.

In example embodiments, the single common active pillar is a linear in shape.

In example embodiments, the substrate includes at least one doped region connected to a gate insulating film of the at least ground select transistor and acting as common source lines, the at least one doped region having a polarity opposite to a polarity of the substrate and the single common active pillar.

In example embodiments, the at least one doped region is a plurality of doped regions having a line shape and are substantially parallel with rows of the plurality of memory cells between the plurality of memory cells, the first active pillars contacting the substrate between the doped regions.

In example embodiments, the at least one doped region is a single doped region having a plate shape, the first active pillars contacting the single doped region.

Example embodiments of inventive concepts also provide memory systems, comprising nonvolatile memory device as described and a controller configured to control read, erase, and refresh operations of the memory cell array.

In example embodiments, the controller further includes a flash translation table configured to control an erase operation of the memory cell array.

In example embodiments, the flash translation table is part of the controller.

In example embodiments, the flash translation table further including a mapping table configured to covert a logical block address received from a host into a physical block address of the memory cell array, a read cycle table configured to count a number of read cycles after an erase operation for each of the plurality of sub blocks, and a refresh unit configured to selectively refresh the one of the plurality of sub blocks, a subset of the plurality of sub blocks including the one of the plurality of sub blocks or all of the plurality of sub blocks, when the number of read cycles of one of the plurality of sub blocks reaches a threshold.

Example embodiments of inventive concepts also provide methods of erasing at least one selected sub block of a nonvolatile memory device including a memory cell array including a substrate and a plurality of memory blocks, each of the plurality of memory blocks including a plurality of memory cells stacked in a direction perpendicular to the substrate, each of the plurality of memory cells connected to at least one word line, each of the plurality of memory blocks further including at least one string select transistor connected to at least one string select line, at least one ground select transistor connected to at least one ground select line, and at least one separator, connected to at least one dummy word line, separating the memory cells into a plurality of sub blocks, the method comprising allowing each of the at least one string select lines to float, applying a first voltage to the at least one word line of the at least one selected sub block, apply a second voltage to the at least one dummy word line, allowing each of the at least one ground select lines to float, applying an erase voltage to the substrate to erase the at least one selected sub block.

In example embodiments, allowing each of the at least one word lines for unselected sub blocks of the plurality of sub blocks to float.

In example embodiments, the method further includes applying a word line erase-inhibit voltage to each of the at least one word lines for unselected sub blocks of the plurality of sub blocks.

In example embodiments, the plurality of memory cells each include a plurality of transistors, each acting as an individual memory cell, wherein a common active pillar acts as a channel for the plurality of transistors, and a first active pillar and a second active pillar act as a channel for the at least one ground select transistor and the at least one string select transistor, respectively and wherein the substrate, the first pillar, the second pillar, and the common active pillar have the same polarity.

In example embodiments, the erase voltage is transferred from the substrate to the first pillar and from the first pillar to the at least one ground select line to raise a voltage of the at least one ground select line to a ground select voltage, wherein a difference between the ground select voltage and the erase voltage is insufficient to turn on the at least one ground select transistor.

In example embodiments, the erase voltage is transferred from the substrate to the common active pillar and from the common active pillar to the at least one word lines connected to the plurality of transistors of the at least one selected sub block to raise a voltage of the at least one word lines of the plurality of transistors of the at least one selected sub block to a word line erase voltage, wherein a difference between the word line erase voltage and the erase voltage is sufficient to turn on the plurality of transistors of the at least one selected sub block.

In example embodiments, the erase voltage is transferred from the substrate to the common active pillar and from the common active pillar to the at least one dummy word line to raise a voltage of the at least one dummy word line to a dummy word line voltage, wherein a difference between the dummy word line voltage and the erase voltage insufficient to turn on the at least one dummy transistor.

In example embodiments, the erase voltage is transferred from the substrate to the second pillar and from the second pillar to the at least one string select line to raise a voltage of the at least one string select line to a string select line voltage, wherein a difference between the string select line voltage and the erase voltage is insufficient to turn on the at least one string select transistor.

In example embodiments, the erase voltage is transferred from the substrate to the common active pillar and from the common active pillar to the at least one word lines connected to the plurality of transistors of the of the unselected sub blocks to raise a voltage of the at least one word lines of the plurality of transistors of the unselected sub blocks to an unselected word line voltage, wherein a difference between the unselected word line voltage and the erase voltage is insufficient to turn on the plurality of transistors of the unselected sub blocks.

In example embodiments, the erase voltage is transferred from the substrate to the common active pillar and from the common active pillar to the at least one word lines connected to the plurality of transistors of the of the unselected sub blocks to raise a voltage of the at least one word lines of the plurality of transistors of the unselected sub blocks to an unselected word line voltage, wherein a difference between the unselected word line voltage and the erase voltage is insufficient to turn on the plurality of transistors of the unselected sub blocks.

In example embodiments, the erase voltage is greater than the first voltage.

In example embodiments, the first voltage is a ground voltage.

In example embodiments, the dummy word line voltage is between the erase voltage and the first voltage.

In example embodiments, the dummy word line voltage is between the erase voltage and an unselected word line voltage.

Example embodiments of inventive concepts also provide methods of refreshing a nonvolatile memory device, including a substrate and a memory cell array, the memory cell array including a plurality of memory blocks, each of the plurality of memory blocks including a two-dimensional array of a plurality of memory cells arranged in rows and columns, sharing a common active pillar acting as a channel for the plurality of memory cells, each of the plurality of memory cells further including at least one separator, separating the memory cells into a plurality of sub blocks being separately erasable, the method comprising counting a number of read cycles after an erase operation for each of the plurality of sub blocks and when the number of read cycles of one of the plurality of sub blocks reaches a threshold, selectively refreshing the one of the plurality of sub blocks, a subset of the plurality of sub blocks including the one of the plurality of sub blocks, or all of the plurality of sub blocks.

BRIEF DESCRIPTION OF THE DRAWINGS

The accompanying drawings are included to provide a further understanding of inventive concepts, and are incorporated in and constitute a part of this specification. The drawings illustrate example embodiments of inventive concepts and, together with the description, serve to explain principles of inventive concepts. In the drawings:

FIG. 9 is a table illustrating example embodiments of conditions of voltages which are applied to the memory block BLKi_1 of FIG. 8 during an erase operation;

FIG. 13 is a table illustrating example embodiments of conditions of voltages which are applied to the memory block BLKi_1 of FIG. 8 during an erase operation;

FIG. 24 is an example table illustrating voltage conditions applied to the memory block BLKj_1 of FIG. 23 during an erase operation;

FIG. 45 is a table illustrating example embodiments of voltage conditions during an erase operation of the memory block BLKp of FIG. 44;

FIG. 47 is an example table illustrating voltage conditions when dummy memory cells DMC are not provided between sub blocks of the memory block BLKp of FIGS. 43 and 44;

DETAILED DESCRIPTION OF EXAMPLE EMBODIMENTS

Figure 1:
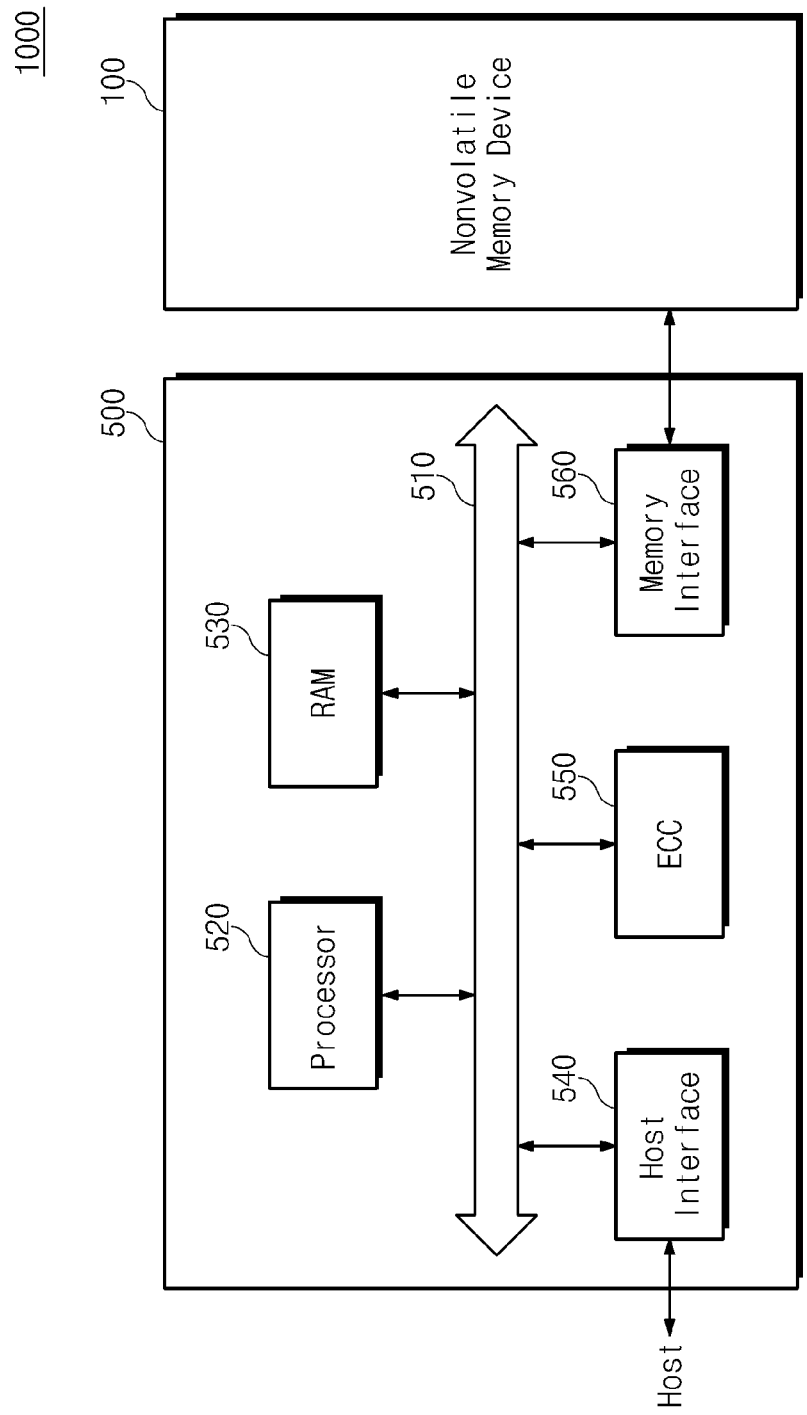
FIG. 1 is a block diagram of a memory system 1000 according to example embodiments of inventive concepts.

Hereinafter, example embodiments of inventive concepts will be described in detail with reference to the accompanying drawings in such a manner that the technical idea of the present invention may easily be carried out by a person with ordinary skill in the art to which the invention pertains. The same elements shall be represented using the same reference numerals. Similar elements shall be represented using similar reference numerals.

FIG. 1 is a block diagram of a memory system 1000 according to example embodiments of inventive concepts. Referring to FIG. 1, the memory system 1000 includes a nonvolatile memory device 100 and/or a controller 500.

The nonvolatile memory device 100 has a configuration allowing data to be stored therein. The nonvolatile memory device will be described in more detail with reference to FIG. 2.

The controller 500 is connected to a host and a nonvolatile memory device 100. In response to a request from the host, the controller 500 is configured to access the nonvolatile memory device 100. For example, the controller 500 is configured to control read, write, erase and perform background operations of the nonvolatile memory device 100. The controller 500 is configured to provide an interface between the nonvolatile memory device 100 and the host. The controller 500 is configured to drive a firmware controlling the nonvolatile memory device 100.

The controller 500 includes an internal bus 510, a processor 520, a random access memory (RAM) 530, a host interface 540, an error correction block 550, and/or a memory interface 560.

The internal bus 510 provides a channel between elements of the controller 500.

The processor 520 is configured to control the overall operation of the controller 500. The processor 520 is configured to drive firmware, code, etc. which are driven in the controller 500. For example, the processor 520 is configured to drive firmware, code, etc., that control the nonvolatile memory device 100.

The RAM 530 is used as at least one of an operating memory, a cache memory between the nonvolatile memory device 100 and the host, and a buffer memory between the nonvolatile memory device 100 and the host.

The host interface 540 includes a protocol performing data exchange between the host and the controller 500. For example, the host interface 540 is configured to communicate with an external device (host) through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol.

The error correction block 550 includes an error correcting code (ECC). The error correction block 550 detects an error in data read from the nonvolatile memory device 100 by use of the ECC, and corrects the error.

The memory interface 560 interfaces with the nonvolatile memory device 100. For example, the memory interface includes a NAND interface and/or NOR interface.

The controller 500 and the nonvolatile memory device 100 may be integrated into a single semiconductor device. For example, the controller 500 and the nonvolatile memory device 100 are integrated into a single semiconductor device, and form a memory card. For instance, the controller 500 and the nonvolatile memory device 100 are integrated into a single semiconductor device to thereby form a memory card such as a PC card (PCMCIA, personal computer memory card international association), a compact flash card (CF), a smart media card (SM, SMC), a memory stick, a multimedia card (MMC, RS-MMC, MMCmicro), an SD card (SD, miniSD, microSD, SDHC), and a universal flash storage (UFS).

The controller 500 and the nonvolatile memory device 100 are integrated into a single semiconductor device to thereby form a semiconductor drive such as solid state drive (SSD). The SSD includes a storage unit configured to store data in a semiconductor memory. In the case where the memory system 1000 is used as the SSD, the operating speed of the host connected to the memory system 1000 may be improved.

As another example, the memory system 1000 may be provided as one of various components of an electronic device such as a computer, a ultra mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

The nonvolatile memory device 100 or the memory system 1000 may be implemented using various kinds of packages. For instance, the nonvolatile memory device 100 or the memory system 1000 may be implemented with packages such as Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 2:
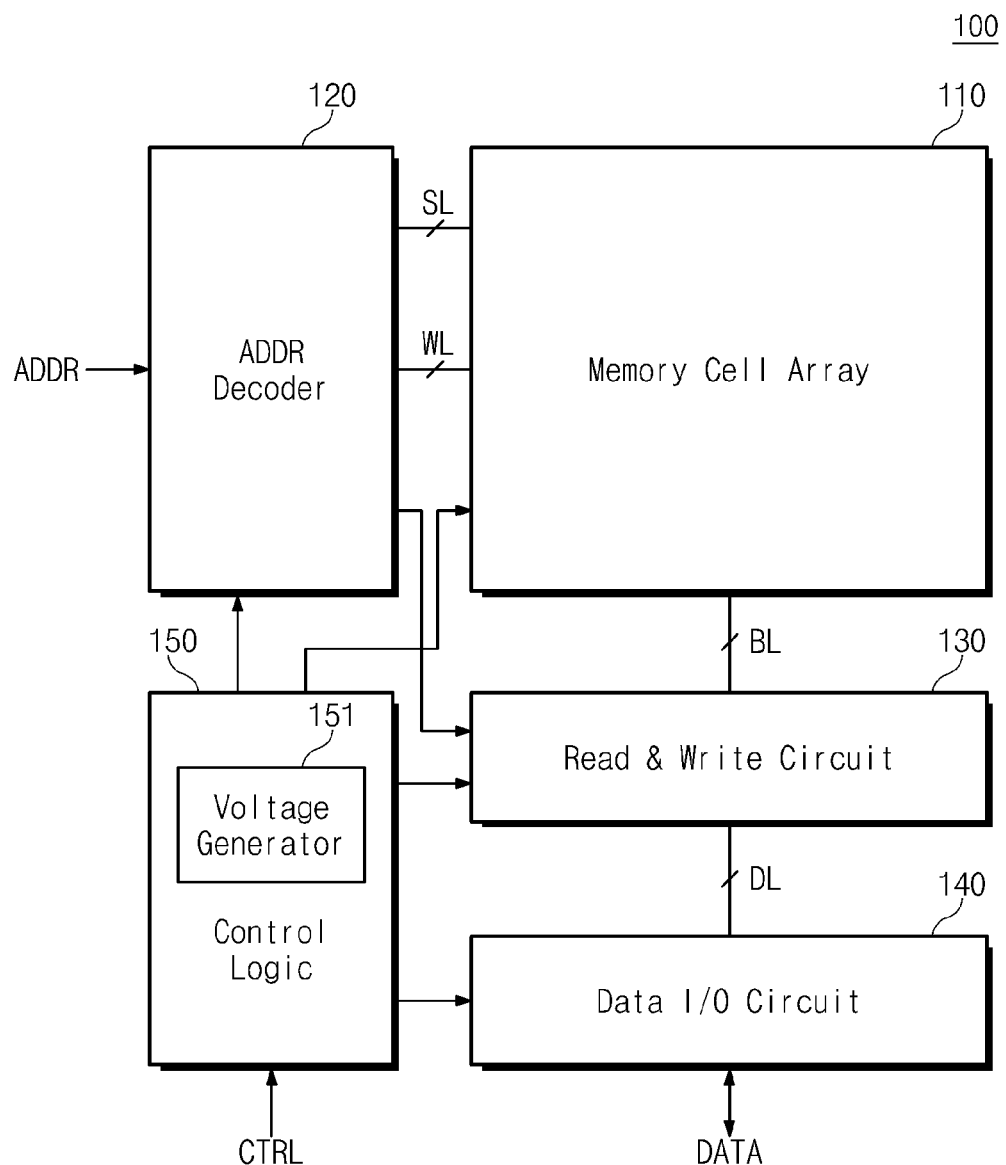
FIG. 2 is an example block diagram of the nonvolatile memory device 100 of FIG. 1.

FIG. 2 is a block diagram of the nonvolatile memory device 100 of FIG. 1. Referring to FIG. 1, the nonvolatile memory device 100 includes a memory cell array 110, an address decoder 120, a read & write circuit 130, a data input/output (I/O) circuit 140, and/or a control logic 150.

The memory cell array 110 is connected to the address decoder 120 through word lines WL and select lines SL, and connected to the read & write circuit 130 through bit lines BL. The memory cell array 110 includes a plurality of memory cells. For example, the memory cell array 100 includes a plurality of memory cells which are stacked in a direction vertical to a substrate. For instance, the memory cell array 110 includes a plurality of memory cells each of which can store one or more bit(s) therein.

The address decoder 120 is connected to the memory cell array 110 through the word lines WL and the select lines SL. The address decoder 120 is configured to operate in response to the control of the control logic 150. The address decoder 120 receives addresses ADDR from an external device.

The address decoder 120 is configured to decode a row address of the received addresses ADDR. The address decoder 120 selects a word line corresponding to the decoded row address among the word lines WL. The address decoder 120 selects a select line corresponding to the decoded row address among the select lines SL.

When the address decoder 120 is additionally connected to the memory cell array 110 through dummy word lines DWL (not shown), the address decoder 120 may further select a dummy word line corresponding to the decoded row address among the dummy word lines DWL (not shown).

The address decoder 120 is configured to decode a column address of the received addresses ADDR. The address decoder 120 transfers the decoded column address to the read & write circuit 130.

For example, the address decoder 120 may include a row decoder decoding a row address, a column address decoding a column address, and an address buffer storing the received address ADDR.

The read & write circuit 130 is connected to the memory cell array 110 through bit lines BL, and connected to the data I/O circuit 140 through data lines DL. The read & write circuit 130 operates in response to the control of the control logic 150. The read & write circuit 130 receives the decoded column address from the address decoder 120. The read & write circuit 130 selects bit lines BL using the decided column address.

The read & write circuit 130 receives data from the data I/O circuit 140, and writes the received data to the memory cell array. The read & write circuit 130 reads data from the memory cell array, and transfers the read data to the data I/O circuit 140. The read & write circuit 130 reads data from a first storage region of the memory cell array 110, and writes the read data to a second storage region of the memory cell array 110. For instance, the read & write circuit performs a copy-back operation.

The read & write circuit 130 may include elements such as a page buffer (or page register) and/or a column select circuit. In another example, the read & write circuit 130 may include elements such as a sense amplifier, a write driver, and/or a column select circuit.

The data I/O circuit 140 is connected to the read & write circuit through the data lines DL. The data I/O circuit 140 operates in response to the control of the control logic 140. The data I/O circuit 140 is configured to exchange data DATA with an external device. The data I/O circuit 140 is configured to transfer the data DATA transferred from the external device to the read & write circuit 130 through the data lines DL. The data I/O circuit 140 is configured to output the data DATA transferred through the data lines DL from the read & write circuit 130 to the external device. Exemplarily, the data I/O circuit 140 may include an element such as a data buffer.

The control logic 150 is connected to the address decoder 120, the read & write circuit 130, and the data I/O circuit 140. The control logic 150 is configured to control the overall operation of the nonvolatile memory device 100. The control logic 150 operates in response to a control signal CTRL transferred from the external device.

The control logic 150 includes a voltage generator 151. For example, the voltage generator 151 is configured to generate a plurality of voltages including a high voltage. For example, one of the voltages generated by the voltage generator 151 is applied to the word lines WL through the address decoder 120. When dummy word lines DWL (not shown) are additionally provided in the memory cell array 110, one of the voltage generated by the voltage generator 151 may be further transferred to the dummy word lines DWL (not shown).

One of the voltages generated by the voltage generator 151 may be transferred to the memory cell array 110. For example, one of the voltage generated by the voltage generator 151 may be transferred to the substrate of the memory cell array 110.

Figure 3:
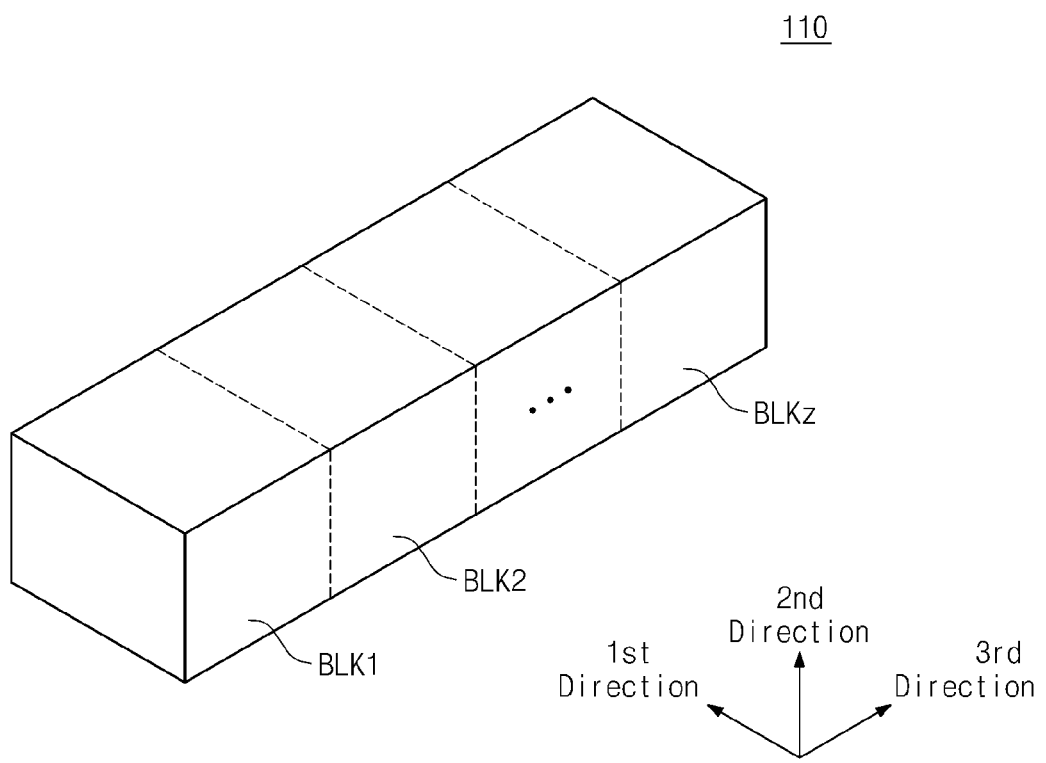
FIG. 3 is an example block diagram of the memory cell array 110 of FIG. 2.

FIG. 3 is a block diagram of the memory cell array 110 of FIG. 2. Referring to FIG. 3, the memory cell array 110 includes a plurality of memory blocks BLK1 to BLKz. Each of the memory blocks BLK has a three dimensional structure (or vertical structure). For example, each memory block BLK includes structures extending in first to third directions. For instance, each memory block BLK includes a plurality of NAND strings NS extending in the second direction. For example, a plurality of NAND strings NS may be provided in the first and third directions, for example, in a two-dimensional array of NAND strings NS.

Each NAND string NS is connected to a bit line BL, a string select line SSL, a ground select line GSL, the word lines WL, and a common source line CSL. Each of the memory blocks is connected to the plurality of bit lines BL, the plurality of string select lines SSL, the plurality of ground select lines GSL, the plurality of word lines WL, and the common source line CSL. The memory blocks BLK1 to BLKz will be more fully described with reference to FIG. 4.

The memory blocks BLK1 to BLKz are selected by the address decoder 120 illustrated in FIG. 2. For instance, the address decoder 120 is configured to select at least one memory block BLK corresponding to the decoded row address among the memory blocks BLK1 to BLKz.

Figure 4:
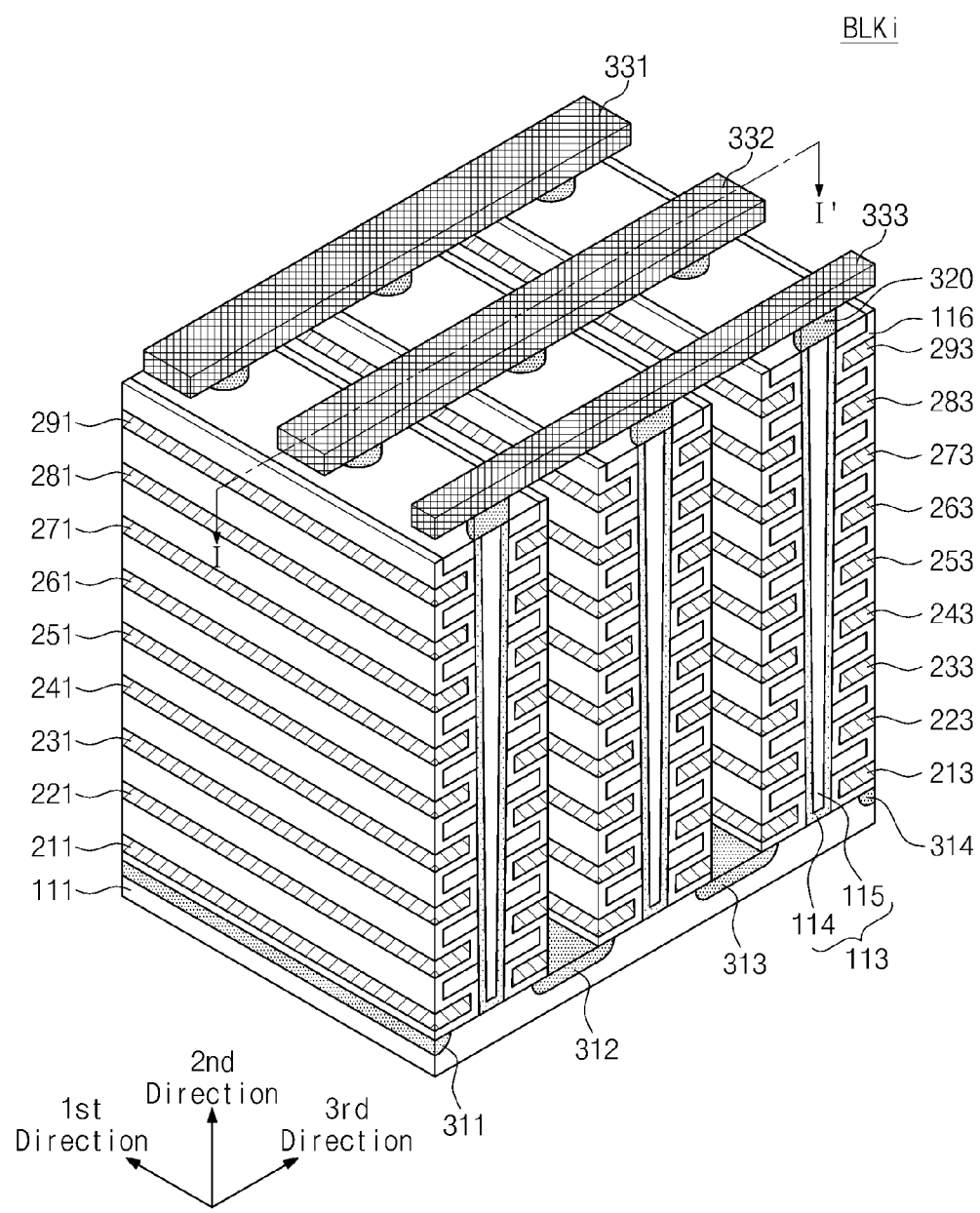
FIG. 4 is a perspective view illustrating example embodiments of one memory block BLKi of the memory blocks BLK1 to BLKz in FIG. 3.
Figure 5:
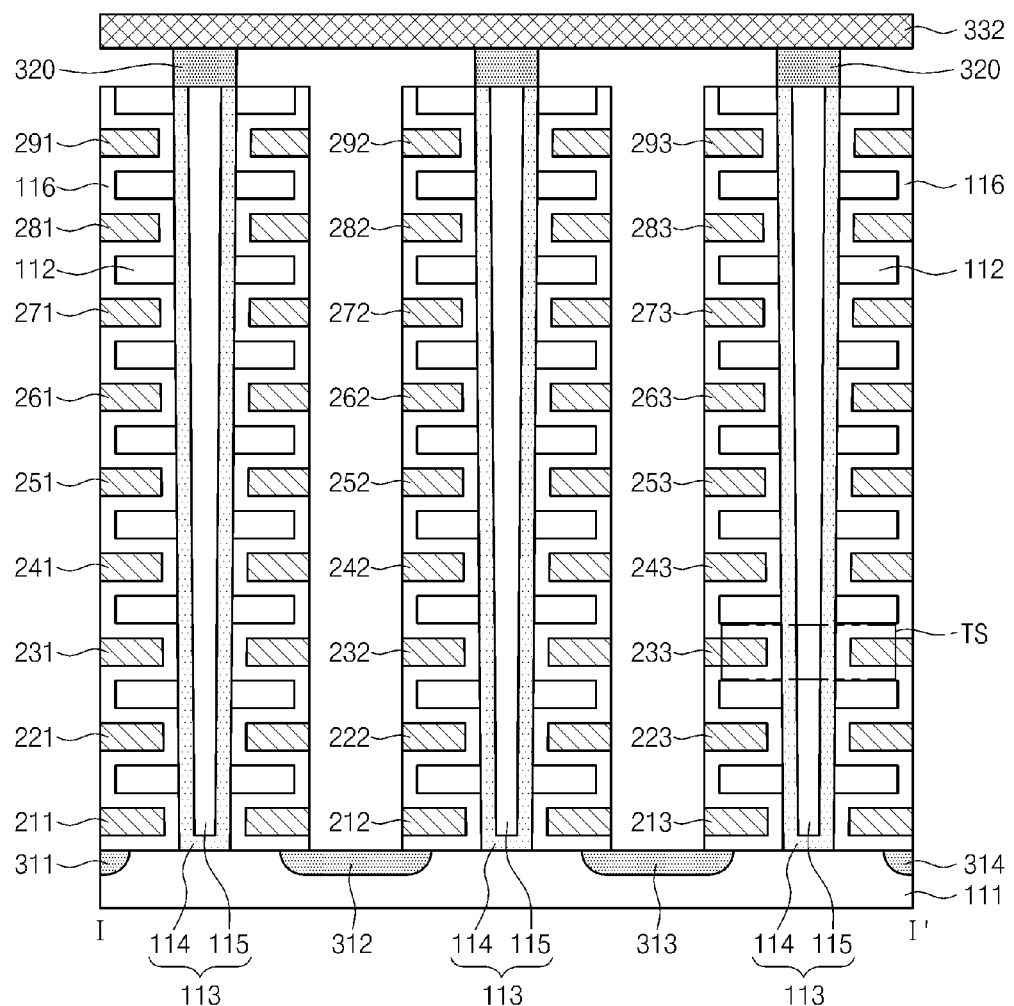
FIG. 5 is a cross-sectional view taken along line I-I' of the memory block BLKi of FIG. 4.

FIG. 4 is a perspective view illustrating example embodiments of one memory block BLKi of the memory blocks BLK1 to BLKz in FIG. 3. FIG. 5 is a cross-sectional view taken along line I-I' of the memory block BLKi of FIG. 4. Referring to FIGS. 4 and 5, the memory block BLKi includes structures extending in the first to third directions.

First, a substrate 111 is provided. The substrate 111 may be a well having a first type (e.g., first conductive type). For example, the substrate 111 may be a p-type well formed by implanting Group III elements such as boron (B). For example, the substrate 111 is a p-type pocket well provided in an n-type well. Hereinafter, it is assumed that the substrate 111 be a p-type well (or p-type pocket well). However, the conductive type of the substrate 111 is not limited to the p-type well.

A plurality of doping regions 311 to 314 extending in a first direction are provided on the substrate 111. For example, the plurality of doping regions 311 to 314 may have a second type (e.g., second conductive type) differing from that of the substrate 111. Hereinafter, it is assumed that the first to fourth doping regions 311 to 314 have an n-type. However, the conductive types of the first to fourth doping regions 311 to 314 are not limited to the n-type.

A plurality of insulation materials 112 extending in the first direction are sequentially provided in a second direction over a region of the substrate 111 between the first and second doping regions 311 and 312. For example, the plurality of insulation materials 112 may be provided in the second direction such that they are spaced by a predetermined or desired distance. The insulation material 112 may include an insulator such as silicon oxide.

A plurality of pillars 113 are provided, which are disposed in the first direction on the region of the substrate 111 between the first and second doping regions 311 and 312 and penetrate the insulation materials 112 in the second direction. Exemplarily, the plurality of pillars 113 penetrate the insulation materials 112 to contact the substrate 111.

Each of the pillars 113 may be composed of a plurality of materials. For instance, a surface layer 114 of each pillar 113 may include a silicon material having a first type. For example, the surface layer 114 of each pillar 113 may include a silicon material having the same type as the substrate 111. Hereinafter, it is assumed that the surface layer 114 of each pillar 113 includes p-type silicon. However, the surface layer 114 of each pillar 113 is not limited to including p-type silicon.

An inner layer 115 of each pillar 113 is composed of an insulation material. For example, the inner layer 115 of each pillar 113 may include an insulation material such as silicon oxide. For example, the inner layer 115 of each pillar 113 may include an air gap. Also a void may be formed in the inner layer 115.

In a region between the first and second doping regions 311 and 312, an insulation layer 116 is provided along exposed surfaces of the insulation materials 112, the pillars 113, and the substrate 111. Exemplarily, the insulation layer 116 provided on the exposed side of the last insulation material 112 disposed in the second direction may be removed along the second direction.

For example, the thickness of the insulation material 116 may be less than a half of the distance between the insulation materials 112. That is, a region, in which any material other than the insulation materials 112 and the insulation layer 116 may be disposed, may be provided between the insulation layer 116 provided on an undersurface of the first insulation material and the insulation layer 116 provided on a top surface of the second insulation material under the first insulation material of the insulation material 112.

In the region between the first and second doping regions 311 and 312, first conductive materials 211 to 291 are provided on an exposed surface of the insulation layer 116. For example, the first conductive material 211 extending in the first direction is provided between the substrate 111 and the insulation layer adjacent thereto. More specifically, the first conductive material 211 extending in the first direction is provided between the substrate 111 and the insulation layer 116 disposed under the insulation material 112 adjacent to the substrate 111. Between the insulation layer 116 on a top surface of a specific insulation material and the insulation layer disposed on an undersurface of an insulation layer provided on top of the specific insulation material among the insulation materials 112, the first conductive material extending in the first direction is provided. Exemplarily, a plurality of first conductive materials 221 to 281 extending in the first direction are provided between the insulation materials 112. Exemplarily, the first conductive materials 211 to 291 may be a metallic material. Exemplarily, the first conductive materials 211 to 291 may be a conductive material such as polysilicon.

A structure identical to a structure disposed on the first and second doping regions 311 and 312 is provided in a region between the second and third doping regions 312 and 313. Exemplarily, the plurality of insulation materials 112 extending in the first direction, the plurality of pillars 113 which are sequentially arranged in the first direction and penetrate the plurality of insulation materials 113 in the third direction, the insulation layer 116 provided on the plurality of insulation materials 112 and the exposed surface of the plurality of pillars 112, and the plurality of first conductive materials 212 to 292 extending in the first direction are provided in the region between the second and third doping regions 312 and 313.

A structure identical to a structure disposed on the first and second doping regions 311 and 312 is provided in a region between the third and fourth doping regions 313 and 314. Exemplarily, the plurality of insulation materials 112 extending in the first direction, the plurality of pillars 113 which are sequentially arranged in the first direction and penetrate the plurality of insulation materials 113 in the third direction, the insulation layer 116 provided on the plurality of insulation materials 112 and the exposed surface of the plurality of pillars 112, and the plurality of first conductive materials 213 to 293 extending in the first direction are provided in the region between the third and fourth doping regions 313 and 314.

Drains 320 are respectively provided on the plurality of pillars 113. Exemplarily, the drains 320 may include a silicon material doped with a second type material. For example, the drains 320 may include a silicon material doped with an n-type material. Hereinafter, it is assumed that the drains 320 include a silicon material doped with an n-type material. However, the drains 320 are not limited to including n-type silicon materials.

Exemplarily, the width of each drain 320 may be greater than the width of the pillar 113 corresponding thereto. For example, each drain 320 may be provided in the shape of a pad on the top surface of the corresponding pillar 113. Exemplarily, each of the drains 320 may extend up to a portion of the surface layer 114 of the corresponding pillar 113.

Second conductive materials 331 to 333 extending in the third direction are provided on the drains 320. The second conductive materials 331 to 333 are arranged in the first direction such that they are spaced apart from each other by a predetermine or desired distance. The second conductive materials 331 to 333 are respectively connected to the drains 320 in the corresponding region. Exemplarily, the drains 320 and the second conductive material 333 extending in the third direction may be connected to each other through respective contact plugs. Exemplarily, the second conductive materials 331 to 333 may be a metallic material. Exemplarily, the second conductive materials 331 to 333 may be a conductive material such as polysilicon.

Hereinafter, heights of the first conductive materials 211 to 291, 212 to 292, and 213 to 293 will be defined. The first conductive materials 211 to 291, 212 to 292, and 213 to 293 are defined to have first to ninth heights from the substrate 111 sequentially. That is, the first conductive materials 211 to 213 adjacent to the substrate 111 have the first height. The first conductive materials 291 to 293 adjacent to the second conductive materials 331 to 333 have the ninth height. As an order of the specific conductive materials of the first conductive materials 211 to 291, 212 to 292, and 213 to 293 increases from the substrate 111, the height of the first conductive material increases.

In FIGS. 4 and 5, each of the pillars 113 forms a string together with the insulation layer 116 and the plurality of first conductive materials 211 to 291, 212 to 292, and 213 to 293. For example, each pillar 113, acting as a common active pillar, forms a NAND string NS together with a region adjacent to the insulation layer 116 and an adjacent region of the first conductive materials 211 to 291, 212 to 292, and 213 to 293. The NAND string NS includes a plurality of transistor structures TS. The transistor structure TS will be more fully described with reference to FIG. 6. In example embodiments, a subset of the plurality of transistor structures TS in any given string may be referred to as a substring.

Figure 6:
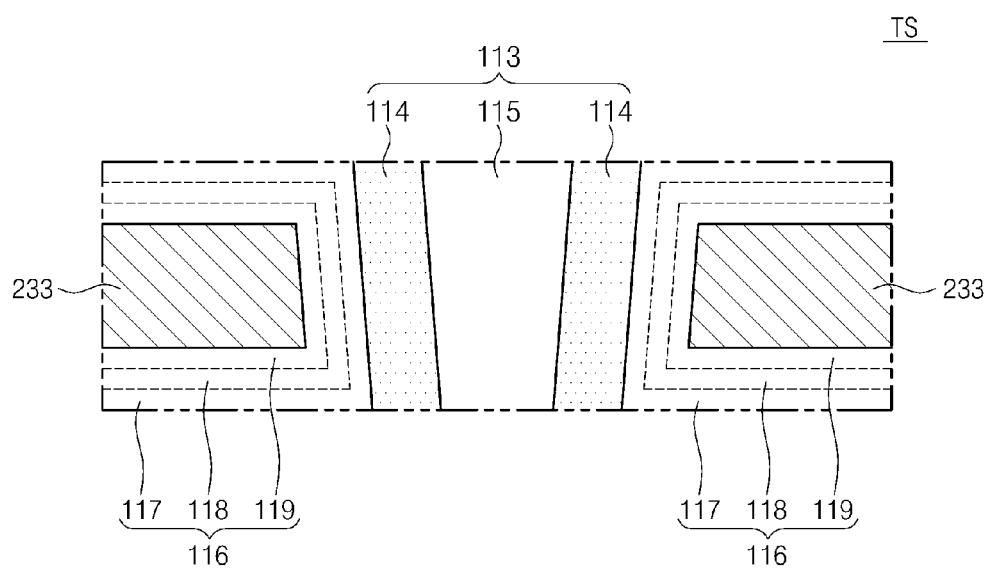
FIG. 6 is a cross-sectional view illustrating the transistor structure TS of FIG. 5.

FIG. 6 is a cross-sectional view illustrating the transistor structure TS of FIG. 5. Referring to FIGS. 4 to 6, the insulation layer 116 includes first to third sub insulation layers 117, 118 and 119. The surface layer 114 of the pillar 113 containing p-type silicon may act as a body. The first sub insulation layer 117 adjacent to the pillar 113 may act as a tunneling insulation layer. For example, the first sub insulation layer 117 adjacent to the pillar 113 may include a thermal oxide layer.

The second sub insulation layer 118 may act as a charge storage layer. For example, the second sub insulation layer 118 may act as a charge trap layer. For example, the second sub insulation layer 118 may include a nitride layer or a metal oxide layer (e.g., aluminum oxide layer, hafnium oxide layer, etc.).

The third sub insulation layer 119 adjacent to the first conductive material 233 may act as a blocking insulation layer. Exemplarily, the third sub insulation layer 119 adjacent to the first conductive material 133 extending in the first direction may have a mono-layered or multi-layered structure. The third sub insulation layer 119 may be a high dielectric layer (e.g., aluminum oxide layer, hafnium oxide layer, etc.) having a higher dielectric constant than the first and second sub insulation layers 117 and 118.

The first conductive material 233 may act as a gate (or control gate). That is, the first conductive material 233 acting as the gate (or control gate), the third sub insulation layer 119 acting as the blocking insulation layer, the second sub insulation layer 118 acting as the charge trap layer, the first sub insulation layer 117 acting as the tunneling insulation layer, and the surface layer 114 that contains p-type silicon and acts as the body, may form a transistor (or memory cell transistor structure). Exemplarily, the first to third sub insulation layers 117 to 119 may form an ONO structure (oxide-nitride-oxide). Hereinafter, the surface layer 114 of the pillar 113 containing p-type silicon is defined to act as the body in the second direction. In example embodiments, the angles between layers of the pillar 113, the insulation layer 116, and the first conductive material 233 may be right angles, acute angles or obtuse angles.

In the memory block BLKi, one pillar 113 corresponds to one NAND string NS. The memory block BLKi includes the plurality of pillars 113. That is, the memory block BLKi includes the plurality of NAND strings NS. More specifically, the memory block BLKi includes a plurality of NAND strings NS extending in the second direction (or direction perpendicular to the substrate).

Each of the NAND strings NS includes the plurality of transistor structures TS which are stacked in the second direction. At least one of the plurality of transistor structures TS of each NAND string NS acts as a string select transistor SST. At least one of the plurality of transistor structures TS of each NAND string acts as a ground select transistor GST. In example embodiments, a substring of the plurality of transistor structures TS may omit the string select transistor SST and/or the ground select transistor GST.

The gates (or control gates) correspond to the first conductive materials 211 to 291, 212 to 292, and 213 to 293 extending in the first direction. That is, the gates (or control gates) form word lines WL extending in the first direction, and at least two select lines SL (for example, at least one string select line SSL and at least one ground select line GSL).

The second conductive materials 331 to 333 extending in the third direction are connected to one ends of the NAND strings NS. For example, the second conductive materials 331 to 333 extending in the third direction act as bit lines BL. That is, in one memory block BLKi, one bit line BL is connected to the plurality of NAND strings.

The second type doping regions 311 to 314 extending in the first direction are provided at the other ends of the NAND strings NS. The second type doping regions 311 to 314 extending in the first direction act as a common source line CSL.

In summary, the memory block BLKi includes the plurality of NAND strings NS extending in a direction (second direction) perpendicular to the substrate 111, and operate as a NAND flash memory block (e.g., charge trap type) in which the plurality of NAND strings NS are connected to one bit line BL.

In FIGS. 4 to 6, it has been described that the first conductive materials 211 to 291, 212 to 292, and 213 to 293 are provided on nine layers. However, the first conductive materials 211 to 291, 212 to 292, and 213 to 293 are not limited to being provided on the nine layers. For example, the first conductive materials may be provided upon at least eight layers forming memory cells, and at least two layers forming select transistors. Also, the first conductive materials may be provided upon a plurality of layers forming memory cells, and at least two layers forming select transistors. For example, the first conductive materials may also be provided on a layer forming dummy memory cells.

In FIGS. 4 to 6, it has been described that three NAND strings NS are connected to one bit line BL. However, it is not limited that three NAND strings NS are connected to one bit line BL. Exemplarily, m number of NAND strings NS may be connected to one bit line BL in the memory block BLKi. Here, the number of the first conductive materials 211 to 291, 212 to 292, and 213 to 293 extending in the first direction, and the number of doping regions 311 to 314 acting as the common source line CSL may also be adjusted so as to correspond to the number of NAND strings NS connected to one bit line BL.

In FIGS. 4 to 6, it has been described that three NAND strings NS are connected to one of the first conductive materials extending in the first direction. However, it is not limited that three NAND strings NS are connected to one of the first conductive materials. For example, n number of NAND strings NS may be connected to one of the first conductive materials. Here, the number of the second conductive materials 331 to 333 extending in the third direction may also be adjusted to correspond to the number of NAND strings NS connected to one of the first conductive materials.

As illustrated in FIGS. 4 to 6, a sectional area of the pillar 113 in the first and third directions may be smaller as the pillar 113 gets closer to the substrate 111. For example, the sectional area of the pillar 113 in the first and third directions may be varied due to process characteristics or errors.

Exemplarily, the pillar 113 is formed by filling a material such as silicon and insulating materials into a hole formed by etching. As the etched depth is greater, an area of the hole in the first and third directions which is formed by etching may be smaller. That is, the sectional area of the pillar 113 in the first and third directions may be smaller as the pillar 113 gets closer to the substrate 111.

Figure 7:
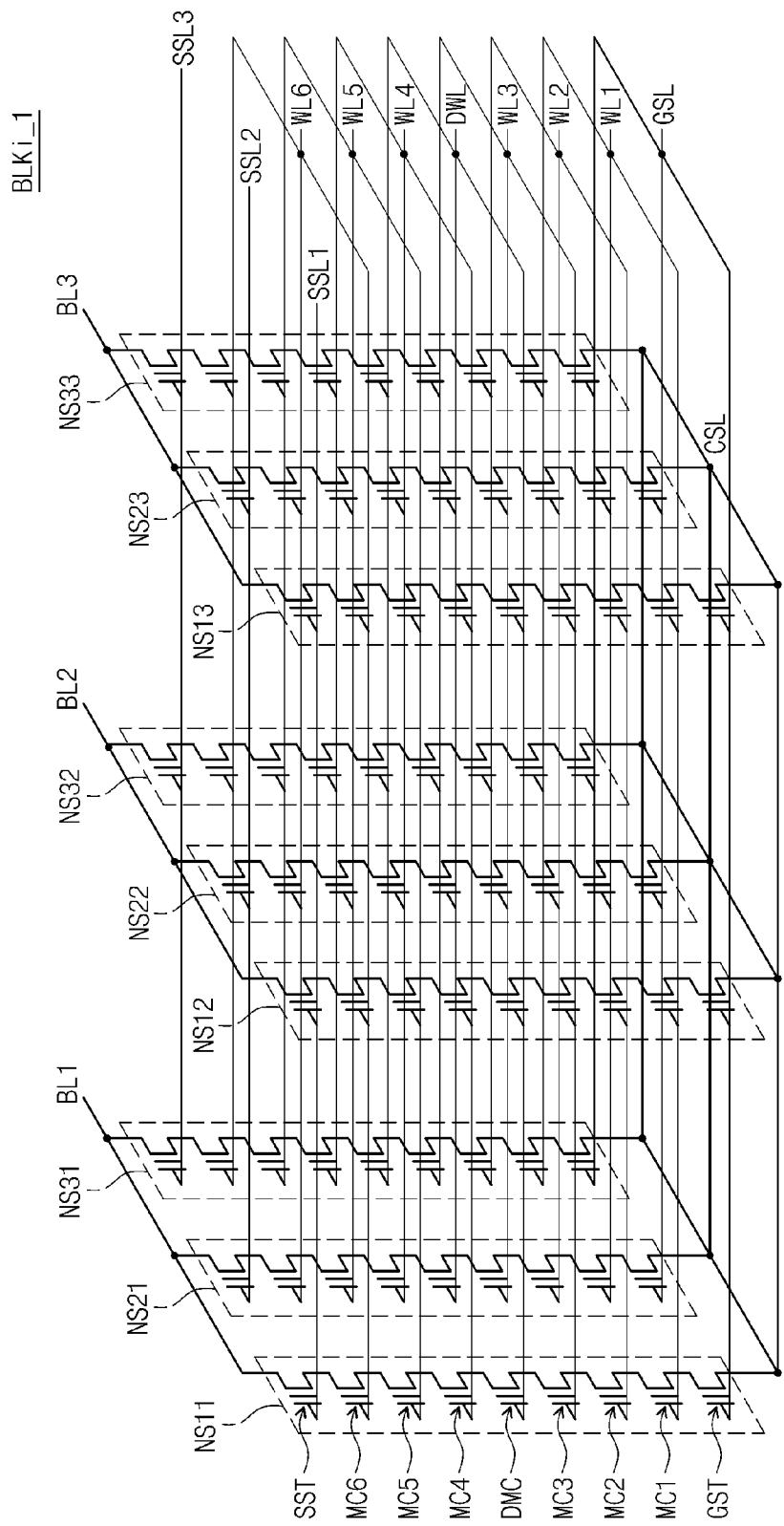
FIG. 7 is a circuit diagram illustrating an equivalent circuit BLKi_1 according to example embodiments of the memory block BLKi described with reference to FIGS. 4 to 6.

FIG. 7 is a circuit diagram illustrating an equivalent circuit BLKi_1 according to example embodiments of the memory block BLKi described with reference to FIGS. 4 to 6. Referring to FIGS. 4 to 7, NAND strings NS11 to NS31 are provided between a first bit line BL1 and a common source line CSL. NAND strings NS12, NS22 and NS32 are provided between a second bit line BL2 and the common source line CSL. NAND strings NS13, NS23 and NS33 are provided between a third bit line BL3 and the common source line CSL. The first to third bit lines BL1 to BL3 respectively correspond to the second conductive materials 331 to 333 extending in the third direction.

A string select transistor SST of each NAND string NS is connected to the corresponding bit line BL. A ground select transistor GST of each NAND string NS is connected to the common source line CSL. Memory cells MC are provided between the string select transistor SST and the ground select transistor GST of each NAND string NS.

Hereinafter, the NAND strings NS are defined in units of rows and columns. The NAND strings NS commonly connected to one bit line form one column. For example, the NAND strings NS11 to NS 31 connected to the first bit line BL1 correspond to a first column. The NAND strings NS12 to NS 32 connected to the second bit line BL2 correspond to a second column. The NAND strings NS13 to NS 33 connected to the third bit line BL3 correspond to a third column.

The NAND strings NS connected to one string select line SSL form one row. For example, the NAND strings NS11 to NS13 connected to the first string select line SSL1 form a first row. The NAND strings NS21 to NS23 connected to the second string select line SSL2 form a second row. The NAND strings NS31 to NS33 connected to the third string select line SSL3 form a third row.

A height is defined in each NAND string NS. Exemplarily, the height of the ground select transistor GST is defined as 1 in each NAND string NS. The height of the memory cell MC1 adjacent to the ground select transistor GST is defined as 2. The height of the string select transistor SST is defined as 9. The height of the memory cell MC6 adjacent to the string select transistor SST is defined as 8.

As an order of the memory cell MC increases from the ground select transistor GST, the height of the memory cell MC increases. That is, first to third memory cells MC1 to MC3 are defined to have second to fourth heights, respectively. A dummy memory cell is defined to have a fifth height. Fourth to sixths memory cells MC4 to MC6 are defined to have sixth to eighth heights, respectively.

The NAND strings NS of the same row share the ground select line GSL. The NAND strings NS arranged in different rows share the ground select line GSL. The first conductive materials 211 to 213 having the first height are connected to each other to thereby form the ground select line GSL.

The memory cells MC having the same height in the NAND strings NS of the same row share the word line WL. The word lines WL of the NAND strings NS which have the same height and correspond to different rows are commonly connected. That is, the memory cells MC with the same height share the word line WL.

The first conductive materials 221 to 223 having the second height are commonly connected to form the first word line WL1. The first conductive materials 231 to 233 having the third height are commonly connected to form the second word line WL2. The first conductive materials 241 to 243 having the fourth height are commonly connected to form the third word line WL3. The first conductive materials 251 to 253 having the fifth height are commonly connected to form the dummy word line DWL. The first conductive materials 261 to 263 having the sixth height are commonly connected to form the fourth word line WL4. The first conductive materials 271 to 273 having the seventh height are commonly connected to form the fifth word line WL5. The first conductive materials 281 to 283 having the eighth height are commonly connected to form the sixth word line WL6.

The NAND strings NS of the same row share the string select line SSL. The NAND strings NS of different rows are connected to different string select lines SSL1, SSL2 and SSL3, respectively. The first to third string select lines SSL1 to SSL3 correspond to the first conductive materials 291 to 293 having the ninth height, respectively.

Hereinafter, first string select transistors SST1 are defined as the string select transistors SST connected to the first string select line SSL1. Second string select transistors SST2 are defined as the string select transistors SST connected to the second string select line SSL2. Third string select transistors SST3 are defined as the string select transistors SST connected to the third string select line SSL3.

The common source line CSL is commonly connected to all the NAND strings NS. For example, the first to fourth doping regions 311 to 314 are connected to each other to thereby form the common source line CSL.

As illustrated in FIG. 7, the word lines WL having the same height are commonly connected. Therefore, when the word line WL with a specific height is selected, all of the NAND strings NS connected to the selected word line WL are selected.

The NAND strings of different rows are connected to different string select lines SSL. Accordingly, among the NAND strings NS connected to the same word line WL, the NAND strings NS of the unselected row may be electrically isolated from the corresponding bit line and the NAND strings NS of the selected row may be electrically connected to the corresponding bit line by selecting and unselecting the string select lines SSL1 to SSL3.

That is, by selecting and unselecting the string select lines SSL1 to SSL3, the row of the NAND stings NS may be selected. A column of the NAND strings NS of the selected row may be selected.

Exemplarily, one of the string select lines SSL1 to SSL3 is selected during program and read operations. That is, the program and read operations are performed in units of rows of the NAND strings NS11 to NS13, NS21 to NS23, and NS31 to NS33.

Exemplarily, a select voltage is applied to the selected word line of the selected row during the program or read operations, and an unselect voltage is applied to the unselected word lines and the dummy word line DWL. For example, the select voltage is a program voltage Vpgm or selection read voltage Vrd. For instance, the unselect voltage is a pass voltage Vpass or unselection read voltage Vread. That is, the program and read operations are performed in units of word lines of the selected row of the NAND strings NS11 to NS13, NS21 to NS23, and NS31 to NS33.

Exemplarily, among the first conductive materials 211 to 291, 212 to 292, and 213 to 293, the thickness of the insulation material 112 provided between the first conductive material acting as the select lines and the first conductive material acting as the word lines may be greater than the thickness of other insulation materials 112.

In FIGS. 4 to 7, the first conductive materials 211, 212 and 213 having the first height operates as the ground select line GSL, and the first conductive materials 291, 292 and 293 having the ninth height operates as the string select lines SSL1, SSL2 and SSL3.

Here, the insulation materials 112 provided between the first conductive materials 211, 212 and 213 having the first height and the first conductive materials 221, 222 and 223 having the second height may be greater in thickness than the insulation materials 112 provided between the first conductive materials 221, 222 and 223 having the second height and the conductive materials 281, 282 and 283 having the eighth height.

Likewise, the insulation materials 112 provided between the first conductive materials 281, 282 and 283 having the eighth height and the first conductive materials 291, 292 and 293 having the ninth height may be greater in thickness than the insulation materials 112 provided between the first conductive materials 221, 222 and 223 having the second height and the conductive materials 281, 282 and 283 having the eighth height.

Figure 8:
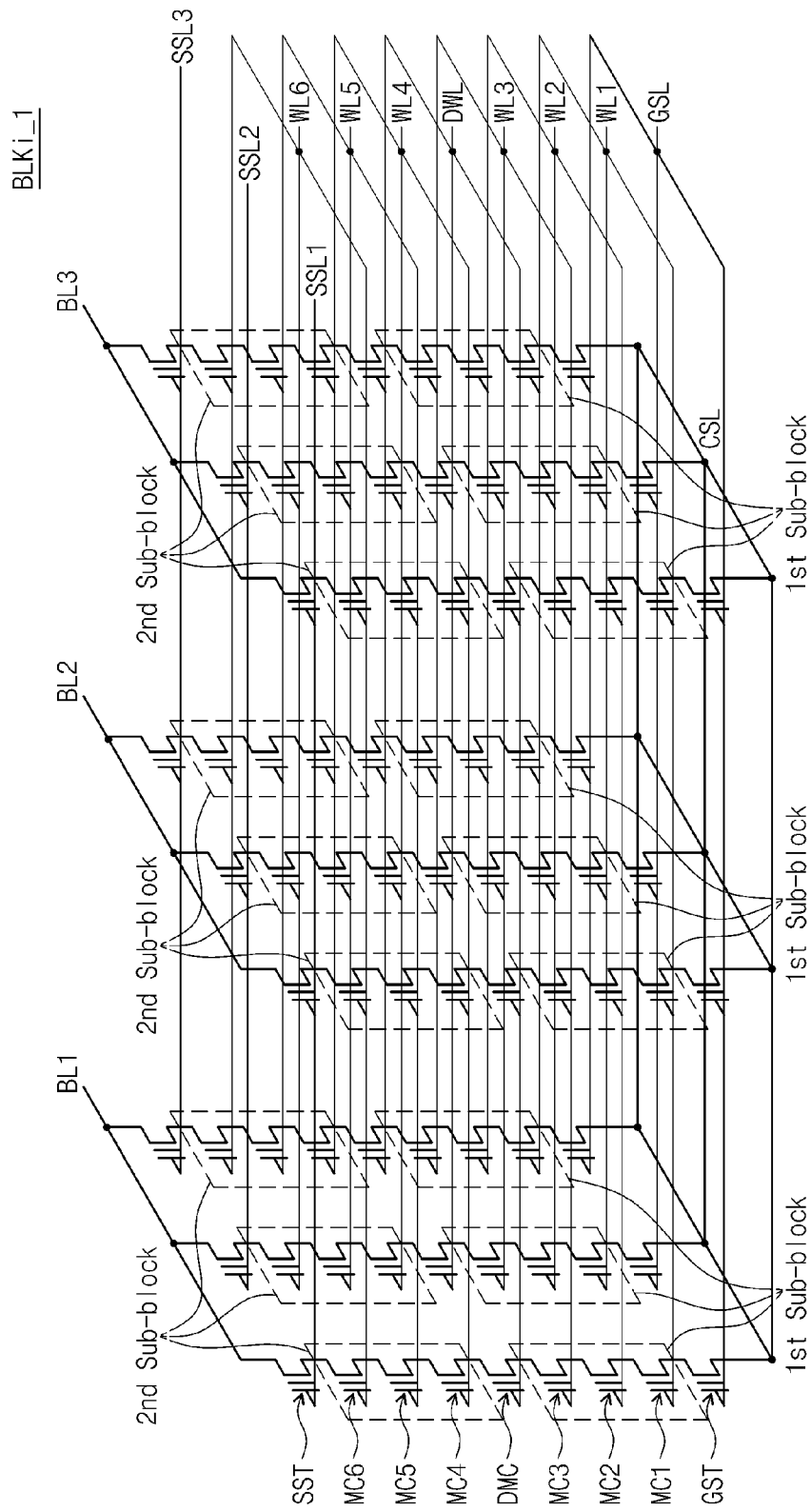
FIG. 8 is a circuit diagram illustrating example embodiments where the memory cells MC of the memory block BLKi_1 form sub blocks.

FIG. 8 is a circuit diagram illustrating example embodiments in which the memory cells MC of the memory block BLKi_1 form sub blocks. Referring to FIG. 8, in the memory block BLKi_1, the first to third memory cells MC1 to MC3 provided between the dummy memory cells DMC and the ground select transistors GST constitute a first sub block. The fourth to sixth memory cells MC4 to MC6 provided between the dummy memory cells DMC and the string select transistors SST constitute a second sub block. In example embodiments, the dummy memory cells DMC act as a separator to separate the first sub block from the second sub block Exemplarily, an erase operation is performed in units of sub blocks. For example, each sub block is independently erased. For example, the second sub block may be erase-inhibited while the first sub block is being erased. The first sub block may be erase-inhibited while the second sub block is being erased. That is, in each of the NAND strings NS, while some (e.g., MC1 to MC3) of the memory cells MC1 to MC6 are being erased, the other memory cells (e.g., MC4 to MC6) may be erase-inhibited.

FIG. 9 is a table illustrating example embodiments of conditions of voltages which are applied to the memory block BLKi_1 of FIG. 8 during an erase operation. Referring to FIGS. 8 and 9, the string select lines SSL1 to SSL3 are floated. The word lines WL of the unselected sub block are floated. A word line erase voltage Vwe is applied to the word lines WL of the selected sub block. A first dummy word line voltage Vdwl1 is applied to the dummy word line DWL. The ground select line GSL is floated. Then, an erase voltage Vers is applied to the substrate 111.

For example, it is assumed that the first sub block is selected. During the erase operation, the word line erase voltage Vwe is applied to the word lines WL1 to WL3 of the selected first sub block. During the erase operation, the word lines WL4 to WL6 of the unselected second sub block are floated.

Figure 10:
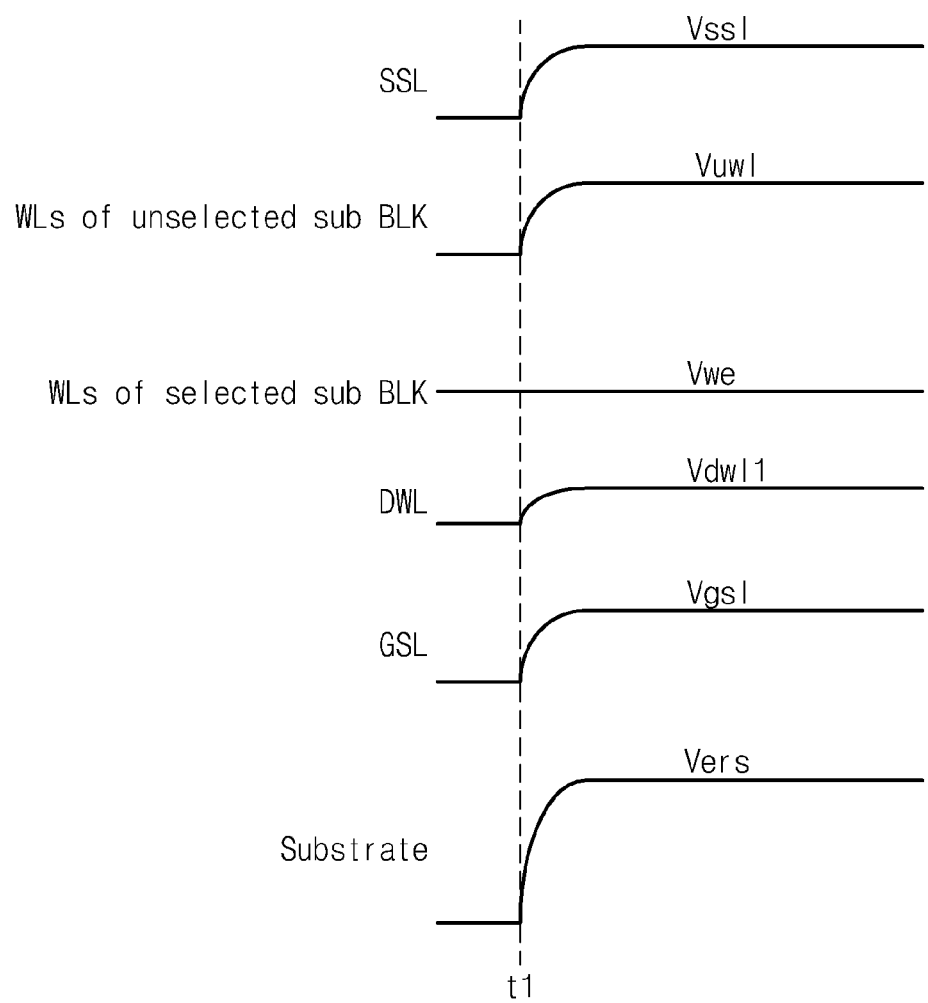
FIG. 10 is an example timing diagram illustrating voltage variations of the memory block BLKi_1 according to the voltage conditions of FIG. 9.
Figure 11:
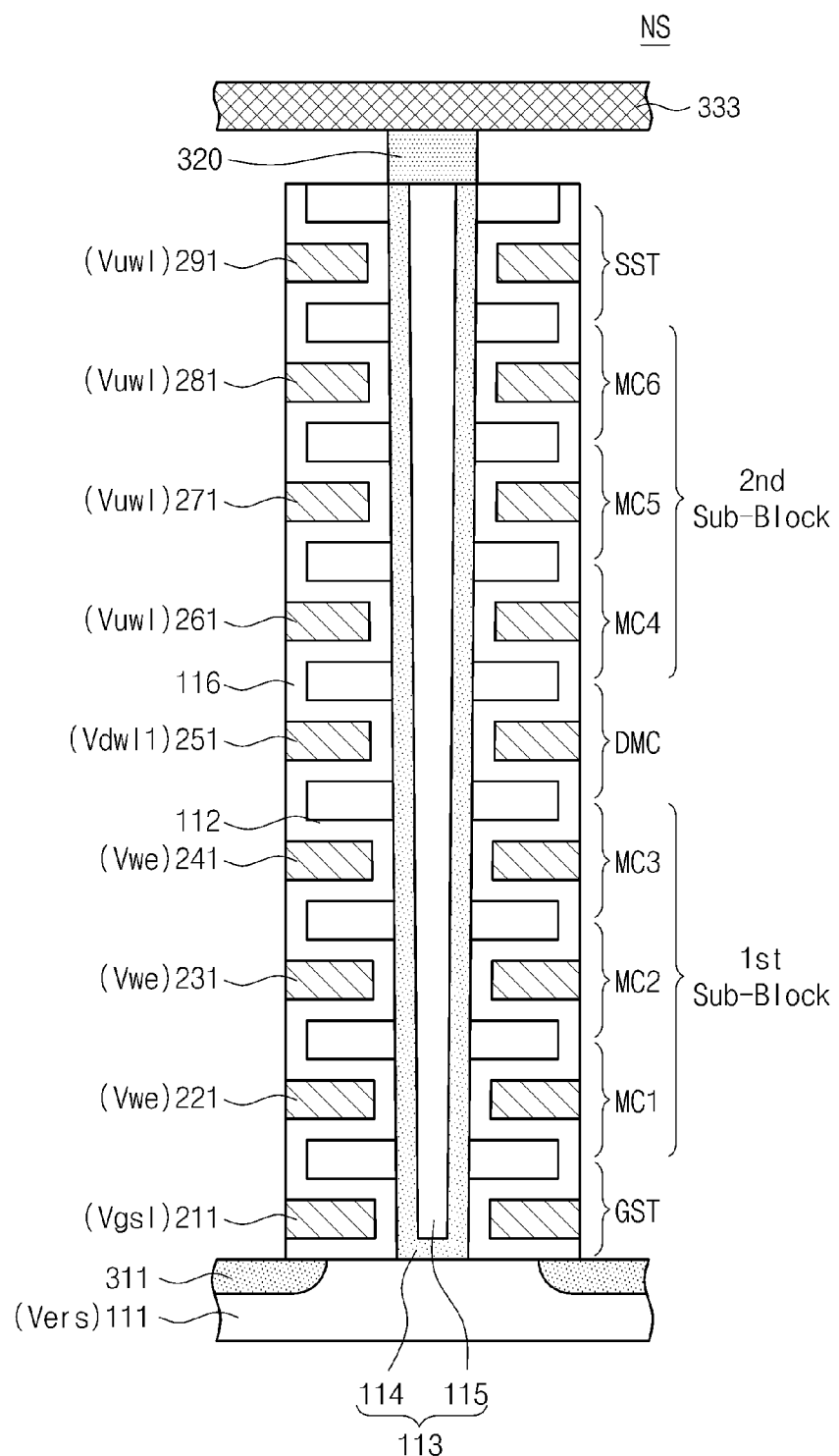
FIG. 11 is a cross-sectional view of one of the NAND strings of the memory block BLKi_1.

FIG. 10 is a timing diagram illustrating voltage variations of the memory block BLKi_1 according to the voltage conditions of FIG. 9. FIG. 11 is a cross-sectional view of one of the NAND strings of the memory block BLKi_1. Hereinafter, the erase operation of the memory block BLKi_1 will be described with reference to FIG. 11. Exemplarily, it is assumed that the first sub block is erased and the second sub block is erase-inhibited.

Referring to FIGS. 8 to 11, the erase voltage Vers is applied to the substrate 111 at a first timing t1. For example, the erase voltage Vers may be a high voltage.

The substrate 111 is doped with the same type substance with the surface layer 114 acting as a body in the second direction. Therefore, the erase voltage Vers is transferred to the surface layer 114 of the NAND string NS.

The first conductive material 211 having the first height acts as the ground select line GSL, and acts as the gate (or control gate) of the ground select transistor GST. The ground select line GSL is floated at the first timing t1. The first conductive material 211 is affected by coupling from the surface layer 114. Accordingly, as the voltage of the surface layer 114 increases to the erase voltage Vers, the voltage of the first conductive material 211 acting as the ground select line GSL increases. For example, the voltage of the ground select line GSL rises up to a ground select line voltage Vgsl.

The voltage of the surface layer 114 acting as a body in the second direction is the erase voltage Vers, and the voltage of the first conductive material acting as the gate (or control gate) of the ground select transistor GST is the ground select line voltage Vgsl. Exemplarily, a difference between the erase voltage Vers and the ground select line voltage Vgsl is not so large to induce Fowler-Nordheim tunneling. Therefore, the ground select transistor GST is erase-inhibited.

The first conductive materials 221 to 241 having the second to fourth heights act as the first to third word lines WL1 to WL3, respectively, and act as the gates (or control gates) of the first to third memory cells MC1 to MC3. At the first timing t1, the word line erase voltage Vwe is applied to the selected word lines. Accordingly, the word line erase voltage Vwe is applied to the first to third word line voltages WL1 to WL3. For example, the word line voltage Vwe is a low voltage. For example, the word line erase voltage Vwe is a ground voltage.

The voltage of the surface layer 114 acting as the body in the second direction is the erase voltage Vers, and the voltage of the first conductive materials 221 to 241 acting as the gates (or control gates) of the first to third memory cells MC1 to MC3 is the word line erase voltage Vwe. For example, a difference between the erase voltage Vers and the word line erase voltage Vwe induces Fowler-Nordheim tunneling. For example, voltage levels of the erase voltage Vers and the word line erase voltage Vwe may be set so as to induce Fowler-Nordheim tunneling. Therefore, the first to third memory cells MC1 to MC3 of the selected first sub block are erased.

The first conductive materials 261 to 281 having the sixth to eighth heights act as the fourth to sixth word lines WL4 to WL6, and act as gates (or control gates) of the fourth to sixth memory cells MC4 to MC6. The unselected word lines are floated at the first timing t1. The first conductive materials 261 to 281 are affected by coupling from the surface layer 114. Accordingly, as the voltage of the surface layer 114 increases to the erase voltage Vers, the voltages of the first conductive materials 261 to 281 acting as the fourth to sixth word lines WL4 to WL6 increase. For example, the voltages of the fourth to sixth word lines WL4 to WL6 rises up to an unselected word line voltage Vuw1.

The voltage of the surface layer 114 acting as a body in the second direction is the erase voltage Vers, and the voltages of the first conductive materials 261 to 281 acting as the gates (or control gates) of the fourth to sixth memory cells MC4 to MC6 are the unselected word line voltage Vuw1. Exemplarily, a difference between the erase voltage Vers and the unselected word line voltage Vuw1 is not so large to induce Fowler-Nordheim tunneling. Therefore, the fourth to sixth memory cells MC4 to MC6 of the unselected second sub block are erase-inhibited.

The first conductive material 291 having the ninth height acts as the string select line SSL, and acts as the gate (or control gate) of the string select transistor SST. The string select line SSL is floated at the first timing t1. The first conductive material 291 is affected by coupling from the surface layer 114. Accordingly, as the voltage of the surface layer 114 increases to the erase voltage Vers, the voltage of the first conductive materials 291 acting as the string select line SSL increases. For example, the voltages of the string select line SSL rises up to a string select line voltage Vssl.

The voltage of the surface layer 114 acting as a body in the second direction is the erase voltage Vers, and the voltage of the first conductive material 291 acting as the gate (or control gate) of the string select transistor SST is the string select line voltage Vssl. Exemplarily, a difference between the erase voltage Vers and the string select line voltage Vssl is not so large to induce Fowler-Nordheim tunneling. Therefore, the string select transistor SST is erase-inhibited.

The first conductive material 251 having the fifth height acts as the dummy word line DWL, and acts as the gate (or control gate) of the dummy memory cell DMC. A first dummy word line voltage Vdwl1 is applied to the dummy word line DWL at the first timing t1. Exemplarily, the voltage level of the first dummy word line voltage Vdwl1 is set so as not to induce Fowler-Nordheim tunneling due to a voltage difference between the surface layer 141 and the gate (or control gate) of the dummy memory cell DMC. That is, the dummy memory cell DMC is erase-inhibited.

When the word line erase voltage Vwe is applied to the word lines (e.g., WL1 to WL3) of the selected sub block, voltages of the word lines (e.g., WL4 to WL6) of the unselected sub block rise up to the unselected word line voltage Vuw1 due to coupling. At this time, the word lines WL4 to WL6 of the unselected sub block may be affected by coupling from the word line erase voltage Vwe applied to the word lines WL1 to WL3 of the selected sub block. That is, owing to the coupling effect from the word lines WL1 to WL3 of the selected sub block, a voltage increment of the word lines WL4 to WL6 of the unselected sub block may be decreased.

Likewise, the word lines WL1 to WL3 of the selected sub block may be affected by coupling from the word lines WL4 to WL6 of the unselected sub block. That is, the voltages of the word lines WL1 to WL3 of the selected sub block may be increased due to the coupling effect from the word lines WL4 to WL6 of the unselected sub block.

The dummy word line DWL is provided between the first and second sub blocks. Exemplarily, the first dummy word line voltage Vdwl1 is set to have a voltage level between the word line erase voltage Vwe and the erase voltage Vers. More specifically, the first dummy word line voltage Vdwl1 is set to have a voltage level between the word line erase voltage Vwe and the unselected word line voltage Vuw1. The electric field between the word lines WL1 to WL3 of the selected sub block and the word lines WL4 to WL6 of the unselected sub block is relieved by the first dummy word line voltage Vdwl1 of the dummy word line DWL.

Therefore, a decrease in voltage increment of the word lines WL4 to WL6 of the unselected sub block is prevented by virtue of coupling from the word lines WL1 to WL3 of the selected sub block. Furthermore, an increase in voltages of the word lines WL1 to WL3 of the selected sub block is prevented by virtue of coupling from the word lines WL4 to WL6 of the unselected sub block. Also, the electric field between the word lines WL1 to WL3 of the selected sub block and the word lines WL4 to WL6 of the unselected sub block prevents hot carriers from being generated.

In example embodiments above, it has been described that the word line erase voltage Vwe and the first dummy word line voltage Vdwl1 are applied at the first timing. However, the erase voltage Vers, the word line erase voltage Vwe, and the first dummy word line voltage Vdwl1 may be applied in sequence according to a preset order. For example, at least one voltage of the erase voltage Vers, the word line erase voltage Vwe, and the first dummy word line voltage Vdwl1 may be applied prior to or after other at least one voltage of the erase voltage Vers, the word line erase voltage Vwe, and the first dummy word line voltage Vdwl1. In another example, two voltages of the erase voltage Vers, the word line erase voltage Vwe, and the first dummy word line voltage Vdwl1 may be applied prior to or after another voltage of the erase voltage Vers, the word line erase voltage Vwe, and the first dummy word line voltage Vdwl1.

Figure 12:
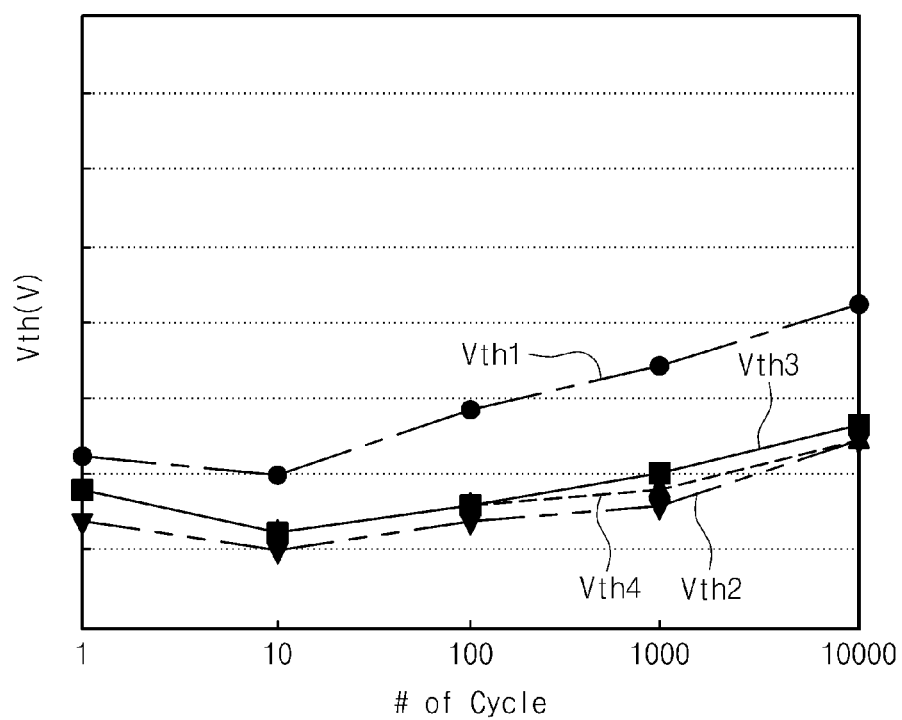
FIG. 12 is an example graph illustrating threshold voltages of the memory cells MC which are measured while varying the first dummy word line voltage Vdwl1.

FIG. 12 is a graph illustrating threshold voltages of the memory cells MC which are measured while varying the first dummy word line voltage Vdwl1. In FIG. 12, the horizontal axis represents the number of erase cycles, and the vertical axis represents threshold voltages of the memory cells MC.

Exemplarily, it is assumed that the erase operation is performed on the first sub block. The threshold voltages shown in FIG. 12 represent threshold voltage variations of the memory cells of the selected first sub block.

First and second threshold voltage lines Vth1 and Vth2 represent variations of the threshold voltages of the memory cells MC according to the number of erase cycles when the first dummy word line voltage Vdwl1 is set to 12 V. For example, the first threshold voltage line Vth1 represents threshold voltage variations of the dummy memory cell DMC and the memory cell MC3 adjacent thereto. The second threshold voltage line Vth2 represents the memory cells MC1 and MC2 in the first sub block.

Third and fourth threshold voltage lines Vth3 and Vth4 represent variations of the threshold voltages of the memory cells MC according to the number of erase cycles when the first dummy word line voltage Vdwl1 is set to 8 V. For example, the third threshold voltage line Vth3 represents threshold voltage variations of the dummy memory cell DMC and the memory cell MC3 adjacent thereto. The fourth threshold voltage line Vth4 represents the memory cells MC1 and MC2 in the first sub block.

When the first dummy word line voltage Vdwl1 is set to 12 V, a difference between the threshold voltage of the memory cell MC3 adjacent to the dummy word line DWL and the threshold voltages of the memory cells MC1 and MC2 in the first sub block increases as the number of erase cycles of the first sub block increases. That is, as the number of erase cycles of the first sub block increases, a threshold voltage distribution of the memory cells MC1 to MC3 in an erase state increases.

When the first dummy word line voltage Vdwl1 is set to 8 V, a difference between the threshold voltage of the memory cell MC3 adjacent to the dummy word line DWL and the threshold voltages of the memory cells MC 1 and MC2 in the sub block is maintained to a reference value or less even though the number of erase cycles of the first sub block increases. That is, even if the number of erase cycles of the first sub block increases, the threshold voltage distribution of the memory cells MC1 to MC3 in the erase state is maintained.

FIG. 13 is a table illustrating example embodiments of conditions of voltages which are applied to the memory block BLKi_1 of FIG. 8 during an erase operation. Referring to FIGS. 8 and 13, the string select lines SSL1 to SSL3 are floated during the erase operation. The word line erase-inhibit voltage Vwei is applied to the word lines WL of the unselected sub block. The word line erase voltage Vwe is applied to the word lines WL of the selected sub block. The second dummy word line voltage Vdwl2 is applied to the dummy word line DWL. The ground select line GSL is floated. The erase voltage Vers is applied to the substrate 111.

Exemplarily, it is assumed that the first sub block is selected. During the erase operation, the word line erase voltage Vwe is applied to the word lines WL1 to WL3 of the selected first sub block. During the erase operation, the word line erase-inhibit voltage Vwei is applied to the word lines WL4 to WL6 of the unselected second sub block.

Figure 14:
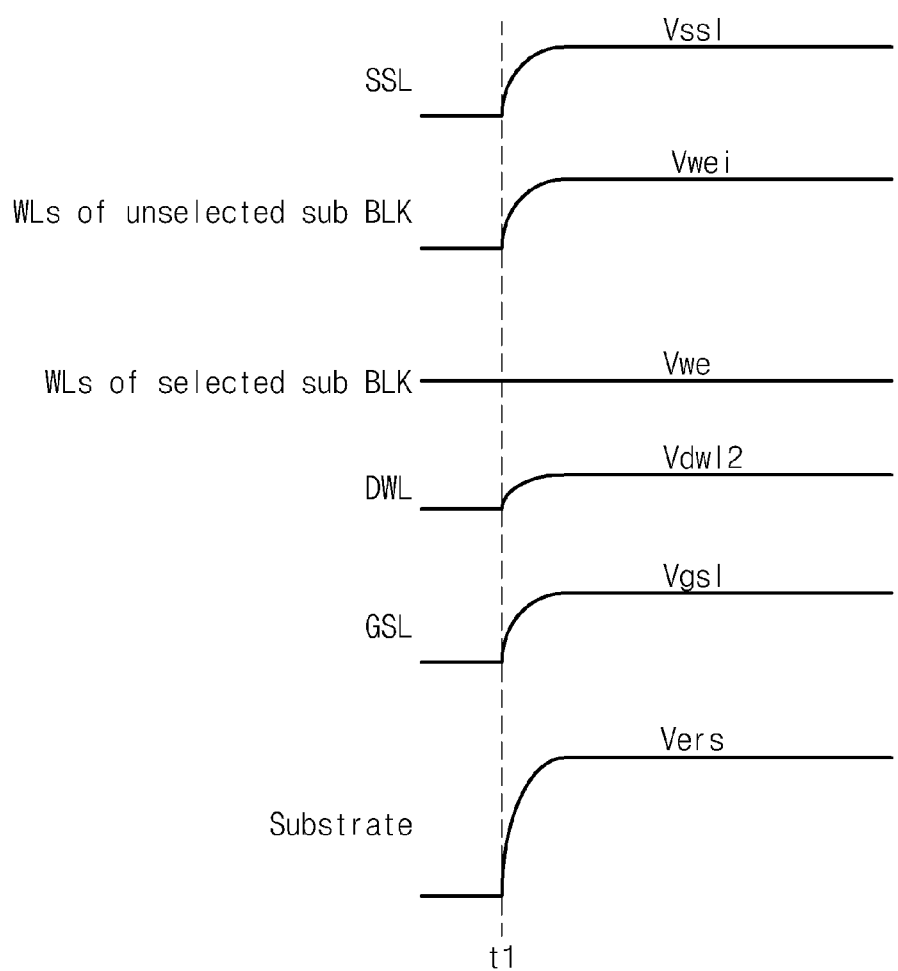
FIG. 14 is an example timing diagram illustrating voltage variations of the memory block BLKi_1 according to the voltage conditions of FIG. 13.
Figure 15:
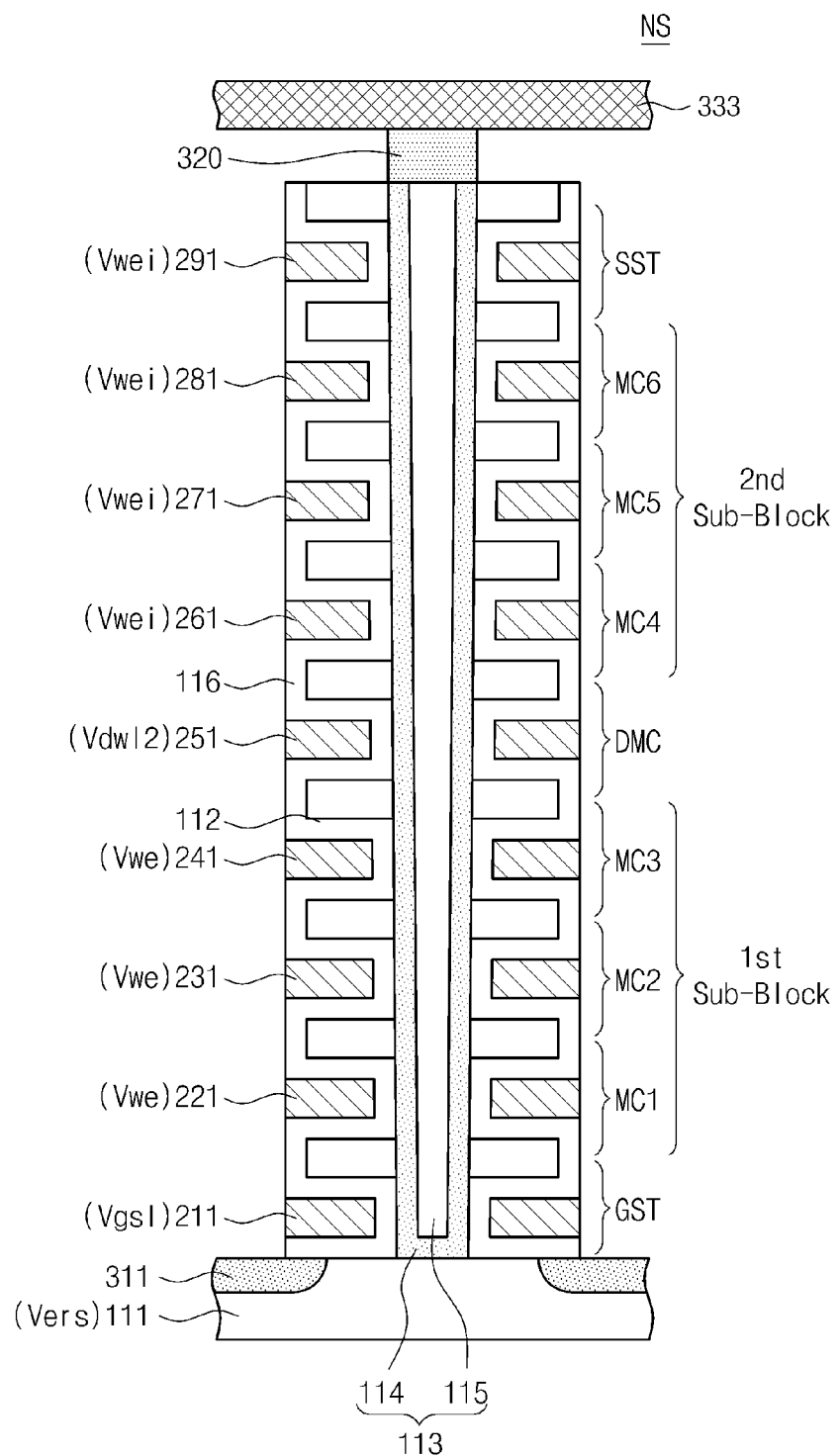
FIG. 15 is a cross-sectional view of one of the NAND strings of the memory block BLKi_1.

FIG. 14 is a timing diagram illustrating voltage variations of the memory block BLKi_1 according to the voltage conditions of FIG. 13. FIG. 15 is a cross-sectional view of one of the NAND strings of the memory block BLKi_1. Hereinafter, the erase operation of the memory block BLKi_1 will be described with reference to FIG. 14. Exemplarily, it is assumed that the first sub block is erased and the second sub block is erase-inhibited.

Voltage conditions and voltage variations of FIG. 14 are identical to those described in FIGS. 9 to 11, except that the word line erase-inhibit voltage Vwei is applied to the word lines WL4 to WL6 of the unselected sub block and the second dummy word line voltage Vdwl2 is applied to the dummy word line DWL. Therefore, duplicate description will be omitted herein.

Referring to FIGS. 13 to 15, the erase voltage Vers is applied to the substrate 111 at the first timing t1. Exemplarily, the erase voltage Vers may be a high voltage.

The substrate 111 is doped with the same type substance with the surface layer 114 acting as a body in the second direction. Therefore, the erase voltage Vers is transferred to the surface layer 114 of the NAND string NS.

The first conductive materials 261 to 281 having the sixth to eighth heights act as the fourth to sixth word lines WL4 to WL6, respectively, and act as the gates (or control gates) of the fourth to sixth memory cells MC4 to MC6. At the first timing t1, the word line erase-inhibit voltage Vwei is applied to the unselected word lines.

The voltage of the surface layer 114 acting as the body in the second direction is the erase voltage Vers, and the voltage of the first conductive materials 261 to 281 acting as the gates (or control gates) of the fourth to sixth memory cells MC4 to MC6 is the word line erase voltage Vwe. For example, a voltage level of the word line erase-inhibit voltage Vwei may be set so as not to induce Fowler-Nordheim tunneling due to a voltage difference between the word line erase-inhibit voltage Vwei and the erase voltage Vers. For example, the word line erase-inhibit voltage Vwei may be a high voltage. Therefore, the fourth to sixth memory cells MC4 to MC6 of the selected second sub block are erase-inhibited.

The first conductive material 251 having the fifth height acts as the dummy word line DWL, and acts as the gate (or control gate) of the dummy memory cell DMC. A second dummy word line voltage Vdwl2 is applied to the dummy word line DWL at the first timing t1. Exemplarily, the voltage level of the second dummy word line voltage Vdwl2 is set so as not to induce Fowler-Nordheim tunneling due to a voltage difference between the surface layer 141 and the gate (or control gate) of the dummy memory cell DMC. That is, the dummy memory cell DMC is erase-inhibited.

The dummy word line DWL is provided between the first and second sub blocks. Exemplarily, the second dummy word line voltage Vdwl2 is set to have a voltage level between the word line erase voltage Vwe and the word line erase-inhibit voltage Vwei. The electric field between the word lines WL1 to WL3 of the selected sub block and the word lines WL4 to WL6 of the unselected sub block is relieved by the first dummy word line voltage Vdwl of the dummy word line DWL.

Therefore, a decrease in voltage increment of the word lines WL4 to WL6 of the unselected sub block is prevented by virtue of coupling from the word lines WL1 to WL3 of the selected sub block. Furthermore, an increase in voltages of the word lines WL1 to WL3 of the selected sub block is prevented by virtue of coupling from the word lines WL4 to WL6 of the unselected sub block. Also, the electric field between the word lines WL1 to WL3 of the selected sub block and the word lines WL4 to WL6 of the unselected sub block prevents hot carriers from being generated.

In the example embodiments above, it has been described that the erase voltage Vers, the word line erase voltage Vwe, the word line erase-inhibit voltage Vwei, and the second dummy word line voltage Vdwl2 are applied at the first timing. However, the erase voltage Vers, the word line erase voltage Vwe, the word line erase-inhibit voltage Vwei, and the second dummy word line voltage Vdwl2 may be applied in sequence according to a preset order.

As described above, in the nonvolatile memory device 100 (see FIGS. 1 and 2) according to example embodiments of inventive concepts, the erase operation is performed in unit of sub blocks. That is, the erase operating unit is reduced to sub blocks from memory blocks BLK. When the erase operating unit is reduced, a time required for a background operation such as merge, garbage collection, refresh operations is reduced. Accordingly, the operating speed of the nonvolatile memory device 100 may be improved. Also, the operating speed of the memory system 1000 including the nonvolatile memory device 100 may be improved.

As described above, a dummy memory cell DMC is provided between sub blocks. Exemplarily, the first dummy word line voltage Vdwl1 having a voltage level between the word line erase voltage Vwe and the unselected word line voltage Vuw1 is applied is applied to the dummy memory cell DMC during the erase operation. As another example, the second dummy word line voltage Vdwl2 having a voltage level between the word line erase voltage Vwe and the word line erase-inhibit voltage Vwei is applied to the dummy memory cell DMC during the erase operation. Therefore, the reliability of the nonvolatile memory device 100 and the reliability of the memory system 1000 including the same may be improved because the electric field between the sub blocks is relieved.

Figure 16:
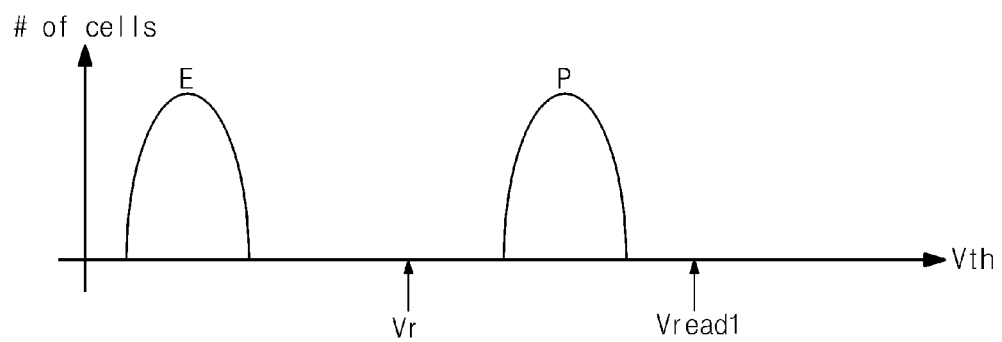
FIG. 16 is a diagram illustrating example embodiments of the threshold voltage distribution of the memory cells MC of the memory block BLKi_1 in FIG. 8.

FIG. 16 is a diagram illustrating example embodiments of the threshold voltage distribution of the memory cells MC of the memory block BLKi_1 in FIG. 8. In FIG. 16, a horizontal axis represents threshold voltages of the memory cells MC, and a vertical axis represents the number of memory cells. Exemplarily, FIG. 16 illustrates the threshold voltage distribution of the memory cells MC in which one bit is stored in each cell. Referring to FIGS. 8 and 16, the memory cells MC have one of an erase state E and a program state P.

During a read operation, a select read voltage Vr is applied to the selected word line. The select read voltage Vr has a voltage level between the threshold voltages of the memory cells in the erase state E and the threshold voltages of the memory cells in the program state P. That is, among the memory cells MC connected to the selected word line, the memory cells of the erase state E are turned off, and the memory cells of the program state P are turned on.

During the read operation, a first unselect read voltage Vread1 is applied to the unselected word lines. The first unselect read voltage Vread1 has a high voltage level than the threshold voltages of the memory cells MC. For example, the first unselect read voltage Vread1 may be a high voltage. That is, the memory cells MC connected to the unselected word line are turned on.

During the read operation, a turn-on voltage is applied to the dummy word line. The turn-on voltage is a voltage turning on the dummy cells DMC. For example, the turn-on voltage may be a first unselect read voltage Vread1.

Figure 17:
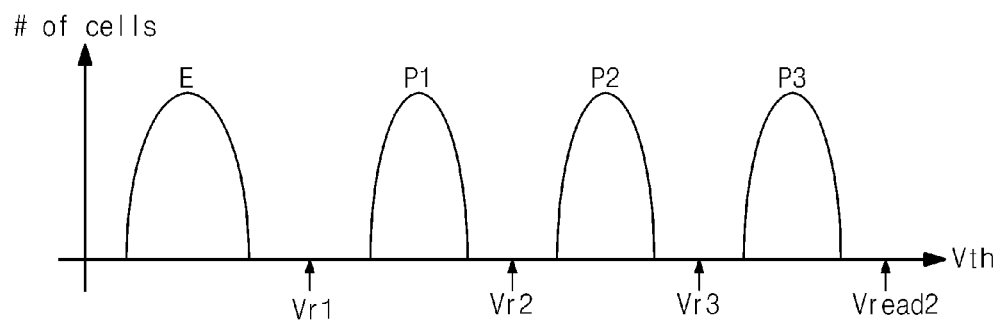
FIG. 17 is a diagram illustrating example embodiments of the threshold voltage distribution of the memory cells MC of the memory block BLKi_1 in FIG. 8.

FIG. 17 is a diagram illustrating example embodiments of the threshold voltage distribution of the memory cells MC of the memory block BLKi_1 in FIG. 8. In FIG. 16, a horizontal axis represents threshold voltages of the memory cells MC, and a vertical axis represents the number of memory cells. Exemplarily, FIG. 16 illustrates the threshold voltage distribution of the memory cells MC in which one bit is stored in each cell. Referring to FIGS. 8 and 16, the memory cells MC have one of an erase state E and a program state P.

During the read operation, at least two of first to third select read voltages Vr1 to Vr3 are sequentially applied to the selected word line. Whenever one of the first to third select read voltages Vr1 to Vr3 is applied to the selected word line, the second unselect read voltage Vread2 is applied to the unselected word line and the turn-on voltage is applied to the dummy word line DWL. For example, the turn-on voltage may be the second unselect read voltage Vread2.

Like the description with reference to FIGS. 16 and 17, the first unselect read voltage Vread1 or the second unselect read voltage Vread2 is applied to the unselected word lines during the read operation. The first and second unselected read voltages Vread1 and Vread2 have voltage levels higher than the threshold voltages of the memory cells MC. For example, the first and second unselect read voltages Vread1 and Vread2 may be a high voltage.

During the read operation, the threshold voltages of the memory cells MC connected to the unselected word lines may vary due to the first unselect read voltage Vread1 or second unselect read voltage Vread2. For example, the threshold voltages of the memory cells MC connected to the unselected word lines may be increased. That is, a read disturb may occur. When the read disturb occurs, data stored in the memory cells MC may be lost.

As the number of bits stored in one memory cell increases, the threshold voltage of the memory cell also increases. That is, as the number of bits stored in one memory cell increases, the unselect read voltage also increases. Accordingly, as the number of bits stored in one memory cell increases, the read disturb becomes more serious.

As illustrated in FIG. 8, the first and second sub blocks share the NAND strings NS11 to NS13, NS21 to NS23, and NS31 to NS33. More specifically, some of the memory cells MC of each NAND string NS is assigned to the first sub block, and the others are assigned to the second block.

When the read operation is performed in the first sub block, the select read voltage Vr, Vr1, Vr2 or Vr3 is applied to the selected word line of the first sub block, and the unselect read voltage Vread1 or Vread2 is applied to the unselected word lines. The unselect read voltage Vread1 or Vread2 is applied to the word lines of the second sub block.

Likewise, when the read operation is performed in the second sub block, the select read voltage Vr, Vr1, Vr2 or Vr3 is applied to the selected word line of the second sub block, and the unselect read voltage Vread1 or Vread2 is applied to the unselected word lines. The unselect read voltage Vread1 or Vread2 is applied to the word lines of the first sub block.

That is, when the read operation is performed in one of the sub blocks of the memory block BLKi_1, the read disturb may occur in all sub blocks of the memory block BLKi_1 as well as the sub block where the read operation is being performed.

To solve the above-described problem, the memory system 1000 (see FIG. 1) according to example embodiments of inventive concepts is configured to refresh the specific sub block of the memory block BLKi_1 based on the read operation performed in the sub block of the memory block BLKi_1.

Figure 18:
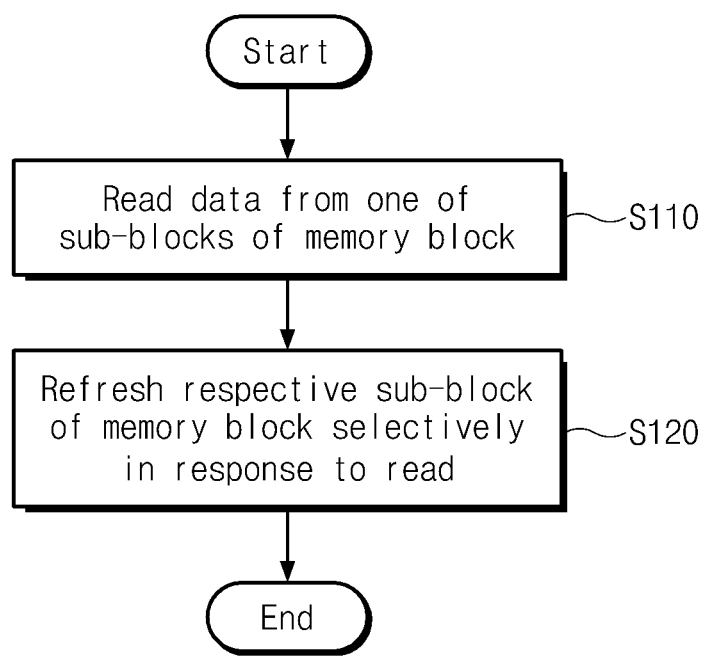
FIG. 18 is a flowchart illustrating a refresh method according to example embodiments of inventive concepts.

FIG. 18 is a flowchart illustrating a refresh method according to example embodiments of inventive concepts. Referring to FIGS. 1, 8, and 18, in operation S110, data are read from one of the sub blocks of the memory block. For example, data are read from one of the first and second sub blocks.

Exemplarily, data are read in response to a read request from the host. For example, between the first and second sub blocks of the selected memory block BLKi_1 of the nonvolatile memory device, the controller 500 reads data from the sub block corresponding to a read request from the host.

Exemplarily, the controller 500 reads data from one of the first and second sub blocks of the selected memory block BLKi_1 of the nonvolatile memory device, which corresponds to a read request from the host according to a predetermined or desired operation schedule. For example, the controller 500 reads data from one of the first and second sub blocks of the selected memory block BLKi_1 of the nonvolatile memory device 100 during a background operation such as merge, garbage collection, and refresh operations.

In operation S120, each sub block of the memory block is selectively refreshed in response to the read operation. For example, in response to the read operation performed in operation S120, each sub block of the selected memory block BLKi_1 is selectively refreshed.

That is, when data are read from one of the sub blocks of the selected memory block BLKi_1, it is determined whether each sub block of the selected memory block BLKi_1 is refreshed. Among the sub blocks of the selected memory block BLKi_1, the sub block where read disturb reaches to a reference value is refreshed. For example, whether refresh is performed or not is determined on the basis of the number of read cycles. That is, the sub block where the number of read cycles reaches to a reference value is refreshed among the sub blocks of the selected memory block BLKi_1.

The refresh includes an operation of backing up data stored in the specific sub block. For example, the refresh may include reading data stored in the specific sub block, and writing the read data to a sub block of the same memory block BLKi_1 or another memory block. Exemplarily, the refresh may further include erasing or invalidating the specific sub block in which backup data are stored.

Figure 19:
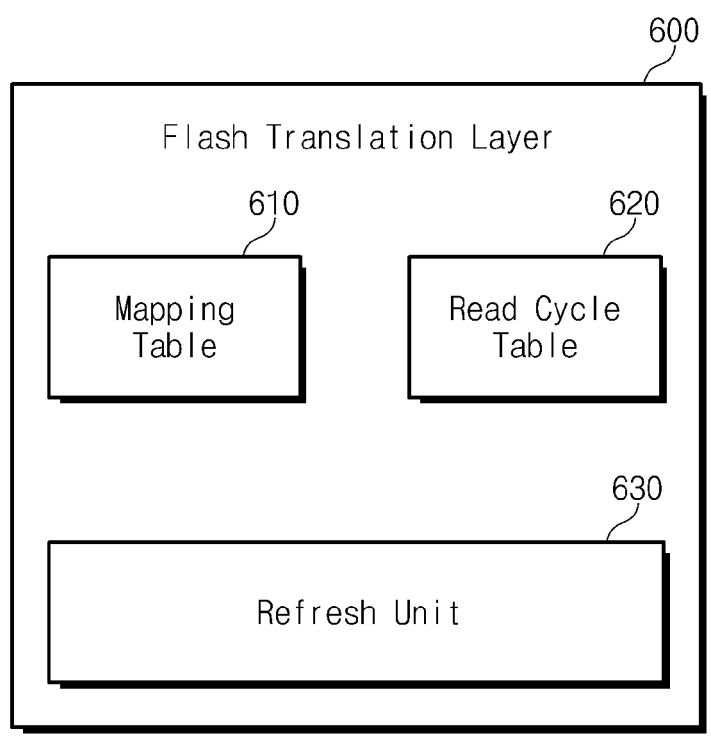
FIG. 19 is an example block diagram illustrating a flash translation layer 600 driven in the controller of FIG. 1.

FIG. 19 is a block diagram illustrating a flash translation layer 600 driven in the controller of FIG. 1. Exemplarily, the flash translation layer 600 is driven by a processor 520 of the controller 500.

Exemplarily, the flash translation layer 600 is stored in the nonvolatile memory device 100. In a power-on state, the controller 500 reads the flash translation layer 600 from the nonvolatile memory device 100. The read flash translation layer 600 is driven by the processor 520.

Exemplarily, the flash translation layer 600 may be stored in the controller 500. For example, the controller 500 may further include a nonvolatile memory (not shown) storing the flash translation layer 600.

Referring to FIGS. 1 and 18, the flash translation layer 600 performs an interfacing operation between the host and the nonvolatile memory device 100. For example, the flash translation layer 600 translates a logical block address (LBA)

received from the host into a physical block address (PBA) used in the nonvolatile memory device 100.

The flash translation layer 600 performs background operations of the nonvolatile memory device 100. For example, the flash translation layer 600 may perform operations such as merge, garbage collection, wear-leveling, and refresh.

The flash translation layer 600 includes a mapping table 610, a read cycle table 620, and/or a refresh unit 630. The mapping table 610 is configured to store mapping information between LBA and PBA.

The read cycle table 620 is configured to store the number of read cycles of each sub block of the memory blocks BLK1 to BLKz of the nonvolatile memory device 100.

The refresh unit 630 is configured to selectively refresh each sub block of the nonvolatile memory device 100 based on the number of read cycles of each sub block stored in the read cycle table 620.

Figure 20:
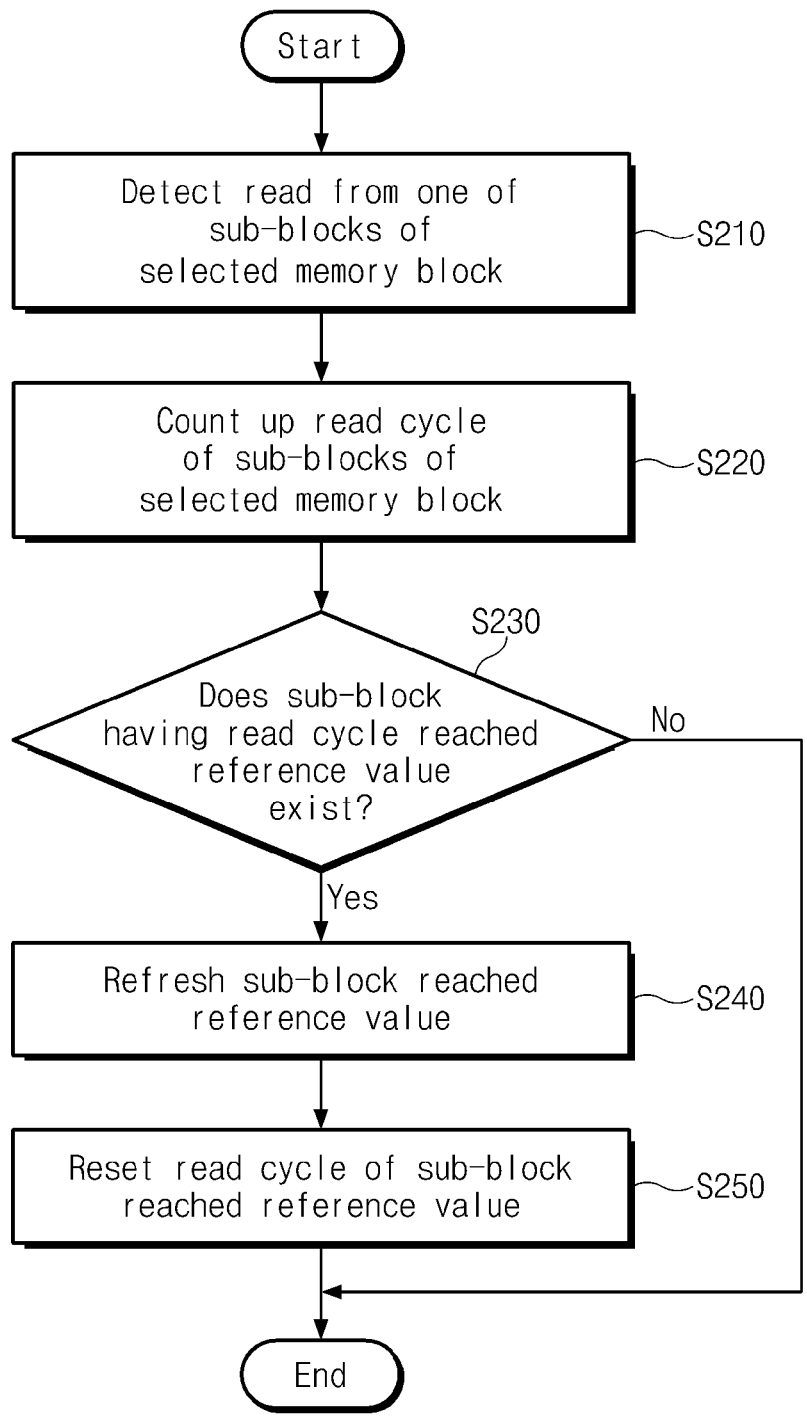
FIG. 20 is an example flow chart illustrating a method of operating the refresh unit 630 of FIG. 19.

FIG. 20 is a flow chart illustrating a method of operating the refresh unit 630 of FIG. 19. Exemplarily, the number of read cycles of the first and second sub blocks of the selected memory block BLKi_1 is assumed to have values in Table 1 below.

TABLE 1

| Sub block | Number of read cycles |
|---|---|
| First sub block | a |
| Second sub block | b |

Referring to FIGS. 19 and 20, in operation S210, reading is detected from one of the sub blocks of the selected memory block BLKi_1. For example, when reading is performed in the selected sub block of the selected memory block BLKi_1, the refresh unit 630 is called. That is, since the refresh unit 630 is activated when reading is performed in the selected sub block, it may be understood that the refresh unit 630 is activated when reading is detected from the selected sub block. Exemplarily, when reading is performed in the selected sub block, an address of the selected sub block is transferred to the refresh unit 630.

In operation S220, the number of read cycles of the sub blocks of the selected memory block BLKi_1 is counted up. When data is read in the first or second sub block of the selected memory block BLKi_1, the refresh unit 630 counts up the numbers of read cycles of both of the first and second sub blocks. Here, the number of read cycles of the sub blocks of the selected memory block BLKi_1 stored in the read cycle table 620 is listed in Table 2 below.

TABLE 2

| Sub block | Number of read cycles |
|---|---|
| First sub block | a + 1 |
| Second sub block | b + 1 |

In operation S230, it is determined whether there exists a sub block having the number of read cycles that reaches to a reference value. For example, the refresh unit 630 determines whether there exists a sub block having the number of read cycles that reaches to the reference value among the sub blocks of the selected memory block BLKi_1. If there is no sub block having the number of read cycles that reaches to the reference value, the refresh unit 630 stops operating. If there is a sub block having the number of read cycles that reaches to the reference value, operation S240 is performed.

In operation S240, the sub block having the number of read cycles that reaches to the reference value is refreshed. For example, the refresh unit 630 refreshes the sub block having the number of read cycles that reaches to the reference value. If there are two or more sub blocks having the number of read cycles that reaches to the reference value in the selected memory block BLKi_1, the refresh unit 630 refreshes at least two sub blocks having the number of read cycles that reaches to the reference value.

Exemplarily, data are read from the sub block to be refreshed under control of the refresh unit 630. The read data are stored in the RAM 530. Thereafter, under control of the refresh unit 630, data stored in the RAM 530 are written to a free sub block of the nonvolatile memory device 100. For example, the read data are written to a free sub block of the selected memory block BLKi_1 or a free sub block of a memory block other than the selected memory block BLKi_1.

Exemplarily, a refresh may be performed in the nonvolatile memory device 100 under control of the refresh unit 630. Under control of the refresh unit 630, the read & write circuit 130 (see FIG. 2) reads data of which volume corresponds to a read unit from the sub block to be refreshed. Thereafter, the read & write circuit 130 writes the read data to the free sub block. The read & write circuit 130 repeats read/write operation until all data of the sub block to be refreshed are written to the free sub block. That is, refresh may be performed based on a copy-back operation.

Exemplarily, when a read cycle of a specific sub block of the selected memory block BLKi_1 reaches to the reference value after the reading of the selected sub block of the selected memory block BLKi_1, the refresh unit 630 may refresh the specific sub block following the reading of the selected sub block.

Exemplarily, when a read cycle of a specific sub block of the selected memory block BLKi_1 reaches to the reference value after the reading of the selected sub block of the selected memory block BLKi_1, the refresh unit 630 makes a reservation for refreshing of the specific sub block. When the memory system 100 is in an idle state, the refresh unit 630 may perform refresh operation on the specific sub block. In the case where the read operation upon the sub block of the memory block BLKi_1 corresponding to the specific sub block is requested in a state that the refresh of the specific sub block is reserved, the refresh unit 630 may refresh the specific sub block before the read operation is performed.

In operation S250, the number of read cycles of the refreshed sub block is reset. Exemplarily, it is assumed that the first sub block of the selected memory block BLKi_1 is reset. Here, the number of read cycles of the sub blocks of the selected memory block BLKi_1 stored in the read cycle table 620 is listed in Table 3 below.

TABLE 3

| Sub block | Number of read cycles |
|---|---|
| First sub block | 0 |
| Second sub block | b + 1 |

Exemplarily, after the first sub block is refreshed, the first sub block may be invalidated. For example, in the mapping table 610, the first sub block may be set as an invalidation data block.

Exemplarily, the first sub block may be erased after the first sub block is refreshed. For example, in succession to the refresh of the first sub block, the first sub block may be erased.

Exemplarily, an erase operation of the first sub block may be reserved after the first sub block is refreshed. For example, when the memory system 1000 is in an idle state, the first sub block may be erased.

In summary, when the read operation is performed in the selected sub block of the sub blocks of the memory block BLKi_1, each sub block of the memory block BLKi_1 is selectively refreshed. For example, when data is written to a specific sub block of the memory block BLKi_1, and thereafter the number of read cycles performed in the sub blocks of the memory block BLKi_1 reaches to the reference value, the specific sub block is refreshed. Since a read disturb caused by the read operation of the sub blocks of the memory block BLKi_1 is compensated, the reliability of the nonvolatile memory device 100 and the reliability of the memory system 1000 including the same may be improved.

In the foregoing example embodiments, it has been described that 1 bit or 2 bits is(are) stored in each memory cell MC. However, it is not limited that each memory cell MC store 1 bit or 2 bits. Each of the memory cells MC may store at least 3 bits.

In the foregoing example embodiments, it has been described that the memory block BLKi_1 includes the first and second sub blocks. However, it is not limited that the memory block BLKi_1 includes two sub blocks. For example, the memory block BLKi_1 may include three or more sub blocks. When a plurality of sub blocks are provided, the memory block BLKi_1 includes at least one dummy word line DWL and the dummy memory cell DMC disposed between the sub blocks.

Figure 21:
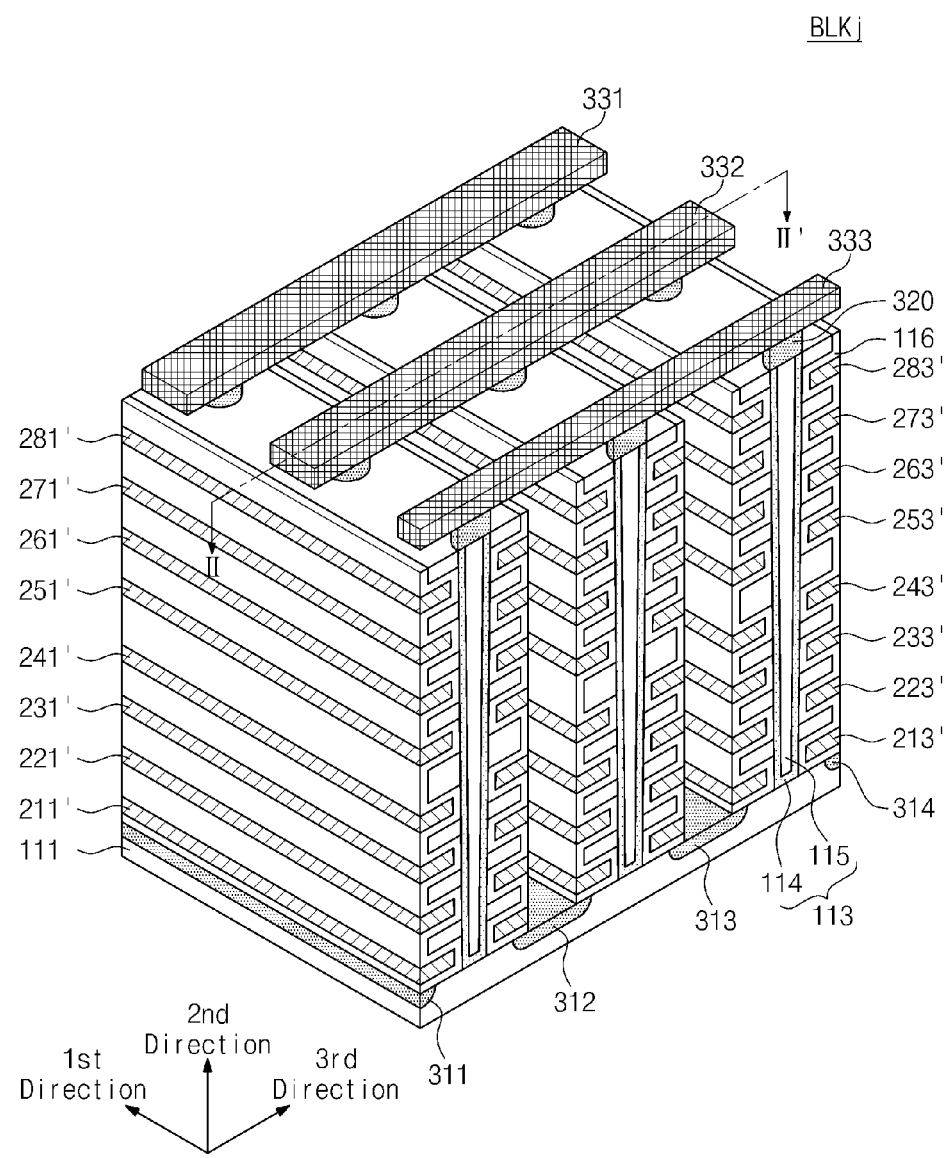
FIG. 21 is a perspective view illustrating one of the memory blocks BLK1 to BLKz of FIG. 3 according to an example embodiments of inventive concepts.
Figure 22:
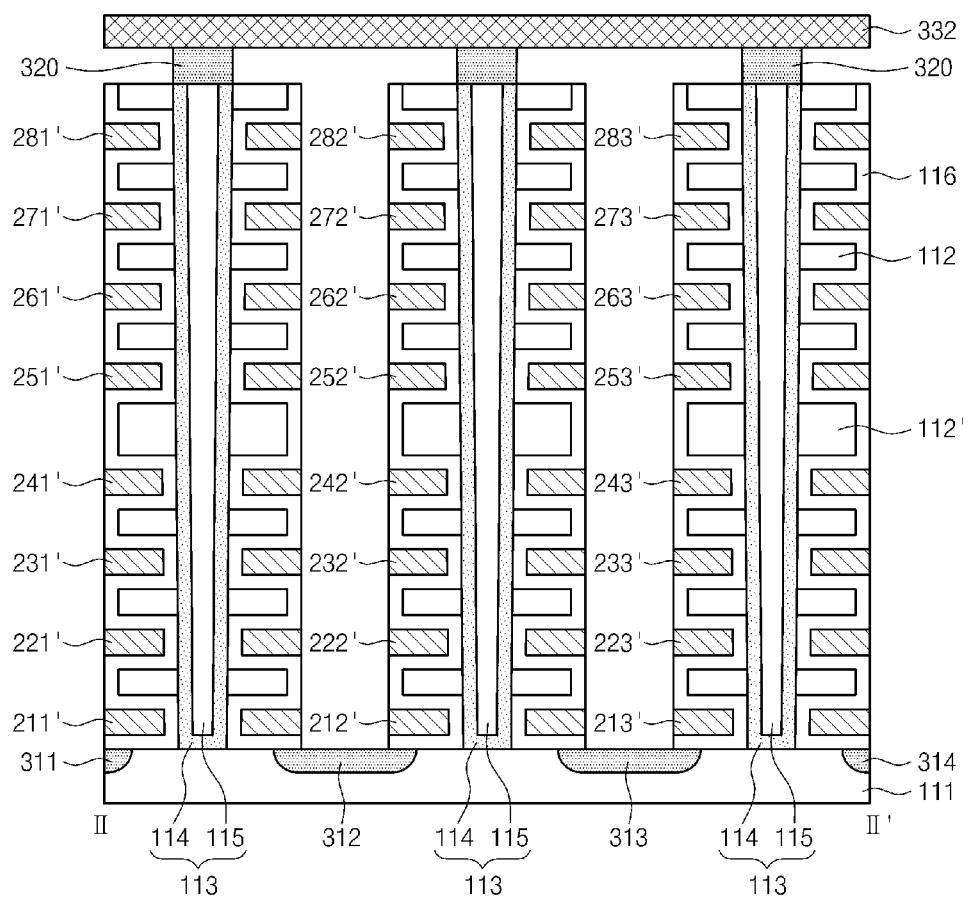
FIG. 22 is a sectional view taken along the line II-IF of the memory block BLKj of FIG. 21.

FIG. 21 is a perspective view illustrating one of the memory blocks BLK1 to BLKz of FIG. 3 according to example embodiments of inventive concepts. FIG. 22 is a sectional view taken along the line II-II' of the memory block BLKj of FIG. 21.

Compared to the memory block BLKi described with reference to FIGS. 4 through 6, provided are first conductive materials 211' to 281', 212' to 282', and 213' to 283' corresponding to first to eight heights, respectively. Insulation materials 112' having greater thicknesses than insulation materials 112 are provided between the first conductive materials 241', 242', and 243' having the fourth height and the first conductive materials 251', 252', and 253' having the fifth height.

Figure 23:
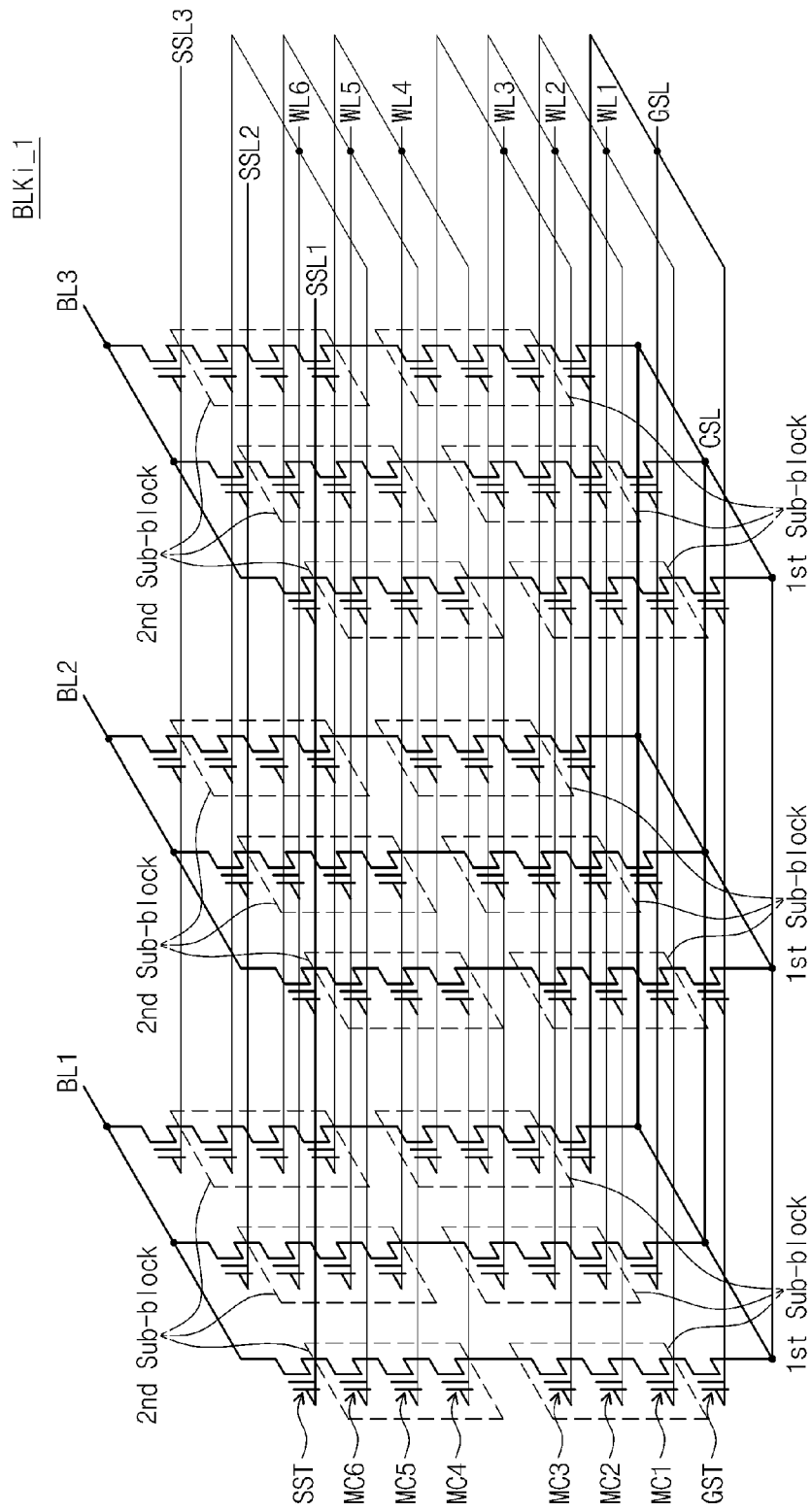
FIG. 23 is an example circuit diagram illustrating an equivalent circuit of the memory block BLKj described with reference to FIGS. 21 and 22.

FIG. 23 is a circuit diagram illustrating an equivalent circuit of the memory block BLKj described with reference to FIGS. 21 and 22. Referring to FIGS. 21 through 23, the conductive materials 211', 212', and 213' having the first height are commonly connected to form a ground selection line GSL.

The first conductive materials 221' to 271', 222' to 272', and 223' to 273' corresponding to the respectively second to seventh heights form first to sixth word lines WL1 to WL6. The first conductive materials 281', 282', and 283' having the eighth height form first to third string selection lines SSL1, SSL2, and SSL3.

Except for a change of the height, the first conductive materials 211' to 281', 212' to 282', and 213' to 283' form a ground selection line GSL, word lines WL1 to WL6, and string selection lines SSL1, SSL2, and SSL3, as described with reference to FIGS. 4 through 4 through 6. Accordingly, their detailed description is omitted.

The first to third memory cells MC 1 to MC3 form a first sub block and the fourth to sixth memory cells MC4 to MC6 form a second sub block.

FIG. 24 is a table illustrating voltage conditions applied to the memory block BLKj_1 of FIG. 23 during an erase operation. Referring to FIGS. 23 and 24, string selection lines SSL1 to SSL3 float during an erase operation. Word lines WL of an unselected sub block float. A word line erase voltage Vwe is applied to word lines WL of a selected sub block. Then, an erase voltage Vers is applied to a substrate 111.

For example, it is assumed that a first sub block is selected. During an erase operation, a word line erase voltage Vwe may be applied to word lines WL1 to WL3 of a selected first sub block. Also, during an erase operation, word lines WL4 to WL6 of an unselected second sub block may float.

Figure 25:
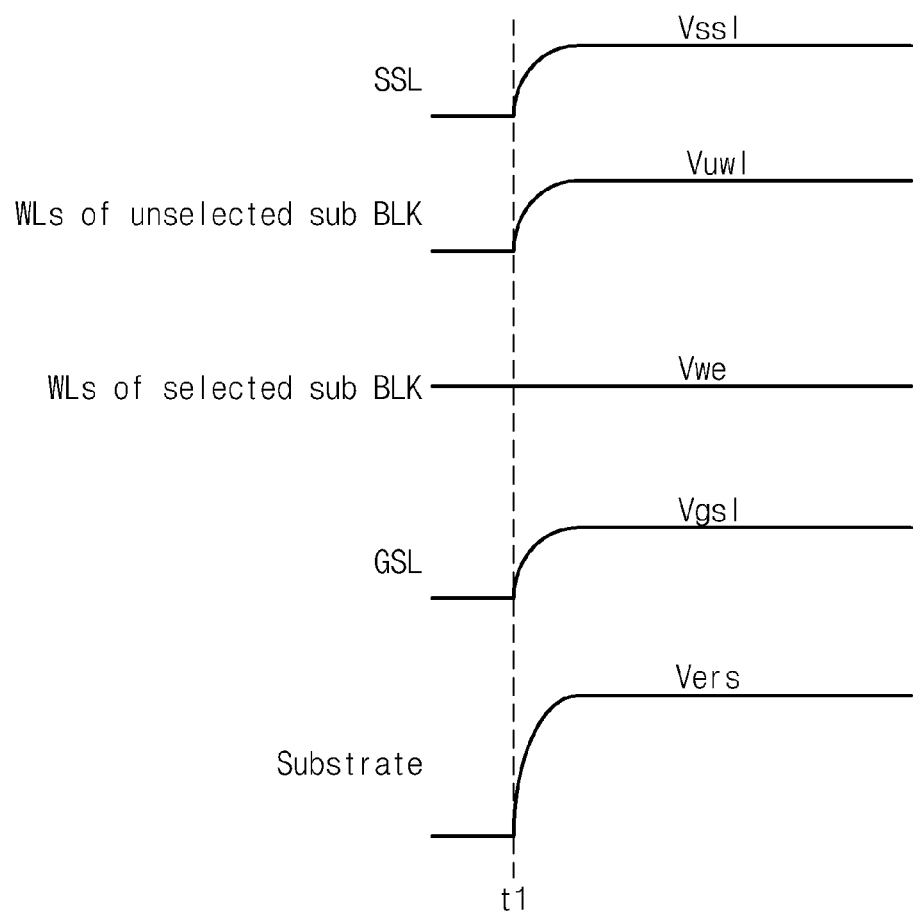
FIG. 25 is an example timing diagram illustrating a voltage change of the memory block BLKj_1 of FIG. 23 according to a voltage condition of FIG. 24.
Figure 26:
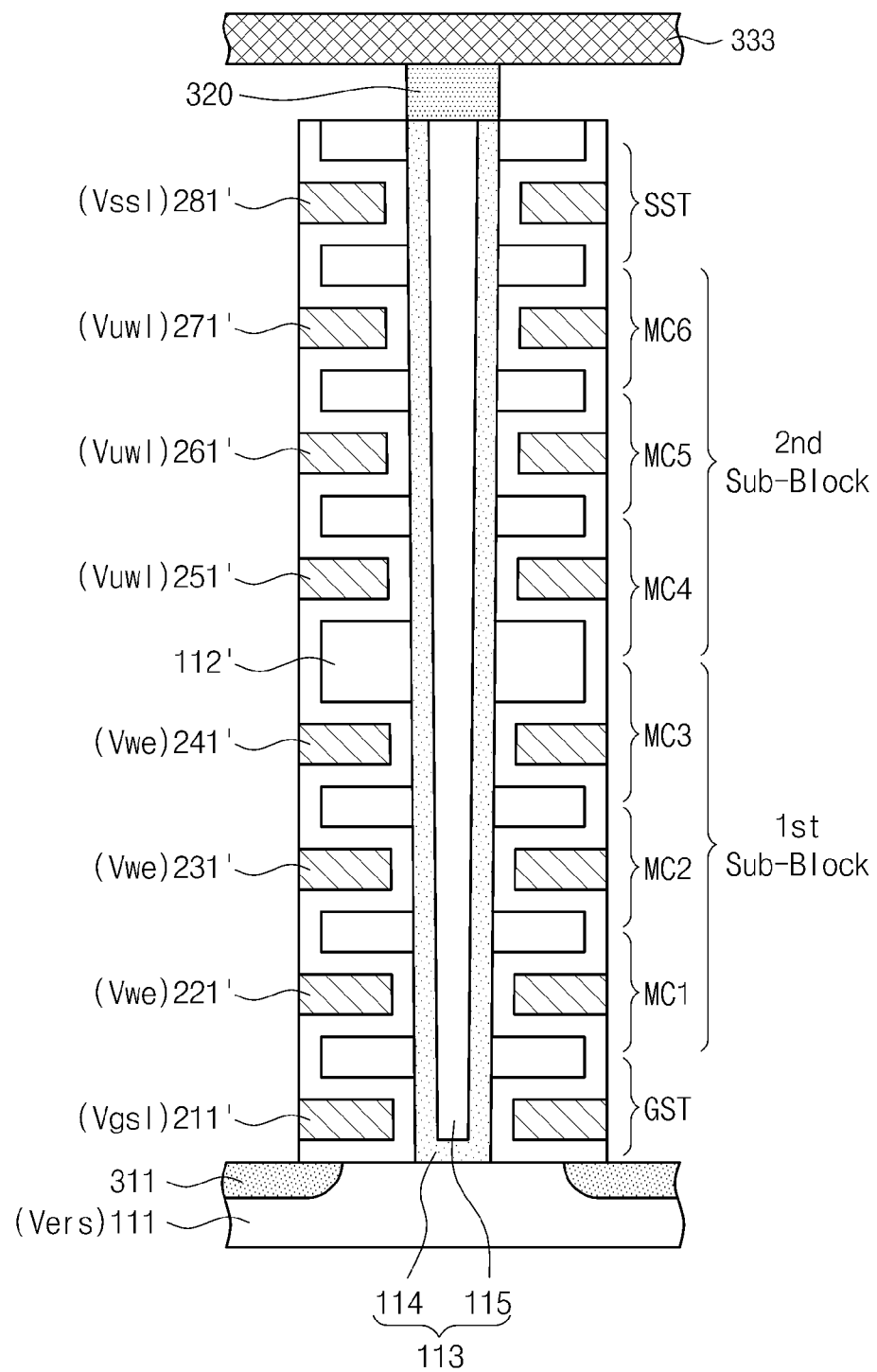
FIG. 26 is an example sectional view illustrating one NAND string of the memory block BLKj_1.

FIG. 25 is a timing diagram illustrating a voltage change of the memory block BLKj_1 of FIG. 23 according to a voltage condition of FIG. 24. FIG. 26 is a sectional view illustrating one NAND string of the memory block BLKj_1. Hereinafter, with reference to a section of one NAND string NS shown in FIG. 26, an erase operation of the memory block BLKj_1 is described. For example, it is assumed that a first sub block is erased and a second sub block is erase-inhibited.

Referring to FIGS. 23 through 26, an erase voltage Vers is applied to a substrate 111 at a first timing t1. For example, the erase voltage Vers is a high voltage.

The substrate 111 is doped with the same type as a surface layer 114 operating as a body of the second direction. Accordingly, the erase voltage Vers is delivered to the surface layer 114 of a NAND string NS.

As described with reference to FIGS. 9 through 11, at the first timing t1, a ground selection line GSL floats. Accordingly, a ground selection transistor GST may be erase-inhibited.

At the first timing t1, a word line erase voltage Vwe is applied to selected word lines. Accordingly, first to third memory cells MC1 to MC3 of the selected first sub block may be erased.

At the first timing t1, unselected word lines float. Accordingly, fourth to sixth memory cells MC4 to MC6 of an unselected second sub block may be erase-inhibited.

At the first timing t1, a string selection line SSL floats. Accordingly, a string selection transistor SST may be erase-inhibited.

In addition, when a word line erase voltage Vwe is applied to word lines (e.g., WL1 to WL3) of a selected sub block, a voltage of word lines (e.g., WL4 to WL6) of a unselected sub block rises to an unselected word line voltage Vuw1 by coupling. At this point, the word lines WL4 to WL6 of the unselected sub block may be affected by coupling from a word line erase voltage Vwe applied to the word lines WL1 to WL3 of a selected sub block. That is, due to the coupling from the word lines WL1 to WL3 of the selected sub block, a voltage rise width of the word lines WL4 to WL6 of an unselected sub block may be deteriorated. Moreover, a voltage of the word lines WL1 to WL3 of a selected sub block may rise by the coupling from the word lines WL1 to WL3 of the selected sub block.

Between the first sub block and the second sub block, an insulation material 112' is provided. A thickness of the insulation material 112' between the first and second sub blocks is greater than that of the insulation materials 112 between word lines WL in each sub block. That is, when it is assumed that a distance according to the second direction between memory cells MC in each sub block is a first distance, memory cells provided at an interface of sub blocks adjacent along a direction (i.e., the second direction) intersecting (for example, perpendicular to) a substrate are spaced apart from each other by a longer second distance than the first distance along the second direction and then are provided. In example embodiments, the insulation material 112' acts as a separator to separate the first sub block from the second sub block As the second distance is increased, influence of the coupling between sub blocks may be reduced. Therefore, this prevents a voltage rise width of the word lines WL4 to WL6 of an unselected sub block from being deteriorated. Moreover, this prevents a voltage of the word lines WL1 to WL3 of a selected sub block from rising. Additionally, as the second distance is increased, electric fields between sub blocks are distributed. Accordingly, hot carrier occurrence is prevented by electric fields between the word lines WL1 to WL3 of a selected sub block and the word lines WL4 to WL6 of an unselected sub block.

As mentioned above, the nonvolatile memory device 100 of FIGS. 1 and 2 according to example embodiments of inventive concepts performs an erase operation by a sub block unit. Accordingly, an operating speed of the nonvolatile memory device 100 may be improved. Additionally, an operating speed of a memory system 1000 including the nonvolatile memory device 100 may be improved.

As mentioned above, in the memory block BLKj_1 of the nonvolatile memory device 1000 according to example embodiments of inventive concepts, a thickness of an insulation material 112' between sub blocks is greater than that of an insulation material in each sub block. Therefore, the nonvolatile memory device 100 and the memory system 1000 including the nonvolatile memory device 100 become more reliable.

In the above-mentioned example embodiments, it is described that an erase voltage Vers and a word line erase voltage Vwe are applied at the first timing. However, the erase voltage Vers and the word line erase voltage Vwe may be sequentially applied according to a predetermined or desired order.

In the above-mentioned example embodiments, it is described that unselected word lines (e.g., WL4 to WL6) float. However, as shown in FIGS. 13 through 15, a word line erase-inhibit voltage Vwei may be applied to unselected word lines (e.g., WL4 to WL6).

Figure 27:
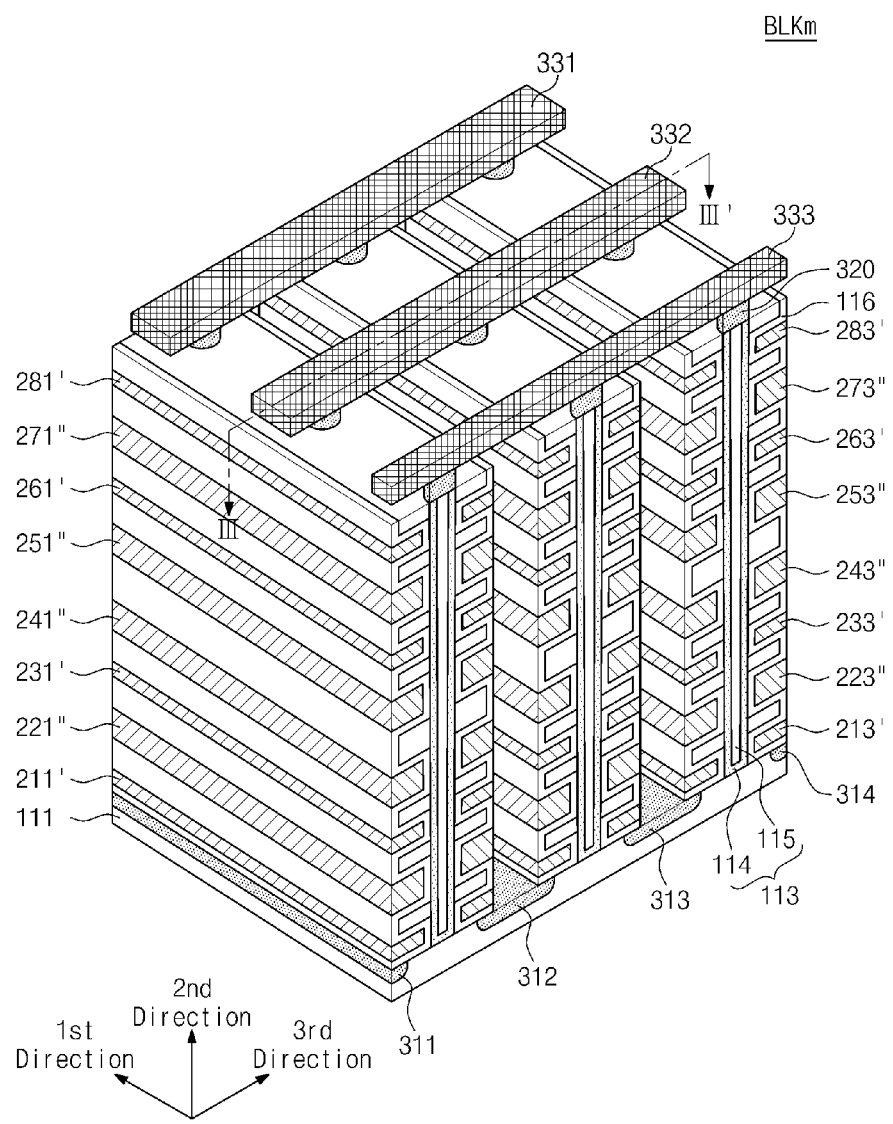
FIG. 27 is a perspective view illustrating one among the memory blocks BLK1 to BLKz of FIG. 3 according to example embodiments of inventive concepts.
Figure 28:
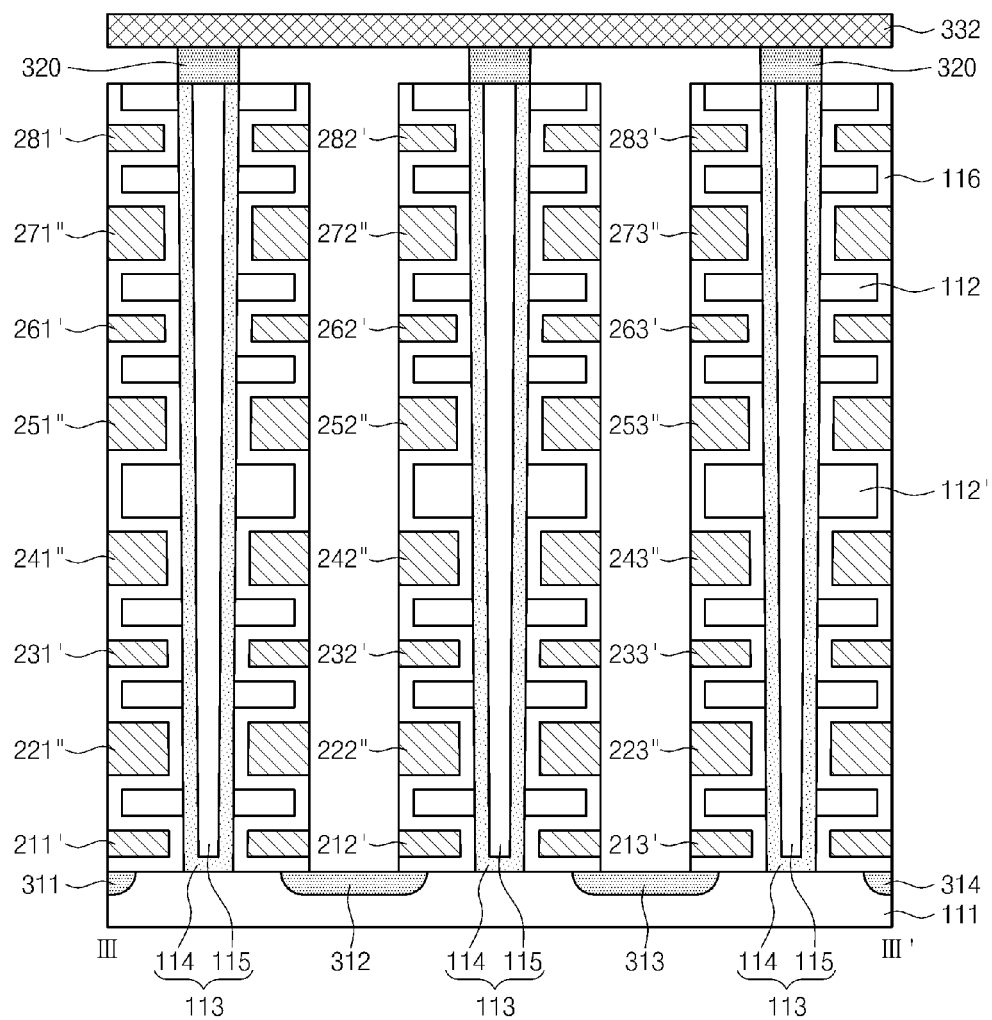
FIG. 28 is a sectional view taken along the line III-III' of the memory block BLKm of FIG. 27.

FIG. 27 is a perspective view illustrating one among the memory blocks BLK1 to BLKz of FIG. 3 according to example embodiments of inventive concepts. FIG. 28 is a sectional view taken along the line III-III' of the memory block BLKm of FIG. 27.

Compared to the memory block BLKj described with reference to FIGS. 21 through 26, the first conductive materials 221", 222", and 223" having the second height and the first conductive materials 241", 242", and 243" having the fourth height in the first sub block have greater thicknesses than the remaining first conductive materials. Moreover, the first conductive materials 251", 252", and 253" having the fifth height and the first conductive materials 271", 272", and 273" having the seventh height in the second sub block have greater thicknesses than the remaining first conductive materials.

An equivalent circuit of the memory block BLKm is the same as the equivalent circuit BLKj_1 shown in FIG. 23. Voltage conditions applied to the memory block BLKm during an erase operation are the same as those shown in FIG. 24. Additionally, a voltage change of the memory block BLKm during an erase operation is the same as that shown in FIG. 25.

Figure 29:
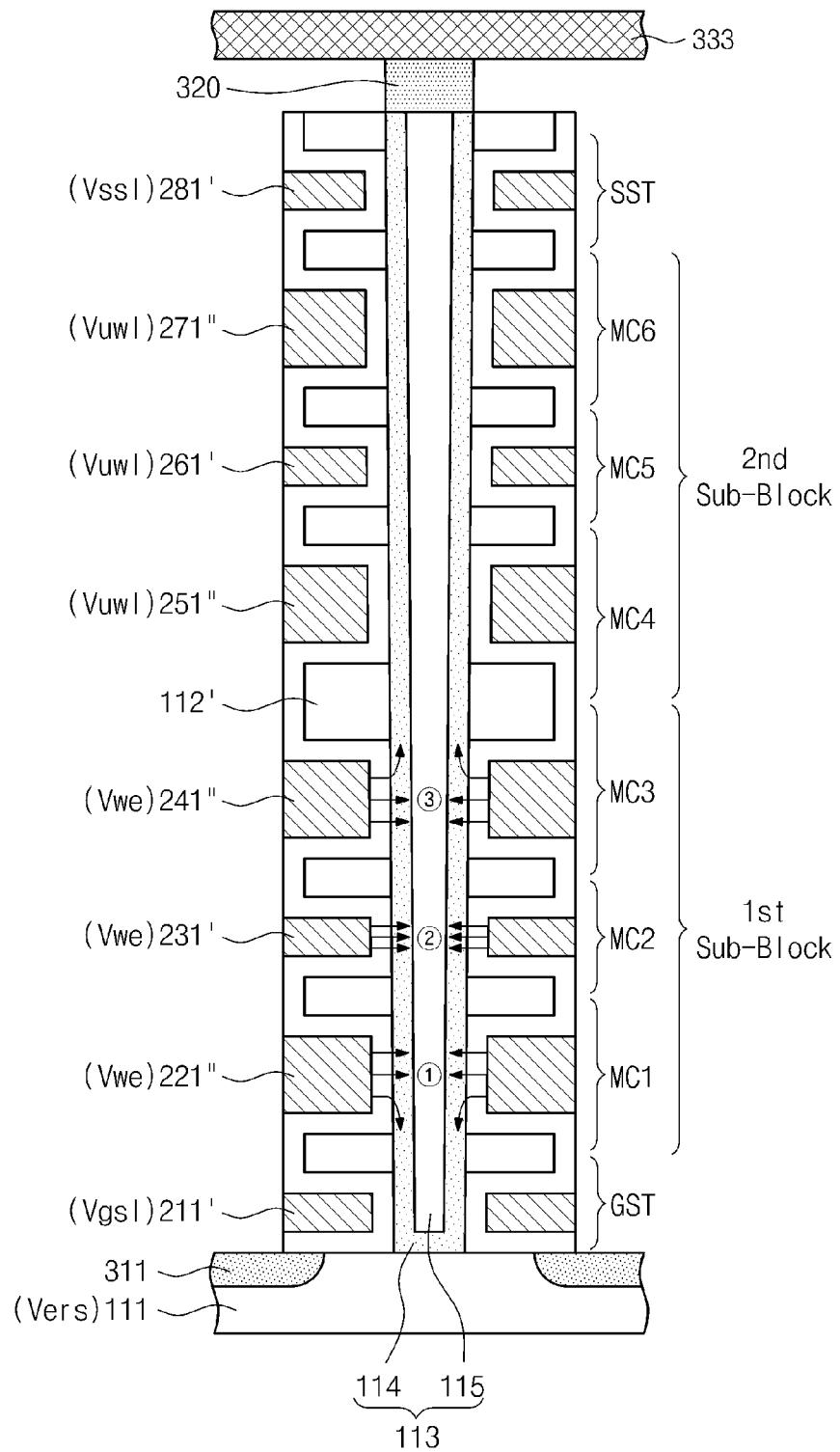
FIG. 29 is a sectional view illustrating one NAND string NS of the memory block BLKm.

FIG. 29 is a sectional view illustrating one NAND string NS of the memory block BLKm. Hereinafter, an erase operation of the memory block BLKm is described with reference to FIGS. 24, 25, and 29. For example, it is assumed that a first sub block is erased and a second sub block is erase-inhibited.

During an erase operation, a word line erase voltage Vwe is applied to first to third word lines connected to first to third memory cells MC1 to MC3. An erase voltage Vers is applied to a surface layer 114 operating as a body of the second direction. The first to third memory cells MC 1 to MC3 are erased by electric fields formed between the first to third memory cells MC1 to MC3 and the surface layer 114.

The third memory cell MC3 is provided at the top of the second memory cell MC2 and the first memory cell MC1 is provided at the bottom of the second memory cell MC2. According to influence of electric fields and generated between the first to third memory cells MC1 to MC3 and the surface layer 114, an electric field generated between the second memory cell MC2 and the surface layer 114 is concentrated.

In addition, a ground selection transistor GST in a floating state is provided at the bottom of the first memory cell MC1. Accordingly, the electric field between the first memory cells MC1 and the surface layer 114 is distributed in a direction of the ground selection transistor GST. Therefore, erase efficiency of the first memory cell MC1 may be lower than that of the second memory cell MC2.

A fourth memory cell MC4 in a floating state is provided at the top of the third memory cell MC3. Accordingly, the electric field between the third memory cells MC3 and the surface layer 114 is distributed in a direction of the fourth memory cell MC4. Therefore, erase efficiency of the third memory cell MC3 may be lower than that of the second memory cell MC2.

According to example embodiments of inventive concepts, each of the first and last memory cells MC1 and MC3 has a first size and the remaining memory cell MC2 has a smaller second size than the first size, along a direction intersecting (for example, perpendicular to) a substrate 111 in each sub block. For example, the memory cells MC1 and MC3 provided at the outline of each sub block have a greater thickness than the memory cell MC2 provided within each sub block.

If the thickness of the first conductive material 221" having the second height is increased, a coupling ratio between the first conductive material 221" having the second height and the surface layer 114 is increased. Therefore, erase efficiency of the first memory cell MC1 may be improved.

Likewise, if the thickness of the first conductive material 241" having the fourth height is increased, a coupling ratio between the first conductive material 241" having the fourth height and the surface layer 114 is increased. Therefore, erase efficiency of the third memory cell MC3 may be improved.

Likewise, in the second sub block, the first and last memory cells MC4 and MC6 has a first size along a direction intersecting (for example, perpendicular to) the substrate 111 and the remaining memory cells MC5 has a smaller second size than the first size. Therefore, erase efficiency of the fourth and sixth memory cells MC4 and MC6 may be improved.

That is, by increasing the sizes of the memory cells MC1 and MC 3 provided at the end of each sub block, erase speeds of the memory cells MC1, MC2, and MC3 in each sub block are equalized. Therefore, since threshold voltage distribution of an erase state of the memory cells MC1, MC2, and MC3 is reduced, the nonvolatile memory device 100 and the memory system 1000 including the same become more reliable.

Figure 30:
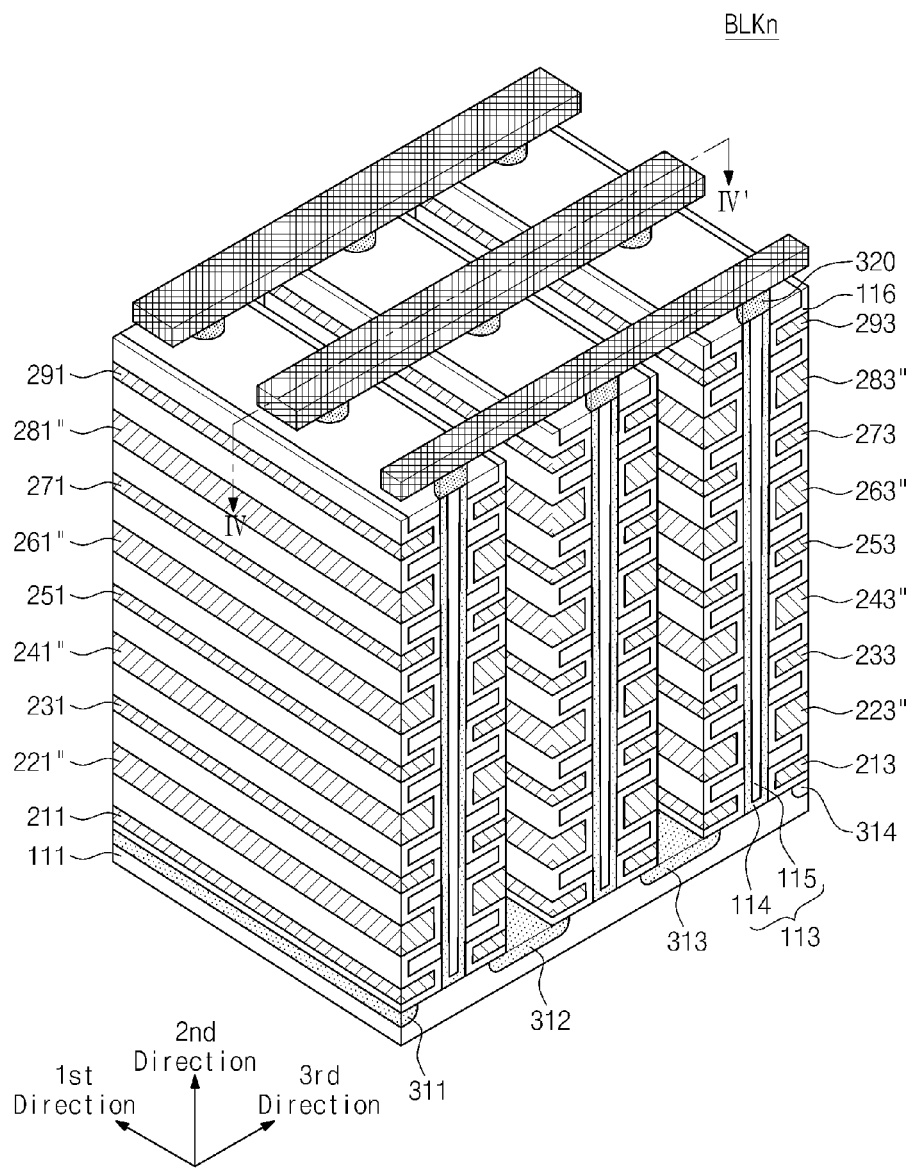
FIG. 30 is a perspective view illustrating one among the memory blocks BLK1 to BLKz of FIG. 3 according to example embodiments of inventive concepts.
Figure 31:
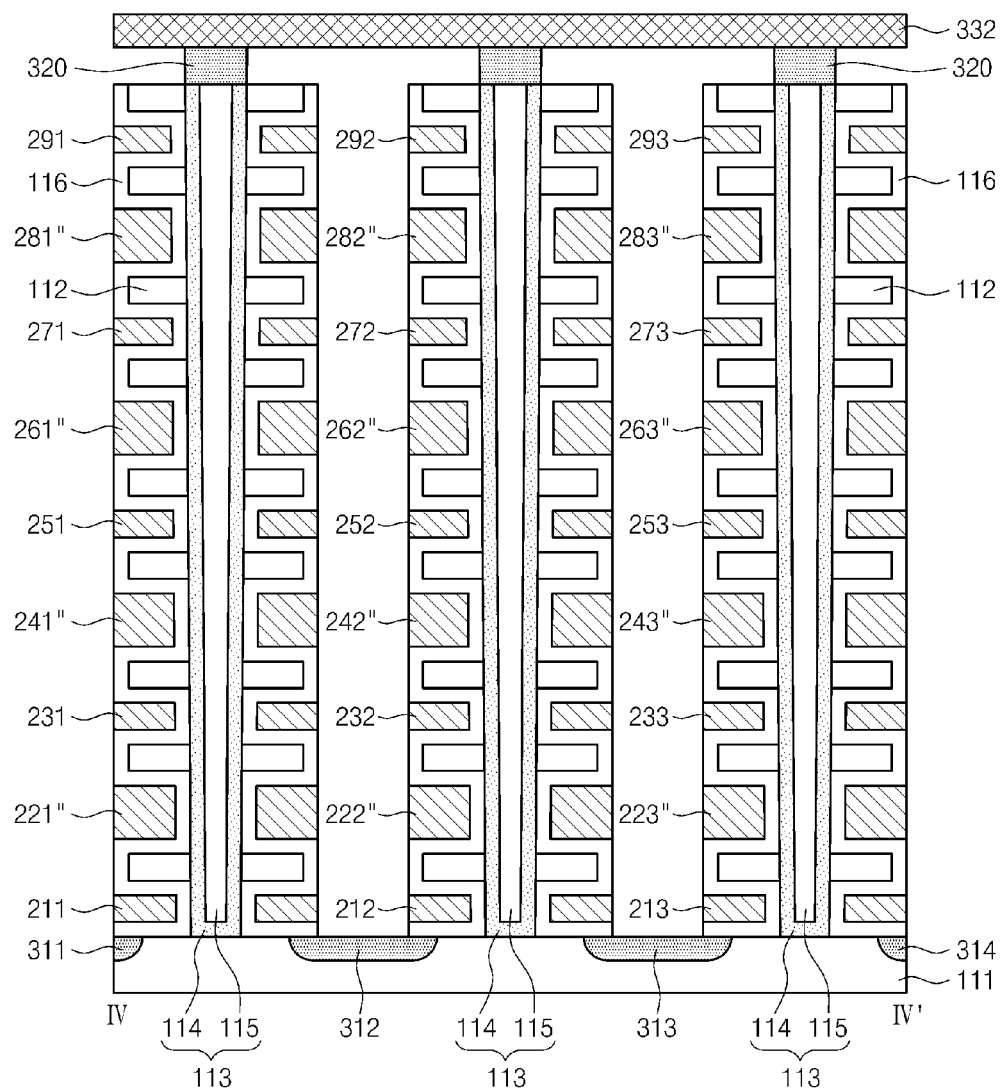
FIG. 31 is a sectional view taken along the line IV-IV' of the memory block BLKn of FIG. 30.

FIG. 30 is a perspective view illustrating one among the memory blocks BLK1 to BLKz of FIG. 3 according to example embodiments of inventive concepts. FIG. 31 is a sectional view taken along the line IV-IV' of the memory block BLKn of FIG. 30. Compared to the memory block BLKi described with reference to FIGS. 4 through 6, the first conductive materials 221", 222", and 223" having the second height and the first conductive materials 241", 242", and 243" having the fourth height in the first sub block of the memory block BLKn have greater thicknesses than the remaining first conductive materials. Moreover, the first conductive materials 251", 252", and 253" having the fifth height and the first conductive materials 271", 272", and 273" having the seventh height in the second sub block have greater thicknesses than the remaining first conductive materials.

An equivalent circuit of the memory block BLKn is the same as the equivalent circuit BLKj_1 shown in FIG. 8. Voltage conditions applied to the memory block BLKn during an erase operation are the same as those shown in FIG. 9 or 13. Additionally, a voltage change of the memory block BLKn during an erase operation is the same as that shown in FIG. 10 or 14.

As described with reference to FIGS. 27 through 29, each of the first and last memory cells MC1 and MC3 has a first size and the remaining memory cell MC2 has a smaller second size than the first size, along a direction intersecting (for example, perpendicular to) a substrate 111 in each sub block. For example, the memory cells MC1 and MC3 provided at the outline of each sub block have a greater thickness than the memory cell MC2 provided inside each sub block.

If the thickness of the first conductive material 221" having the second height is increased, a coupling ratio between the first conductive material 221" having the second height and the surface layer 114 is increased. Therefore, erase efficiency of the first memory cell MC1 may be improved.

Likewise, if the thickness of the first conductive material 241" having the fourth height is increased, a coupling ratio between the first conductive material 241" having the fourth height and the surface layer 114 is increased. Therefore, erase efficiency of the third memory cell MC3 may be improved.

That is, by increasing the sizes of the memory cells MC1 and MC 3 provided at the end of each sub block, erase speeds of the memory cells MC1, MC2, and MC3 in each sub block are equalized. Therefore, since threshold voltage distribution of an erase state of the memory cells MC1, MC2, and MC3 is reduced, the nonvolatile memory device 100 and the memory system 1000 including the same may become more reliable.

Figure 32:
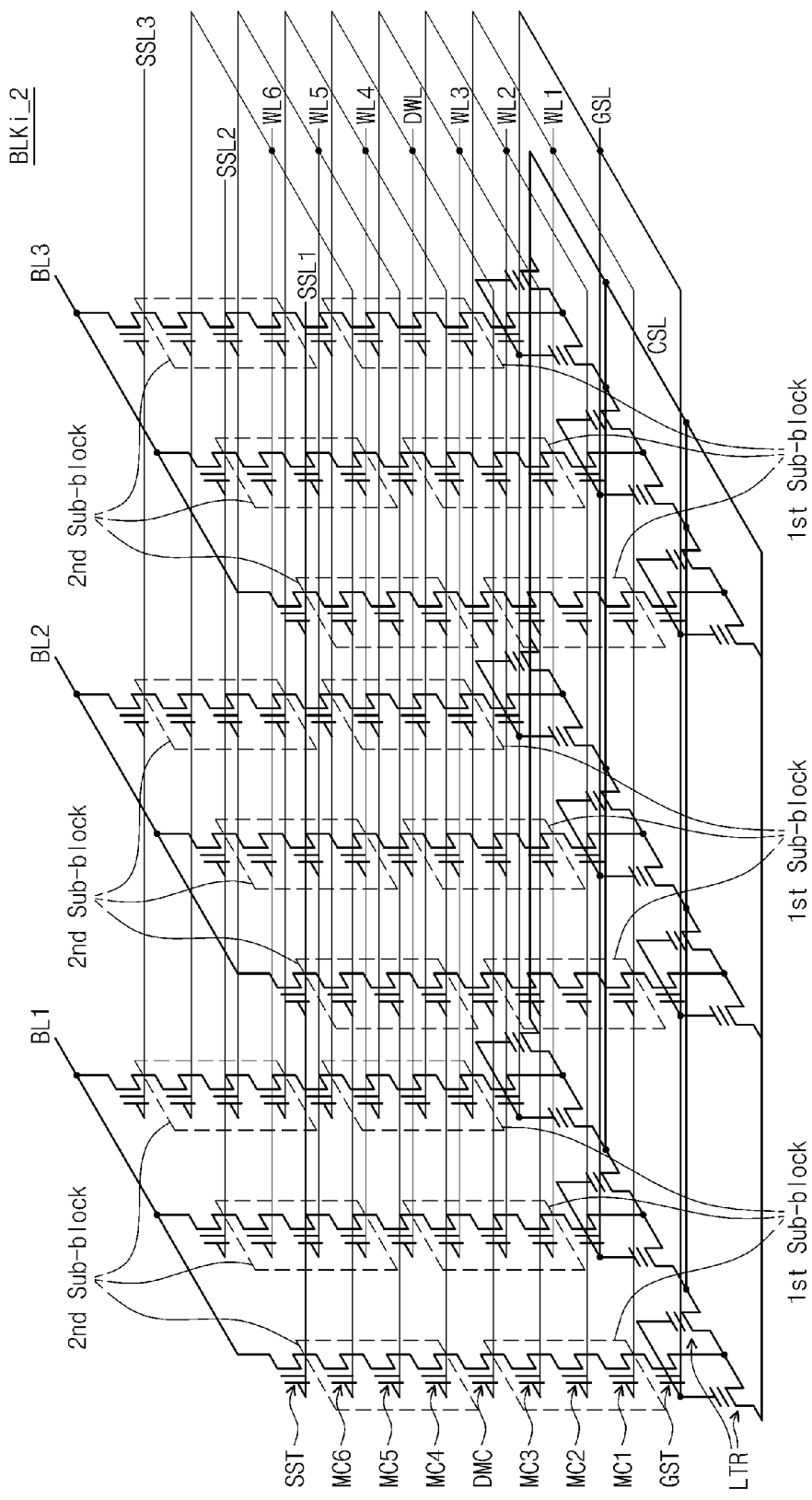
FIG. 32 is a circuit diagram illustrating an equivalent circuit BLKi_2 of the memory block BLKi described with reference to FIGS. 4 and 6 according to example embodiments of inventive concepts.

FIG. 32 is a circuit diagram illustrating an equivalent circuit BLKi_2 of the memory block BLKi described with reference to FIGS. 4 and 6 according to example embodiments of inventive concepts. Compared to the equivalent circuit described with reference to FIG. 8, a lateral transistor LTR is additionally provided at each NAND string NS of the memory block BLKi_2.

In each NAND string NS, the lateral transistor LTR is connected between a ground selection transistor GST and a common source line CSL. A gate (or a control gate) of the lateral transistor LTR and a gate (or control gate) of the ground selection transistor GST are connected to the ground selection line GSL.

As described with reference to FIGS. 4 through 7, the first conductive materials 211, 212, and 213 having the first height correspond to first to third ground selection lines GSL1 to GSL3, respectively.

Once a specific voltage is applied to the first conductive materials 211, 212, and 213 having the first height, a channel is formed in a region of the surface layer 114 adjacent to the first conductive materials 211, 212, and 213. Moreover, if a specific voltage is applied to the first conductive materials 211, 212, and 213, a channel is formed in a region of the substrate 111 adjacent to the first conductive materials 211, 212, and 213.

A first doping region 311 is connected to a channel in the substrate 111, which is formed by a voltage of the first conductive material. The channel of the substrate 111 generated by a voltage of the first conductive material 211 is connected to a channel formed by voltage of the first conductive material 211 in the surface layer 114 operating as a body of the second direction.

Likewise, a channel is formed in the substrate 111 by a voltage of the first conductive materials 211, 212, and 213. First to fourth doping regions 311 to 314 are respectively connected to the surface layers 114 operating as a body of the second direction through a channel formed by a voltage of the first conductive materials 211, 212, and 213 in the substrate 111.

As described with reference to FIGS. 4 through 7, the first to fourth doping regions 311 to 314 are commonly connected to form a common source line CSL. The common source line CSL and the channels of the memory cells MC1 to MC6 are electrically connected through channels perpendicular and parallel to the substrate 111, which are formed by a voltage of the ground selection line GSL.

That is, it is understood that transistors perpendicular and parallel to a substrate, driven by the ground selection line GSL, are provided between the common source line CSL and the first memory cells MC1. A transistor perpendicular to a substrate may be understood as a ground selection transistor GST and a transistor parallel to a substrate may be understood as a lateral transistor LST.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 30 and 31, dummy memory cells DMC are provided, and along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 18 through 20, while a read operation is performed on a selected sub block among sub blocks of the memory block BLKi_2, each sub block of the memory block BLKi_2 is selectively refreshed. For example, after data are written on a specific sub block of the memory block BLKi_2, when the number of reading operations on sub blocks of the memory block BLKi_2 reaches a reference value, a specific sub block is refreshed.

Figure 33:
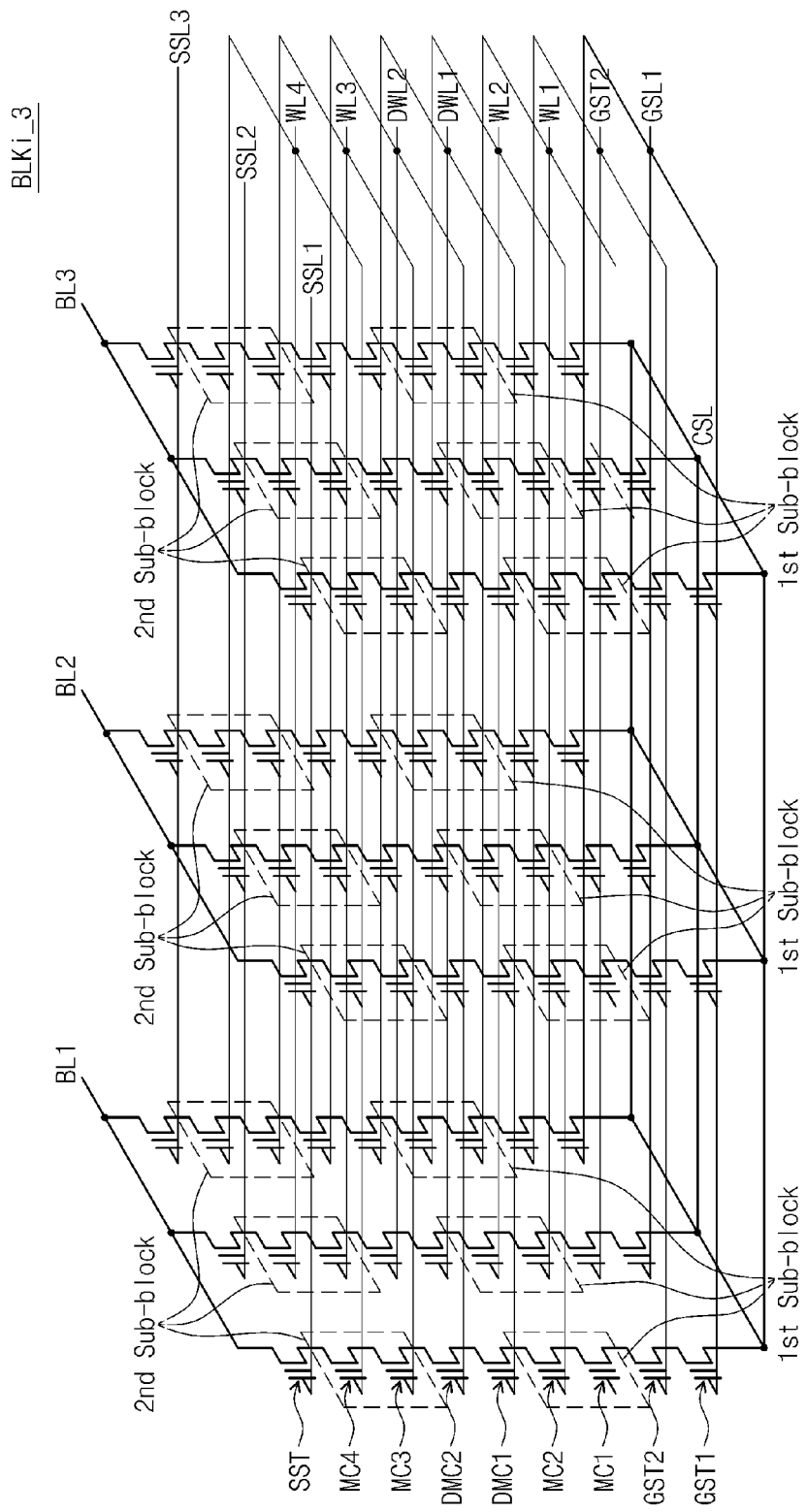
FIG. 33 is a circuit diagram illustrating an equivalent circuit BLKi_3 of the memory block BLKi described with reference to FIGS. 4 and 6 according to example embodiments of inventive concepts.

FIG. 33 is a circuit diagram illustrating an equivalent circuit BLKi_3 of the memory block BLKi described with reference to FIGS. 4 and 6 according to example embodiments of inventive concepts. Compared to the equivalent circuit described with reference to FIG. 8, two ground selection transistors GST1 and GST2 may be provided between the memory cells MC1 to MC4 and the common source line CSL in each NAND string NS. The ground selection lines GSL1 and GSL2 corresponding to the ground selection transistor GST1 or GST2 having the same height may be commonly connected. Moreover, the ground selection lines GSL1 and GSL2 corresponding to the same NAND string NS may be commonly connected.

For example, in order to equalize the number of memory cells of the first and second sub blocks, the number of dummy word lines DWL1 and DWL2 and dummy memory cells DMC1 and DMC2 is adjusted. The number of the memory cells MC1 and MC2 of the first sub block and the memory cells MC3 and MC4 of the second sub block is not limited to FIG. 33.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 30 and 31, the dummy memory cells DMC1 and DMC2 are provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 18 through 20, while a read operation is performed on a selected sub block among sub blocks of the memory block BLKi_3, each sub block of the memory block BLKi_3 is selectively refreshed. For example, after data are written on a specific sub block of the memory block BLKi_3, when the number of reading operations on sub blocks of the memory block BLKi_3 reaches a reference value, a specific sub block is refreshed.

Figure 34:
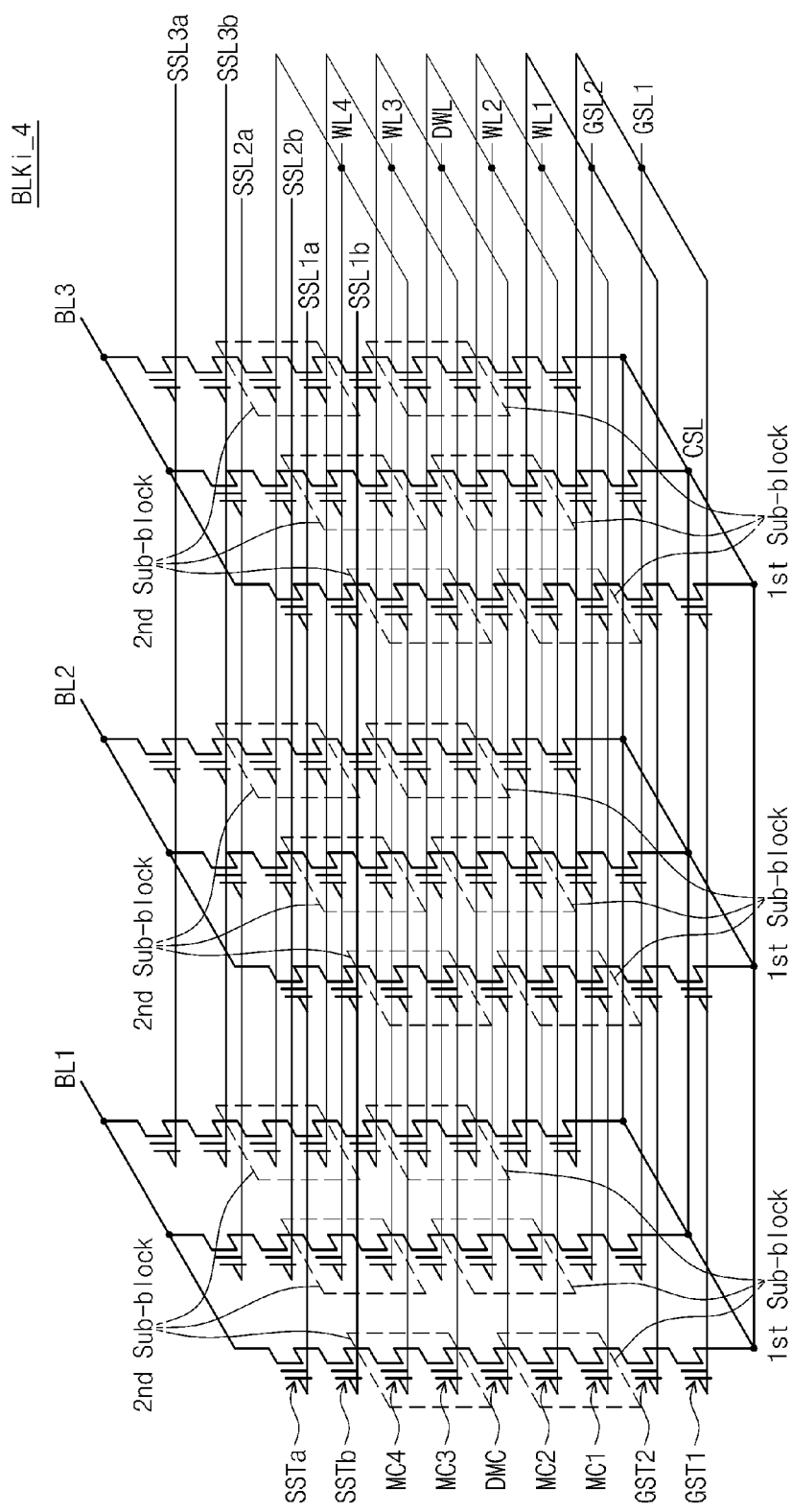
FIG. 34 is a circuit diagram illustrating an equivalent circuit BLKi_4 of the memory block BLKi described with reference to FIGS. 4 and 6 according to example embodiments of inventive concepts.

FIG. 34 is a circuit diagram illustrating an equivalent circuit BLKi_4 of the memory block BLKi described with reference to FIGS. 4 and 6 according to example embodiments of inventive concepts. Compared to the memory block BLKi_3 of FIG. 33, two string selection transistors SSTa and SSTb may be provided between the memory cells MC1 to MC4 and the bit line BL.

In NAND strings in the same row, the string selection transistor SSTa or SSTb having the same height may share one string selection line SSL. For example, in the NAND strings NS11 to NS13 of a first row, the a string selection transistors SSTa share a 1a string selection line SSL1a. The b string selection transistors SSTb share a 1b string selection line SSL1b.

In NAND strings NS21 to NS23 in the second row, the a string selection transistors SSTa share a 2a string selection line SSL2a. The b string selection transistors SSTb share a 2b string selection line SSL2b.

In NAND strings NS21 to NS23 in the third row, the a string selection transistors SSTa share a 3a string selection line SSL3a. The b string selection transistors SSTb share a 3b string selection line SSL3b.

As mentioned with reference to FIG. 33, the number of dummy word lines DWL and dummy memory cells DMC provided between sub blocks, the number of memory cells MC1 and MC2 of the first sub block, and the number of the memory cells MC3 and MC4 of the second sub block are not limited.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 30 and 31, the dummy memory cells DMC1 and DMC2 are provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 18 through 20, while a read operation is performed on a selected sub block among sub blocks of the memory block BLKi_4, each sub block of the memory block BLKi_4 is selectively refreshed. For example, after data are written on a specific sub block of the memory block BLKi_4, when the number of reading operations on sub blocks of the memory block BLKi_4 reaches a reference value, a specific sub block is refreshed.

Figure 35:
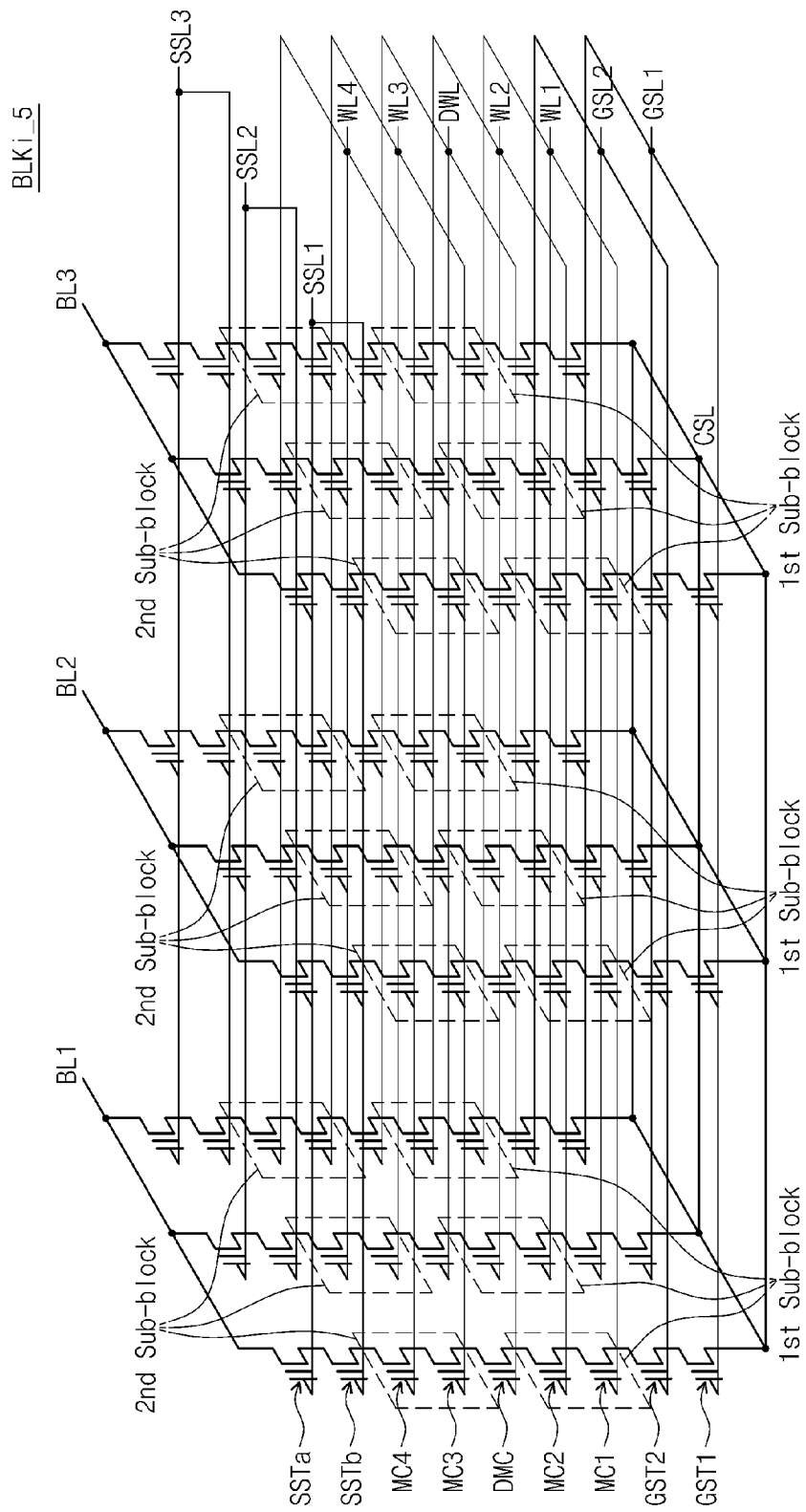
FIG. 35 is a circuit diagram illustrating an equivalent circuit BLKi_5 of the memory block BLKi described with reference to FIGS. 4 and 6 according to example embodiments of inventive concepts.

FIG. 35 is a circuit diagram illustrating an equivalent circuit BLKi_5 of the memory block BLKi described with reference to FIGS. 4 and 6 according to example embodiments of inventive concepts. Compared to the memory block BLKi_4 of FIG. 34, string selection lines SSL corresponding to the NAND strings NS of the same row are commonly connected.

As mentioned with reference to FIG. 33, the number of dummy word lines DWL and dummy memory cells DMC provided between sub blocks, the number of memory cells MC1 and MC2 of the first sub block, and the number of the memory cells MC3 and MC4 of the second sub block are not limited.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 30 and 31, the dummy memory cells DMC1 and DMC2 are provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 18 through 20, while a read operation is performed on a selected sub block among sub blocks of the memory block BLKi_5, each sub block of the memory block BLKi_5 is selectively refreshed. For example, after data are written on a specific sub block of the memory block BLKi_5, when the number of reading operations on sub blocks of the memory block BLKi_5 reaches a reference value, a specific sub block is refreshed.

Figure 36:
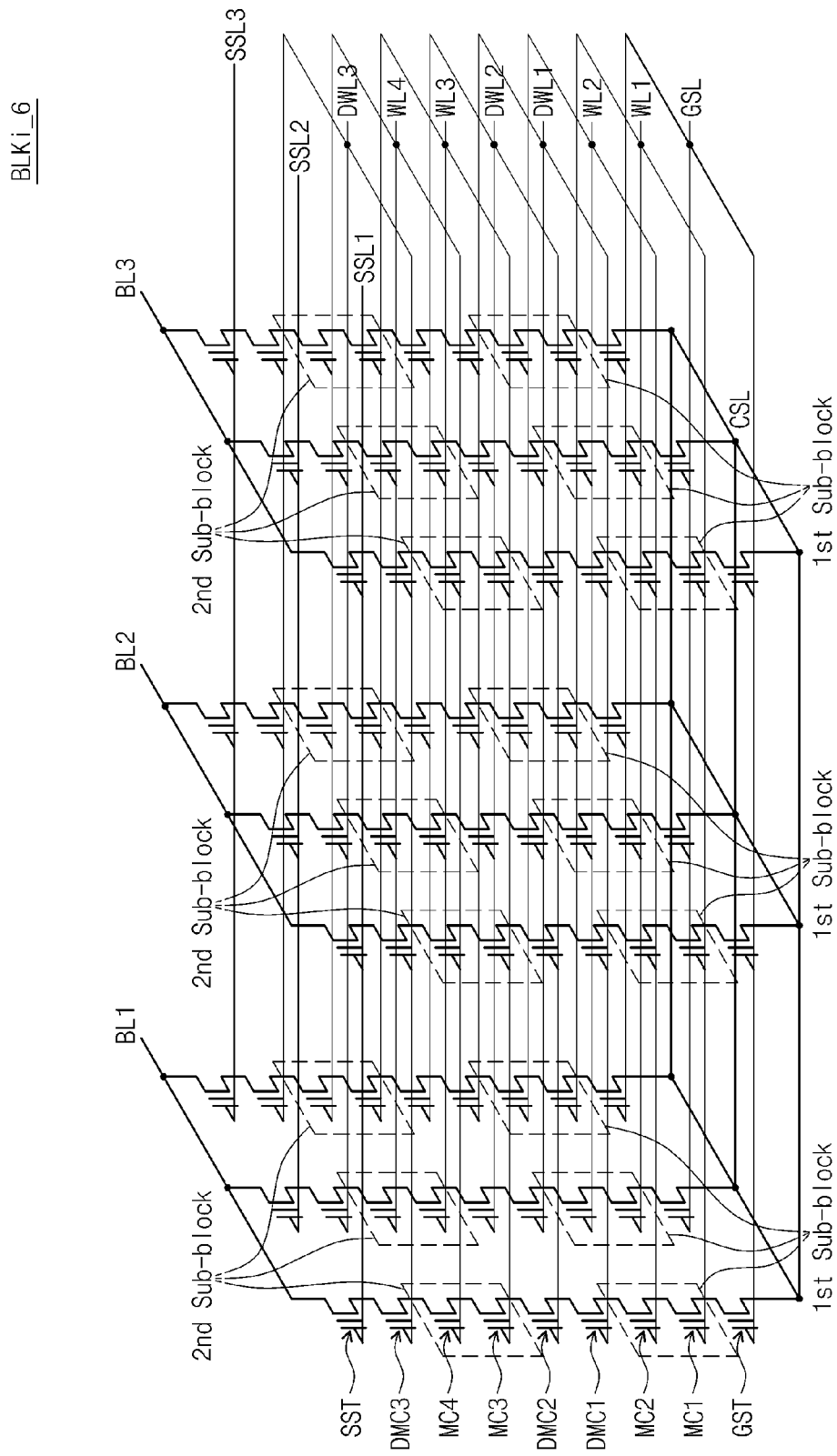
FIG. 36 is a circuit diagram illustrating an equivalent circuit BLKi_6 of the memory block BLKi described with reference to FIGS. 4 and 6 according to example embodiments of inventive concepts.

FIG. 36 is a circuit diagram illustrating an equivalent circuit BLKi_6 of the memory block BLKi described with reference to FIGS. 4 and 6 according to example embodiments of inventive concepts. Compared to the memory block BLKi_1 of FIG. 8, the dummy memory cell DMC3 is provided between the string selection transistor SST and the memory cells MC1 to MC4 in each NAND string NS. The dummy memory cells DMC3 are commonly connected to the dummy word lines DWL3. That is, the dummy word line DWL3 is provided between the string selection lines SSL1 to SSL3 and the word lines WL1 to WL4.

As mentioned with reference to FIG. 33, the number of dummy word lines DWL1 and DWL2 and dummy memory cells DMC1 and DMC2 provided between sub blocks, the number of memory cells MC 1 and MC2 of the first sub block, and the number of the memory cells MC3 and MC4 of the second sub block are not limited. Likewise, the number of the dummy memory cells DMC3 provided between the memory cells MC1 to MC4 and the string selection transistors SST is not limited.

For example, as described with reference to FIGS. 21 through 26, instead of providing dummy memory cells DMC1 and DMC2 between sub blocks, a thickness of the insulation material 112' between sub blocks may be formed greater than those of other insulation materials 112.

For example, as described with reference to FIGS. 27 through 29, dummy memory cells DMC1 and DAM2 are not provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 30 and 31, the dummy memory cells DMC1 and DMC2 are provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 18 through 20, while a read operation is performed on a selected sub block among sub blocks of the memory block BLKi_6, each sub block of the memory block BLKi_6 is selectively refreshed. For example, after data are written on a specific sub block of the memory block BLKi_6, when the number of reading operations on sub blocks of the memory block BLKi_6 reaches a reference value, a specific sub block is refreshed.

Figure 37:
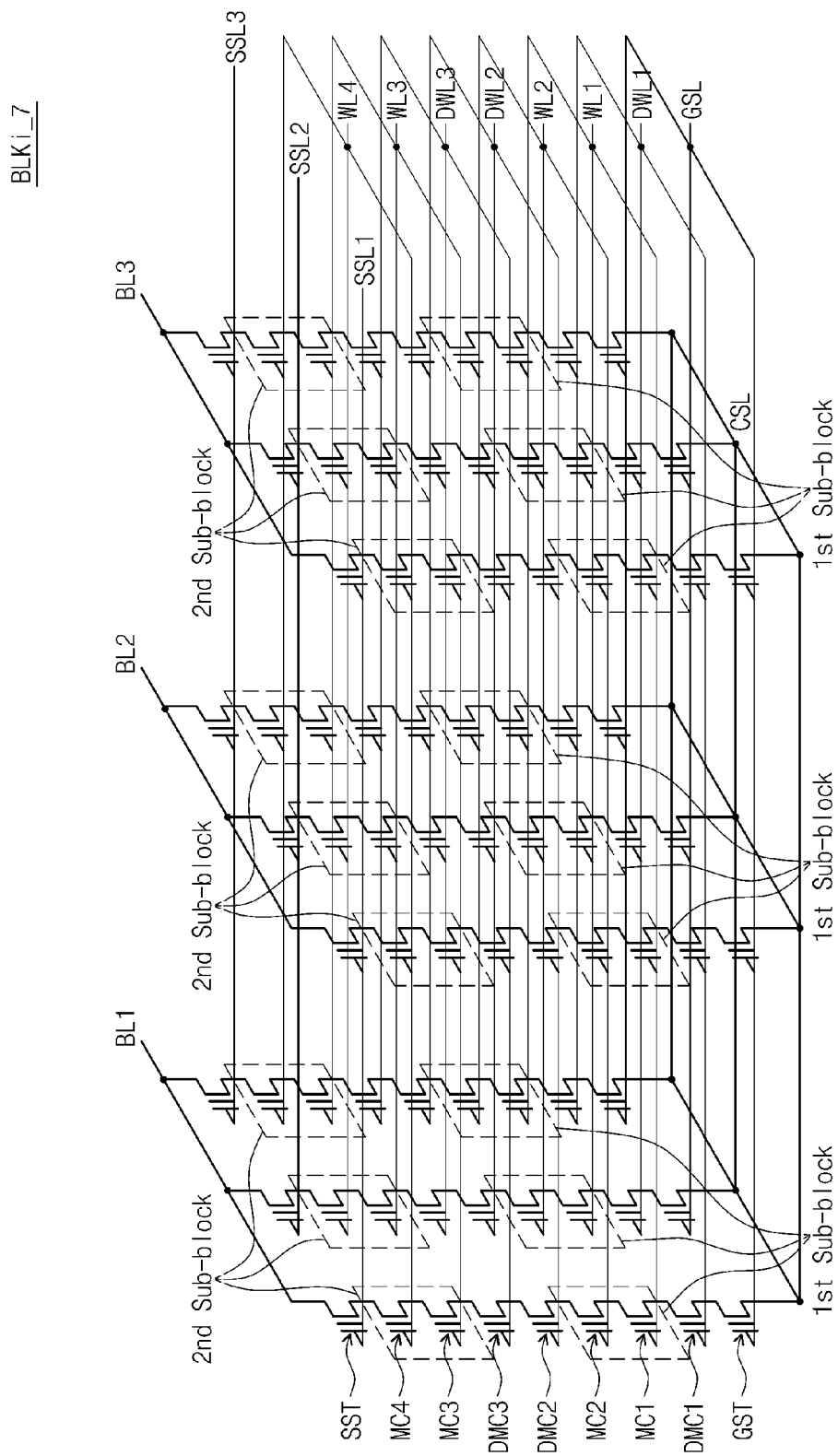
FIG. 37 is a circuit diagram illustrating an equivalent circuit BLKi_7 of the memory block BLKi described with reference to FIGS. 4 and 6 according to example embodiments of inventive concepts.

FIG. 37 is a circuit diagram illustrating an equivalent circuit BLKi_7 of the memory block BLKi described with reference to FIGS. 4 and 6 according to example embodiments of inventive concepts. Compared to the memory block BLKi_1 of FIG. 8, the dummy memory cell DMC 1 is provided between the ground selection transistor GST and the memory cells MC1 to MC6 in each NAND string NS. The dummy memory cells DMC1 are commonly connected to the dummy word lines DWL3. That is, the dummy word line DWL1 is provided between the ground selection line GSL and the word lines WL1 to WL4.

As mentioned with reference to FIG. 33, the number of dummy word lines DWL2 and DWL3 and dummy memory cells DMC2 and DMC3 provided between sub blocks, the number of memory cells MC 1 and MC2 of the first sub block, and the number of the memory cells MC3 and MC4 of the second sub block are not limited. Likewise, the number of the dummy memory cells DMC 1 provided between the memory cells MC 1 to MC4 and the ground selection transistors GST is not limited.

For example, as described with reference to FIGS. 21 through 26, instead of providing dummy memory cells DMC2 and DMC3 between sub blocks, a thickness of the insulation material 112' between sub blocks may be formed greater than those of other insulation materials 112.

For example, as described with reference to FIGS. 27 through 29, dummy memory cells DMC2 and DAM3 are not provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 30 and 31, the dummy memory cells DMC2 and DMC3 are provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 18 through 20, while a read operation is performed on a selected sub block among sub blocks of the memory block BLKi_7, each sub block of the memory block BLKi_7 is selectively refreshed. For example, after data are written on a specific sub block of the memory block BLKi_7, when the number of reading operations on sub blocks of the memory block BLKi_7 reaches a reference value, a specific sub block is refreshed.

Figure 38:
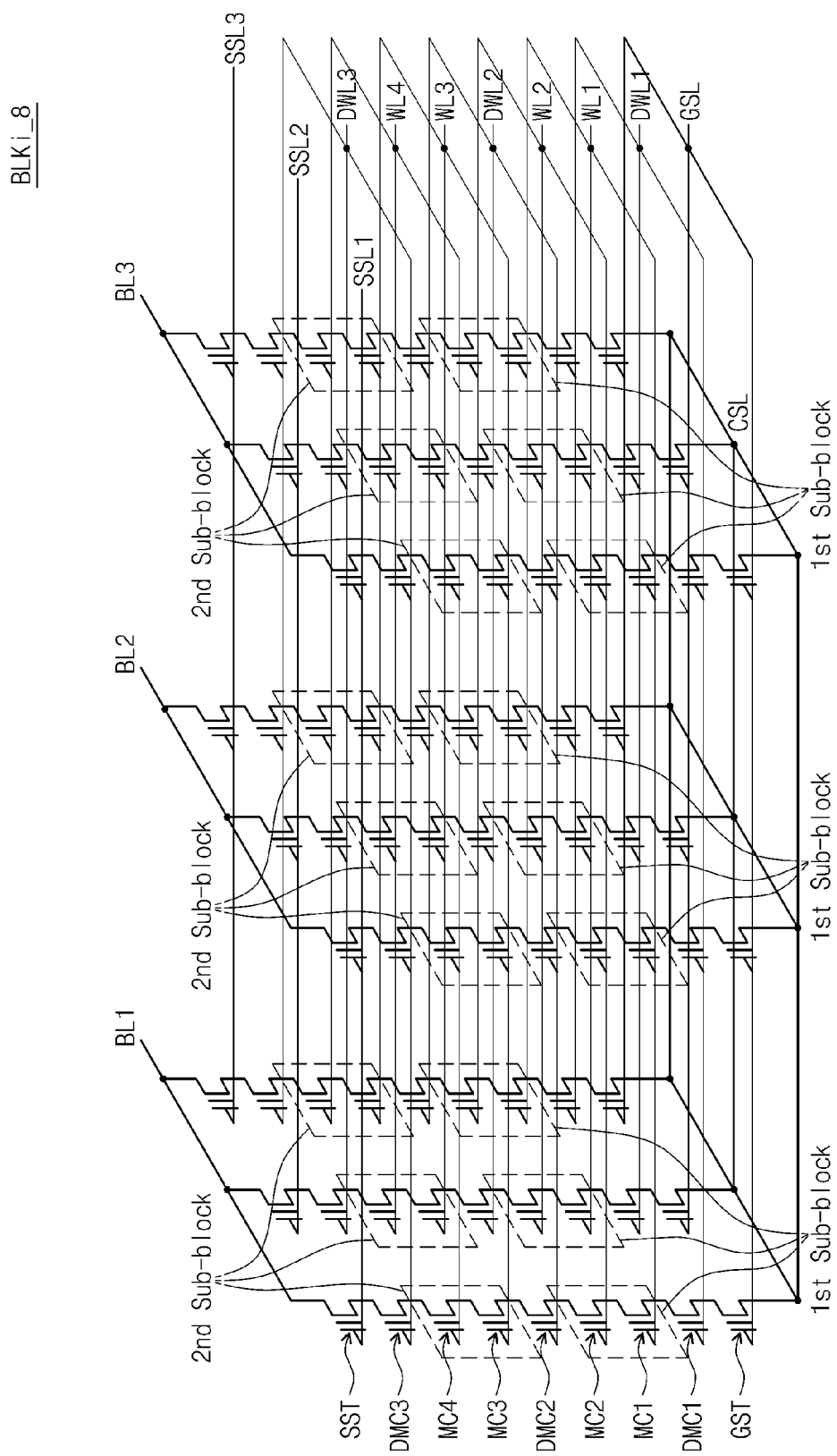
FIG. 38 is a circuit diagram illustrating an equivalent circuit BLKi_8 of the memory block BLKi described with reference to FIGS. 4 and 6 according to example embodiments of inventive concepts.

FIG. 38 is a circuit diagram illustrating an equivalent circuit BLKi_8 of the memory block BLKi described with reference to FIGS. 4 and 6 according to example embodiments of inventive concepts. Compared to the memory block BLKi_1 of FIG. 8, the dummy memory cell DMC 1 is provided between the ground selection transistor GST and the memory cells MC1 to MC4 in each NAND string NS. The dummy memory cells DMC1 are commonly connected to the dummy word lines DWL1. That is, the dummy word line DWL1 is provided between the ground selection line GSL and the word lines WL1 to WL4.

A dummy memory cell DMC3 is provided between the string selection transistor SST and the memory cells MC1 to MC4 in each NAND string. The dummy memory cells DMC3 are commonly connected to the dummy word line DWL3. That is, the dummy word line DWL3 is provided between the string selection lines SSL1 to SSL3 and the word lines WL1 to WL6.

As mentioned with reference to FIG. 33, the number of dummy word lines DWL2 and DWL3 and dummy memory cells DMC2 and DMC3 provided between sub blocks, the number of memory cells MC 1 and MC2 of the first sub block, and the number of the memory cells MC3 and MC4 of the second sub block are not limited. Likewise, the number of the dummy memory cells DMC 1 provided between the memory cells MC 1 to MC4 and the ground selection transistors GST is not limited. Moreover, the number of the dummy memory cells DMC3 provided between the memory cells MC1 to MC4 and the string selection transistors GST is not limited.

For example, as described with reference to FIGS. 21 through 26, instead of providing dummy memory cells DMC2 between sub blocks, a thickness of the insulation material 112' between sub blocks may be formed greater than those of other insulation materials 112.

For example, as described with reference to FIGS. 27 through 29, dummy memory cells DMC2 are not provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 30 and 31, the dummy memory cells DMC2 are provided, and along a direction intersecting (for example, perpendicular to) the substrate 111 in each sub block, each of the first to last memory cells MC1, MC2, MC3, and MC4 has a first size and each of the remaining memory cells (not shown) has a smaller second size than the first size.

For example, as described with reference to FIGS. 18 through 20, while a read operation is performed on a selected sub block among sub blocks of the memory block BLKi_8, each sub block of the memory block BLKi_8 is selectively refreshed. For example, after data are written on a specific sub block of the memory block BLKi_8, when the number of reading operations on sub blocks of the memory block BLKi_8 reaches a reference value, a specific sub block is refreshed.

Figure 39:
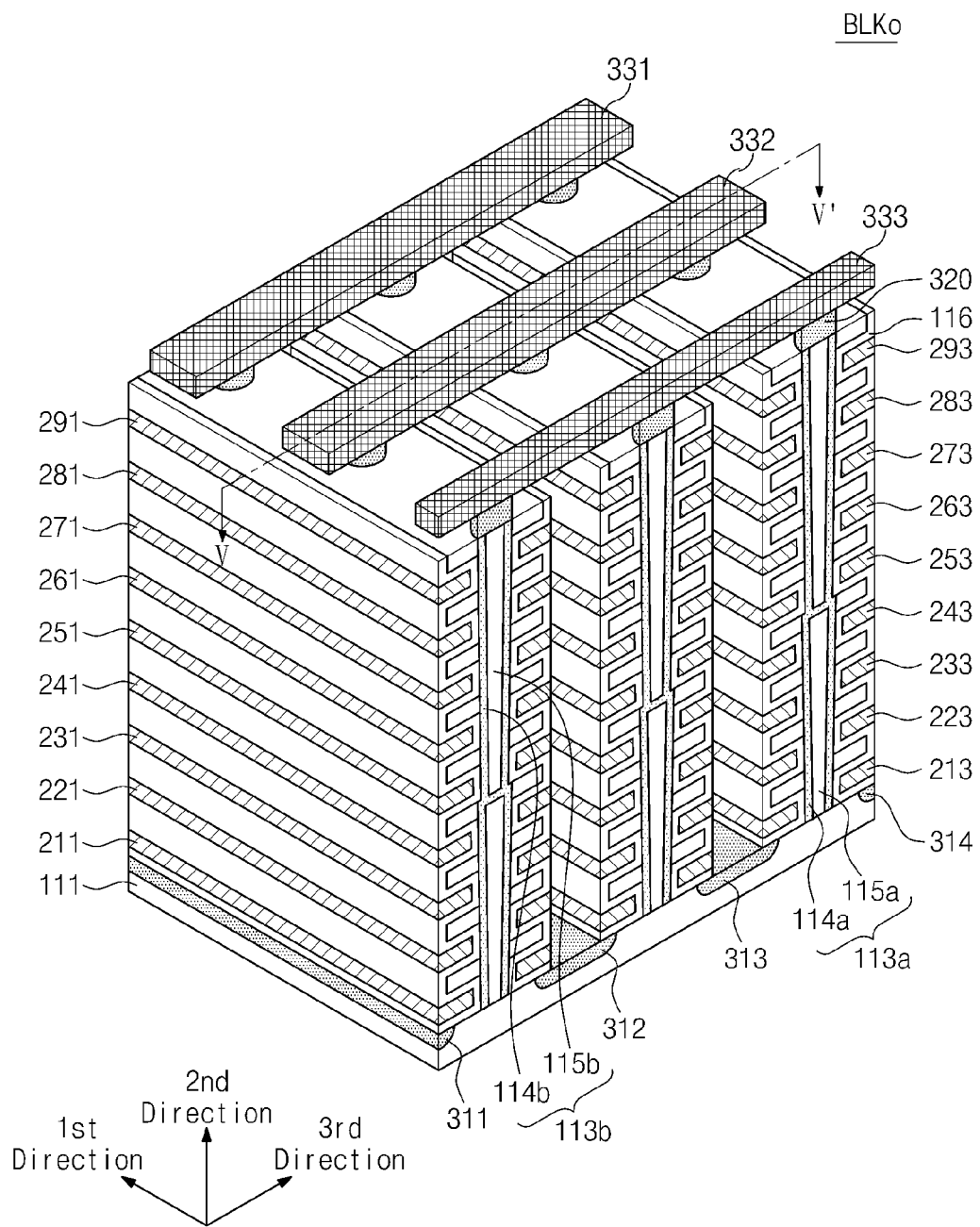
FIG. 39 is a perspective view of one of the memory blocks BLK1-BLKz according to example embodiments of inventive concepts.
Figure 40:
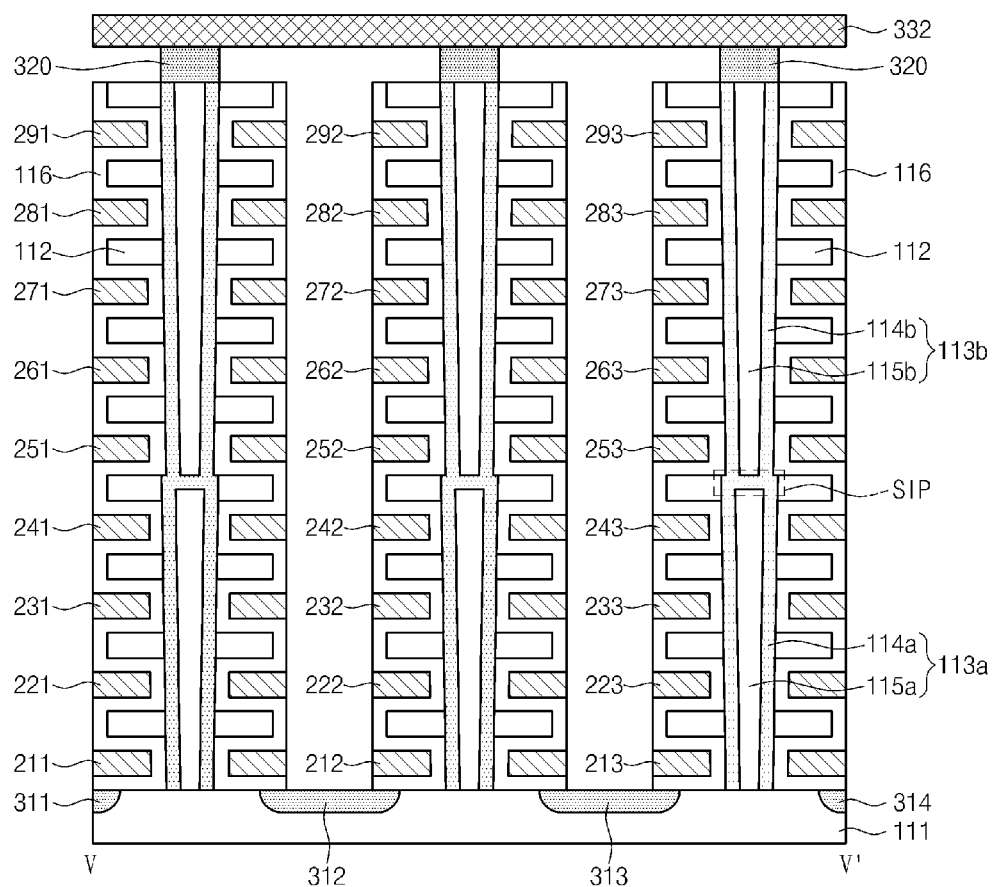
FIG. 40 is a cross-sectional view taken along the line V-V' of the memory block BLKo of FIG. 39.

FIG. 39 is a perspective view of one of the memory blocks BLK1-BLKz according to example embodiments of inventive concepts. FIG. 40 is a cross-sectional view taken along the line V-V' of the memory block BLKo of FIG. 39. Compared with the memory block BLKi described with reference to FIGS. 4 through 6, one pillar in the memory block BLKo includes a first sub-pillar 113a and a second sub-pillar 113b. Except that the pillar 113 of the memory block BLKi is replaced by the first and second pillars 113a, 113b, the memory block BLKo has the same structure as the memory block BLKi. Therefore, repeated description will be omitted.

Referring to FIGS. 39 and 40, the first sub-pillar 113a is provided on a substrate 111. Exemplarily, a surface layer 114a of the first sub-pillar 113a includes a p-type silicon material. The surface layer 114a of the first sub pillar 113a functions as a body of the second direction. An inner layer of the first sub-pillar 113a is made of an insulation material.

The second sub-pillar 113b is provided on the first sub-pillar 113a. Exemplarily, a surface layer 114b of the second sub-pillar 113b includes a p-type silicon material. The surface layer 114b of the second sub-pillar 113b functions as a body in the second direction. An inner layer 115b of the second sub-pillar 113b is made of an insulation material.

Exemplarily, the surface layer 114a of the first sub-pillar 113a is connected to the surface layer 114b of the second sub-pillar 113b. For example, as shown in FIGS. 39 and 40, the surface layer 114a of the first sub pillar 113a and the surface layer 114b of the second sub pillar 113b are connected through a p-type silicon pad SIP.

In a region having the silicon pad SIP, the surface layer 114a of the first sub pillar 113a and the surface layer 114b of the second sub pillar 113b are connected in an irregular form. Accordingly, in a region where the silicon pad SIP is provided, channel formation may be unstable. That is, memory cells MC having a height corresponding to the silicon pad SIP may not store, erase, or read data normally.

In order to prevent the above limitations, first conductive materials 251, 252, and 253 having a height corresponding to the silicon pad SIP (i.e., a fifth height) form a dummy word line DWL and a dummy memory cell DMC. That is, the memory block BLKo may be divided into sub blocks based on a height corresponding to the silicon pad SIP.

Exemplarily, an equivalent circuit of the memory block BLKo may be illustrated as the equivalent circuit BLKi_1 shown in FIG. 8. Exemplarily, an equivalent circuit of the memory block BLKo may be illustrated as the equivalent circuits BLKi_2 to BLKi_8 shown in FIGS. 32 through 38. That is, each NAND string of the memory block BLKo may include a lateral transistor LTR. At least one dummy memory cell DMC may be provided between sub blocks of the memory block BLKo. The number of memory cells DMC, which may be further provided between sub blocks of the memory block BLKo, may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

Exemplarily, as described with reference to FIGS. 30 and 31, along the direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 18 through 20, while a read operation is performed on a selected sub block among sub blocks of the memory block BLKi_o, each sub block of the memory block BLKi_o is selectively refreshed. For example, after data are written on a specific sub block of the memory block BLKi_o, when the number of reading operations on sub blocks of the memory block BLKi_o reaches a reference value, a specific sub block is refreshed.

Exemplarily, it is described that a pillar includes a first sub pillar 113a and a second sub pillar 113b. However, a pillar may include at least two sub pillars.

Figure 41:
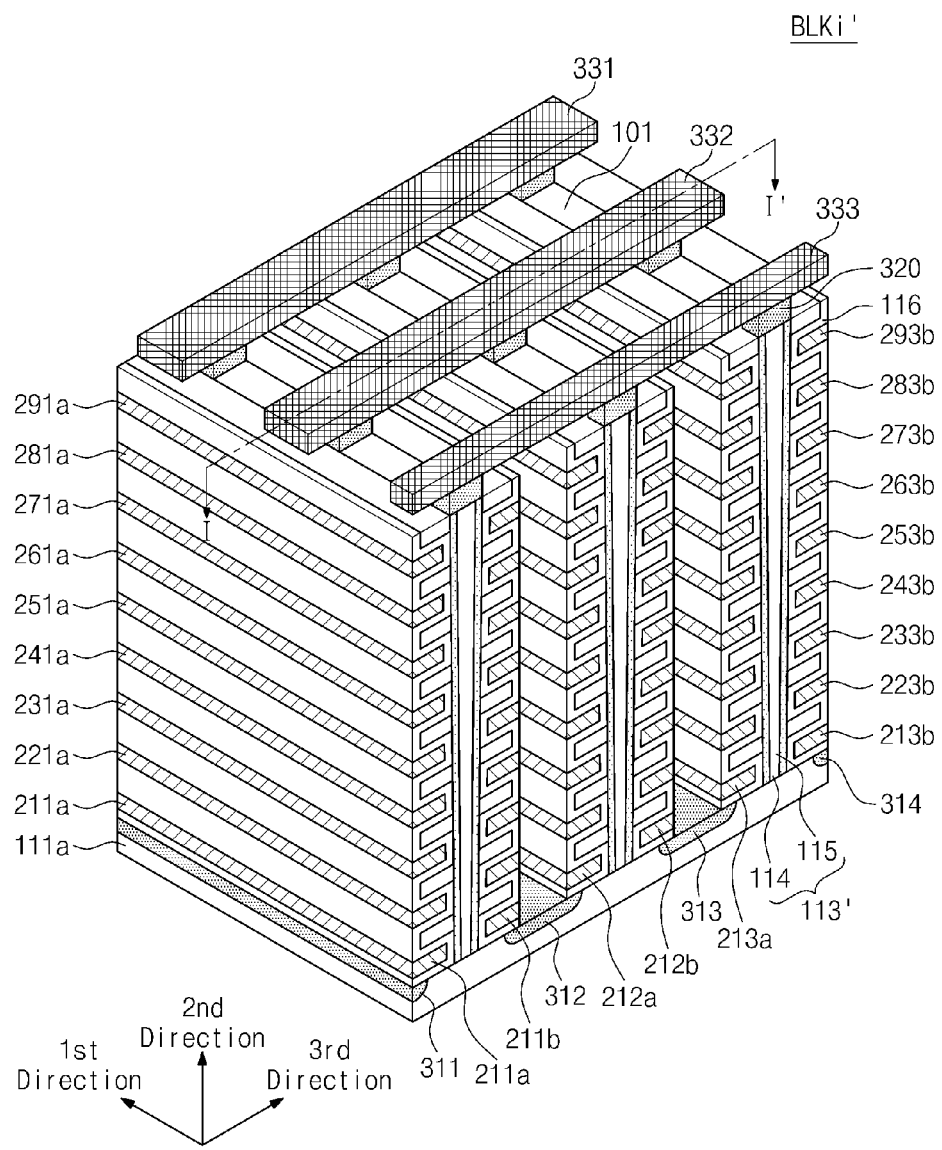
FIG. 41 is a perspective view of one of the memory blocks BLK1-BLKz according to example embodiments of inventive concepts.

FIG. 41 is a perspective view of one of the memory blocks BLK1-BLKz according to example embodiments BLKi' of inventive concepts. A cross-sectional view taken along the line I-I' of the memory block BLKi' is the same as that of FIG. 4.

Compared to the memory block BLKi of FIG. 4, in the memory block BLKi, pillars 113' has a square pillar form. Moreover, between the pillars 113' spaced from each other along the first direction by a specific distance, insulation materials 101 are provided. Exemplarily, the insulation materials 101 extend along the second direction and contact the substrate 111.

The first conductive materials 211 to 291, 212 to 292, and 213 to 293 described with reference to FIG. 4 are divided into first portions 211a to 291a, 212a to 292a, and 213a to 293a and second portions 211b to 291b, 212b to 292b, and 213b to 293b in a region including the insulation materials 101.

In a region on first and second doping regions 311 and 312, each pillar 113' forms the first portions 211a to 291a and insulation layer 116 of the first conductive materials and one NAND string NS and forms the second portions 211b to 291b and insulation layer 116 of the first conductive materials and another NAND string NS.

In a region on second and third doping regions 312 and 313, each pillar 113' forms the first portions 212a to 292a and insulation layer 116 of the first conductive materials and one NAND string NS and forms the second portions 212b to 292b and insulation layer 116 of the first conductive materials and another NAND string NS.

In a region on third and fourth doping regions 313 and 314, each pillar 113' forms the first portions 213a to 293a and insulation layer 116 of the first conductive materials and one NAND string NS and forms the second portions 213b to 293b and insulation layer 116 of the first conductive materials and another NAND string NS.

That is, the first and second portions 211a to 291a and 211b to 291b of the first conductive materials provided at the both sides of each pillar 113' are separated using the insulation material 101, such that each pillar 113' may form two NAND strings.

As described with reference to FIGS. 4 through 8, the first portions 211a to 291a and the second portions 211b to 291b, 212b to 292b, and 213b to 293b of the first conductive materials may correspond to ground selection lines GSL, word lines WL, and string selection lines SST, respectively. The word lines WL having the same height are commonly connected.

Exemplarily, an equivalent circuit of the memory block BLKi' may be illustrated as the equivalent circuit BLKi_1 shown in FIG. 8 except the number of rows in the NAND strings NS. For example, the number of rows in the NAND strings NS of an equivalent circuit of the memory block BLKi' may be two times that in the NAND strings NS of the equivalent circuit BLKi_1 shown in FIG. 8.

Exemplarily, an equivalent circuit of the memory block BLKi' may be illustrated as the equivalent circuits BLKi_2 to BLKi_8 shown in FIGS. 32 through 38 except the number of rows in the NAND strings NS. For example, the number of rows in the NAND strings NS of an equivalent circuit of the memory block BLKi' may be two times that in the NAND strings NS of the equivalent circuits BLKi_2 to BLKi_8 shown in FIGS. 32 through 38.

Each NAND string of the memory block BLKi' may include a lateral transistor LTR. At least one dummy memory cell DMC may be provided between sub blocks of the memory block BLKi'. The number of memory cells DMC, which may be further provided between sub blocks of the memory block BLKi', may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 30 and 31, along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 18 through 20, while a read operation is performed on a selected sub block among sub blocks of the memory block BLKi', each sub block of the memory block BLKi' is selectively refreshed. For example, after data are written on a specific sub block of the memory block BLKi', when the number of reading operations on sub blocks of the memory block BLKi' reaches a reference value, a specific sub block is refreshed.

Figure 42:
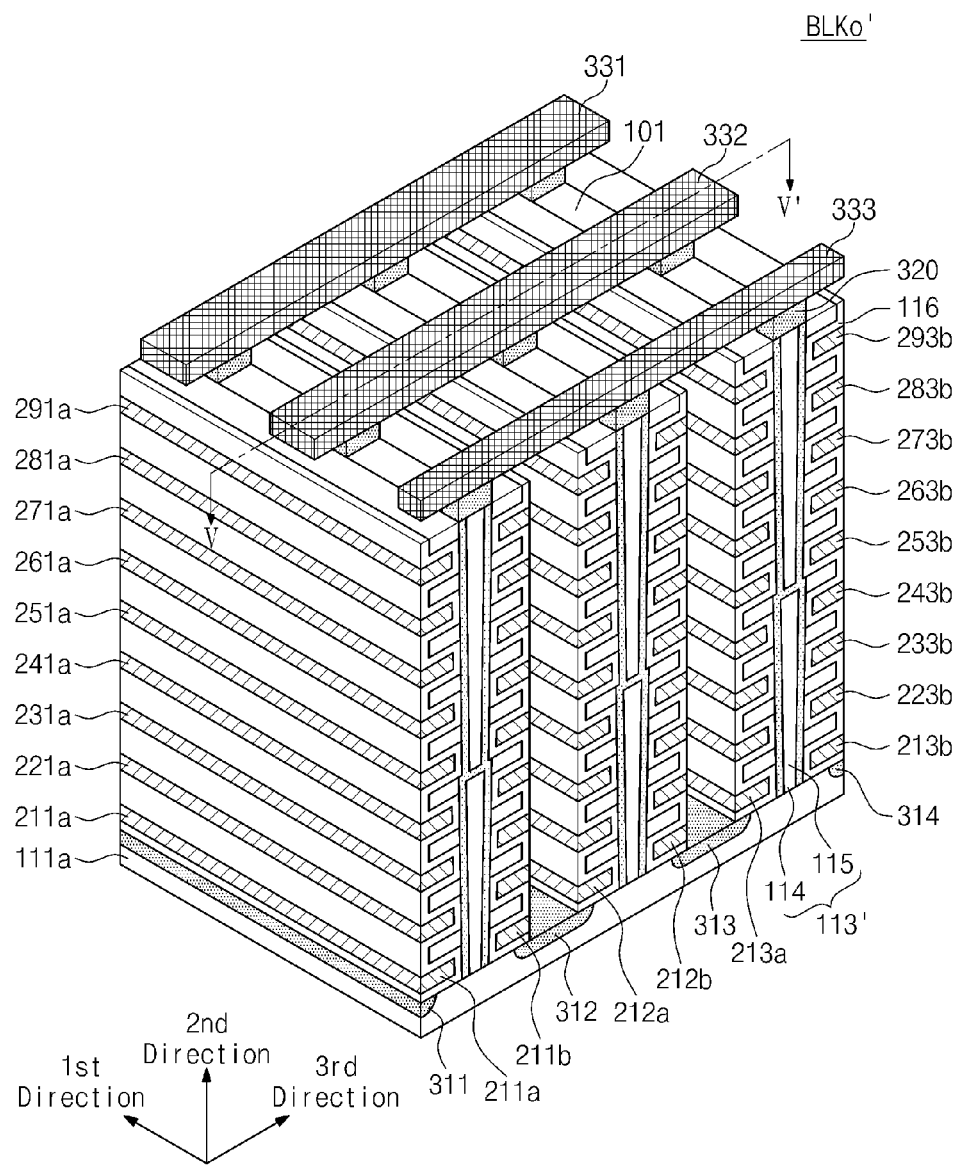
FIG. 42 is a perspective view of one of the memory blocks BLK1-BLKz according to example embodiments of inventive concepts.

FIG. 42 is a perspective view of one of the memory blocks BLK1-BLKz according to example embodiments of inventive concepts. A cross-sectional view taken along the line V-V' of the memory block BLKo' is the same as that of FIG. 40.

As described with reference to FIGS. 39 and 40, one pillar in the memory block BLKo' includes a first sub-pillar 113a and a second sub-pillar 113b. Except that a pillar has a square pillar form, the first sub pillars 113a and the second sub pillars 113b are the same as those described with reference to FIGS. 39 and 40.

As illustrated with reference to FIG. 41, one pillar 113' forms two NAND string NS. The first portions 211a to 291a and the second portions 211b to 291b, 212b to 292b, and 213b to 293b of the first conductive materials may correspond to ground selection lines GSL, word lines WL, and string selection lines SST, respectively. The word lines WL having the same height are commonly connected.

Exemplarily, an equivalent circuit of the memory block BLKo' may be illustrated as the equivalent circuit BLKi_1 shown in FIG. 8 except the number of rows in the NAND strings NS. For example, the number of rows in the NAND strings NS of an equivalent circuit of the memory block BLKo' may be two times that in the NAND strings NS of the equivalent circuit BLKi_1 shown in FIG. 8.

Exemplarily, an equivalent circuit of the memory block BLKo' may be illustrated as the equivalent circuits BLKi_2 to BLKi_8 shown in FIGS. 32 through 38 except the number of rows in the NAND strings NS. For example, the number of rows in the NAND strings NS of an equivalent circuit of the memory block BLKo' may be two times that in the NAND strings NS of the equivalent circuits BLKi_2 to BLKi_8 shown in FIGS. 32 through 38.

Each NAND string of the memory block BLKo' may include a lateral transistor LTR. At least one dummy memory cell DMC may be provided between sub blocks of the memory block BLKo'. The number of memory cells DMC, which may be further provided between sub blocks of the memory block BLKo', may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

For example, as described with reference to FIGS. 30 and 31, along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

As described with reference to FIGS. 39 and 40, first conductive materials 251, 252, and 253 having a height corresponding to the silicon pad SIP (i.e., a fifth height) form a dummy word line DWL and a dummy memory cell DMC. That is, the memory block BLKo may be divided into sub blocks based on a height corresponding to the silicon pad SIP.

For example, as described with reference to FIGS. 18 through 20, while a read operation is performed on a selected sub block among sub blocks of the memory block BLKo', each sub block of the memory block BLKo' is selectively refreshed. For example, after data are written on a specific sub block of the memory block BLKi_o, when the number of reading operations on sub blocks of the memory block BLKi_o reaches a reference value, a specific sub block is refreshed.

Exemplarily, it is described that a pillar includes a first sub pillar 113a and a second sub pillar 113b. However, a pillar may include at least two sub pillars.

Figure 43:
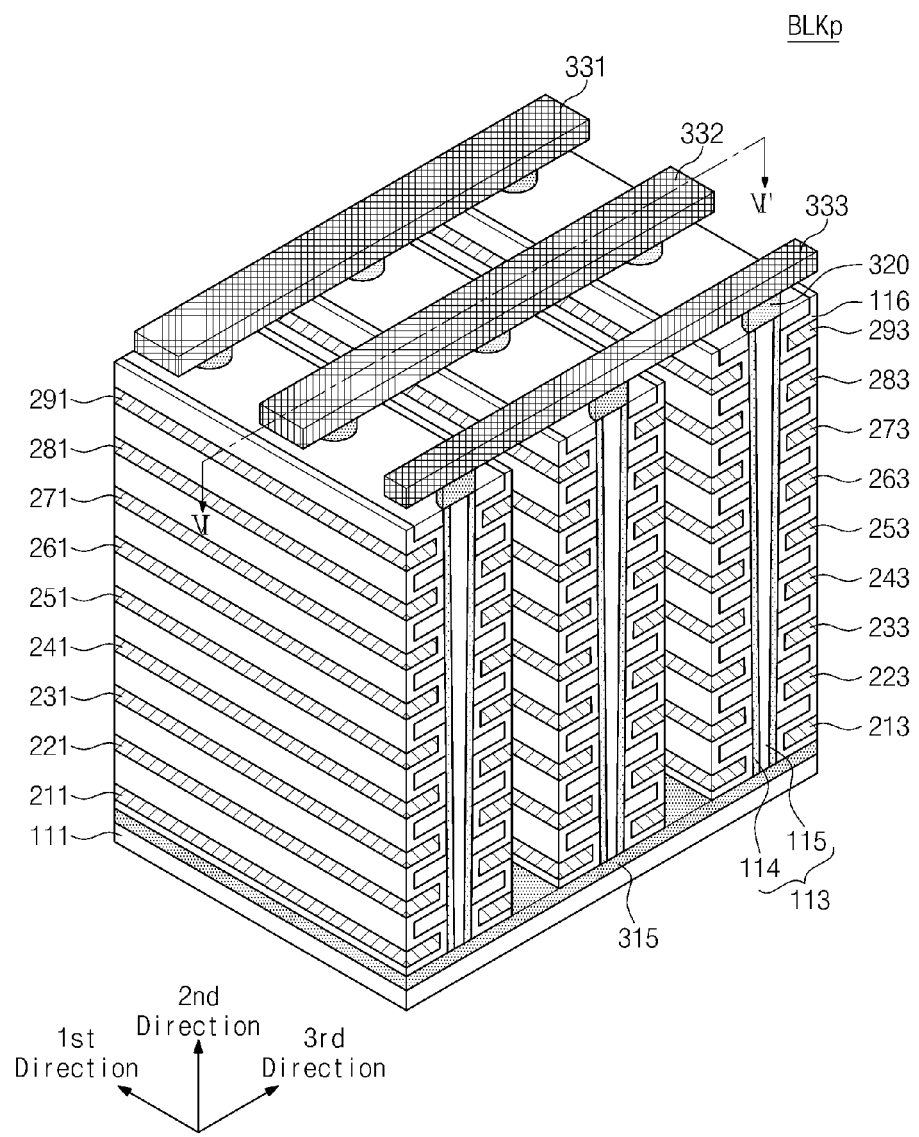
FIG. 43 is a perspective view of one of the memory blocks BLK1-BLKz according to example embodiments of inventive concepts.
Figure 44:
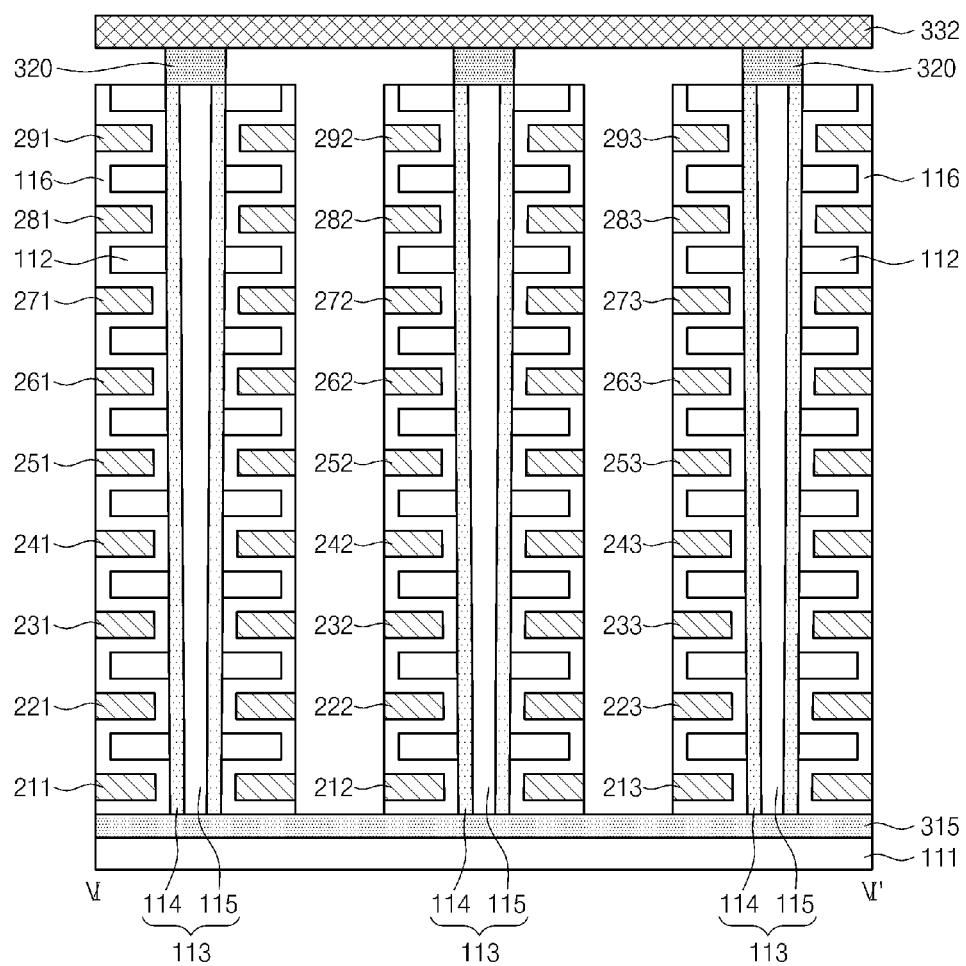
FIG. 44 is a sectional view taken along the line VI-VI' of the memory block BLKp of FIG. 43.

FIG. 43 is a perspective view of one of the memory blocks BLK1-BLKz according to example embodiments BLKp of inventive concepts. FIG. 44 is a sectional view taken along the line VI-VI' of the memory block BLKp of FIG. 43. Except that an n-type doping region 315 forming a common source line CSL is provided with a plate form, the memory block BLKp has the same configuration as the memory block BLKi described with reference to FIGS. 4 through 8. For example, an n-type doping region 315 may be provided as an n-type well.

As described with reference to FIGS. 4 through 8, the first conductive materials 211 to 291, 212 to 292, and 213 to 293 may correspond to ground selection lines GSL, word lines WL, and string selection lines SST, respectively. The word lines WL having the same height are commonly connected.

FIG. 45 is a table illustrating example embodiments of voltage conditions during an erase operation of the memory block BLKp of FIG. 44. Referring to FIGS. 43 and 44, a string selection line SSL floats during an erase operation. Word lines WL of an unselected sub block float. Word lines WL of a selected sub block is driven by a second word line erase voltage Vwe2 after floating. A third dummy word line voltage Wdw13 is applied to a dummy word line DWL. After a ground selection line GSL is driven by a ground voltage, it floats. Then, after a substrate 111 is driven by a pre voltage Vpre, it is driven by a second erase voltage Vers2.

Figure 46:
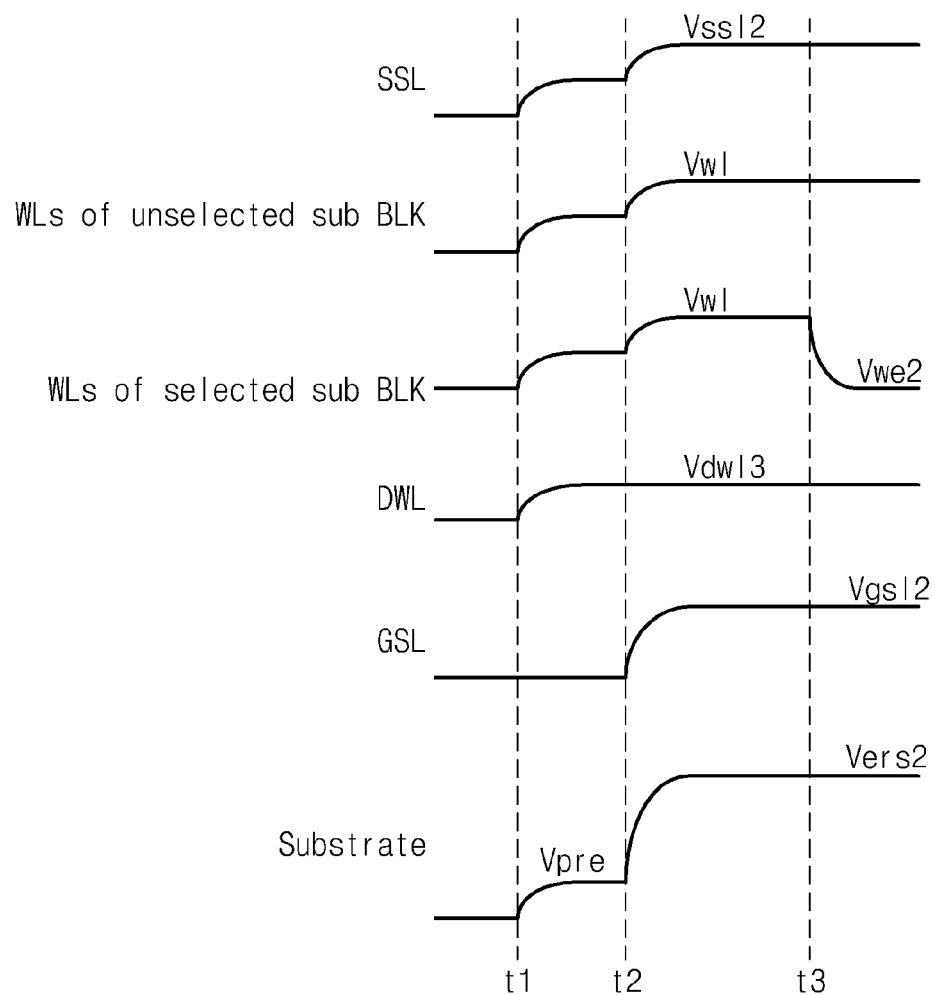
FIG. 46 is an example timing diagram illustrating a voltage change of the memory block BLKp of FIGS. 43 and 44 according to the voltage conditions of FIG. 45.

FIG. 46 is a timing diagram illustrating a voltage change of the memory block BLKp of FIGS. 43 and 44 according to the voltage conditions of FIG. 45. Exemplarily, an equivalent circuit of the memory block BLKp may be illustrated as the equivalent circuit BLKi_1 shown in FIG. 8. Hereinafter, with reference to the equivalent circuit BLKi_1 of FIG. 8 and FIGS. 43 through 46, an erase operation of the memory block BLKp is illustrated. Exemplarily, it is assumed that a first sub block is erased and a second sub block is erase-inhibited.

At a first timing t1, a pre voltage Vpre is applied to a substrate 111. For example, the substrate 111 includes a p-type silicon material and a doping region 315 includes an n-type silicon material. Since the substrate 111 and the doping region 315 form a forward bias condition, a pre voltage Vpre is delivered to the doping region 315 through the substrate 111. For example, the pre voltage Vpre is a high voltage.

At a first timing t1, a ground voltage Vss is applied to the ground selection line GSL. A ground voltage is applied to a gate (or a control gate) of the ground selection transistor GST, and a pre voltage Vpre is applied to a source. Since a pre voltage Vpre is a high voltage, thermo electrons occur at the ground selection transistor GST. For example, thermo electrons occur by a gate induced drain leakage (GIDL) at the ground selection transistor GST. The generated thermo electrons are delivered from the doping region 315 to the surface layer 114 operating as a body of the second direction. Accordingly, a voltage of the surface layer 114 rises.

At a first timing t1, the word lines WL1 to WL3 of a selected sub block and the word line WL4 to WL6 of an unselected sub block float. Accordingly, voltages of the word lines WL1 to WL3 of a selected sub block and the word line WL4 to WL6 of an unselected sub block are raised by coupling according to voltage rise of the surface layer 114.

At a first timing t1, a third dummy word line voltage Vdwl3 is applied to the dummy word line DWL.

At a first timing t1, the string selection line SSL floats. Accordingly, a voltage of the string selection line SSL is raised by coupling according to voltage rise of the surface layer 114.

At a second timing t2, a second erase voltage Vers2 is applied to the substrate 111. The second erase voltage Vers2 is delivered to the doping region 315. Due to a difference between the second erase voltage Vers2 and a voltage of the ground selection line GSL, thermo electrons occur in the ground selection transistor GST. For example, thermo electrons may occur by GIDL in the ground selection transistor GST. The generated thermo electrons are injected on the surface layer 114 such that a voltage of the surface layer 114 may rise.

At a second timing t2, the ground selection line GSL floats. Accordingly, by coupling according to voltage rise of the surface layer 114, a voltage of the ground selection line GSL may rise. For example, a voltage of the ground selection line GSL rises up to the second ground selection line voltage Vgsl2.

At a second timing t2, the word lines WL1 to WL3 of a selected sub block and the word line WL4 to WL6 of an unselected sub block float. Accordingly, voltages of the word lines WL1 to WL3 of a selected sub block and the word line WL4 to WL6 of an unselected sub block are raised by coupling according to voltage rise of the surface layer 114. For example, voltages of the word lines WL1 to WL3 of a selected sub block and the word line WL4 to WL6 of an unselected sub block rise up to a word line voltage Vwl.

At a second timing t2, the string selection line SSL floats. Accordingly, a voltage of the string selection line SSL is raised by coupling according to voltage rise of the surface layer 114. For example, a voltage of the string selection line SSL rises up to a second string selection line voltage Vssl2.

At a third timing t3, a second word line erase voltage Vwe2 is applied to the word lines WL1 to WL3 of a selected sub block. For example, the second word line erase voltage Vwe2 is a low voltage. For example, a second word line erase voltage Vwe2 is a ground voltage Vss. At this point, a voltage of the surface layer 114 is a high voltage. Accordingly, Fowler-Nordheim (F-N) coupling is induced in memory cells of a selected sub block. Due to F-N tunneling, the memory cells MC1 to MC3 of a selected sub block are erased.

At a third timing t3, voltages of the word lines WL4 to WL6 of an unselected sub block have a level of a word line voltage Vwl. Exemplarily, the word line voltage Vwl is a voltage generated by coupling according to voltage rise of the surface layer 114. For example, the word line voltage Vwl is a high voltage. Exemplarily, the word line voltage Vwl prevents F-N tunneling from being induced in the word lines WL4 to WL6 of an unselected sub block. Accordingly, the word lines WL4 to WL6 of an unselected sub block are erase-inhibited.

At a third timing t3, a voltage of the ground selection line GSL has a level of a second ground selection line voltage Vgsl2. Exemplarily, the second ground selection line voltage Vgsl2 is a voltage is a voltage generated by coupling according to voltage rise of the surface layer 114. For example, the second ground selection line voltage Vgsl2 may be a high voltage. Exemplarily, a level of the second ground selection line voltage Vgsl2 is set in order not to prevent F-N from being induced tunneling in the ground selection transistor GST. For example, by adjusting a timing that the ground selection line GSL floats, a level of the second ground selection line voltage Vgsl2 may be adjusted. Accordingly, the ground selection transistor GST is erase-inhibited.

At a third timing t3, a voltage of the string selection line SSL has a level of the second ground selection line voltage Vgsl2. Exemplarily, the second ground selection line voltage Vgsl2 is a voltage generated by coupling according to voltage rise of the surface layer 114. For example, the second ground selection line voltage Vgsl2 may be a high voltage. Exemplarily, the second ground selection line voltage Vgsl2 prevents F-N tunneling from being induced in the string selection transistor SST. Accordingly, the ground selection transistor GST is erase-inhibited.

At the second and third timings t2 and t3, a voltage of the dummy word line DWL maintains as the third dummy word line voltage Vdwl3. Exemplarily, a level of the third dummy word line voltage Vdwl3 is set in order not to prevent F-N tunneling from being induced in the dummy memory cell DMC. Accordingly, the dummy memory cell DMC is erase-inhibited.

Exemplarily, a level of the third dummy word line voltage Vdwl3 is set in order to prevent or reduce influence of coupling between the word lines WL1 to WL3 of a selected sub block and the word line WL4 to WL6 of an unselected sub block For example, a voltage of the word lines WL1 to WL3 of a sub block selected at the third timing t3 is lowered from the word line voltage Vwl to the second word line erase voltage Vwe. At this point, the third dummy word line voltage Vdwl3 may be set, in order to prevent or reduce influence of coupling according to voltage drop of the word lines WL1 to WL3 of a selected sub block from being delivered to the word lines WL4 to WL6 of an unselected sub block. Moreover, the third dummy word line voltage Vdwl3 may be set, in order to prevent or reduce influence of coupling of when a voltage of the word lines WL4 to WL6 of an unselected sub block is maintained from being delivered to the word lines WL1 to WL3 of a selected sub block.

Exemplarily, the third dummy word line voltage Vdwl3 may have a level between the second erase voltage Vers2 and the second word line erase voltage Vwe2. For example, the third dummy word line voltage Vdwl3 may have a level between the word line voltage Vwl and the second word line erase voltage Vwe2.

In the above-mentioned example embodiments, it is described that the word lines WL4 to WL6 of an unselected sub block float. However, the second word line erase-inhibit voltage Vwei2 may be applied to the word lines WL4 to WL6 of an unselected sub block. For example, at a first timing t1, a predetermined or desired voltage is applied to word lines of an unselected sub block. The predetermined or desired voltage may have a lower level than the second word line erase voltage Vwei2. Then, at a second timing t2, the second word line erase voltage Vwei2 is applied to the word lines WL4 to WL6 of an unselected sub block.

Exemplarily, a level of the second word line erase voltage Vwei2 may be set in order to prevent F-N tunneling from being induced through a voltage difference between the second word line erase voltage Vwei2 and the second erase voltage Vers2.

Exemplarily, an equivalent circuit of the memory block BLKp may be illustrated as the equivalent circuit BLKi_1 shown in FIG. 8. Exemplarily, an equivalent circuit of the memory block BLKp may be illustrated as the equivalent circuits BLKi_2 to BLKi_8 shown in FIGS. 32 through 38. That is, each NAND string of the memory block BLKp may include a lateral transistor LTR. At least one dummy memory cell DMC may be provided between sub blocks of the memory block BLKp. The number of memory cells DMC, which may be further provided between sub blocks of the memory block BLKp, may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

Exemplarily, as described with reference to FIGS. 30 and 31, along the direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

Figure 48:
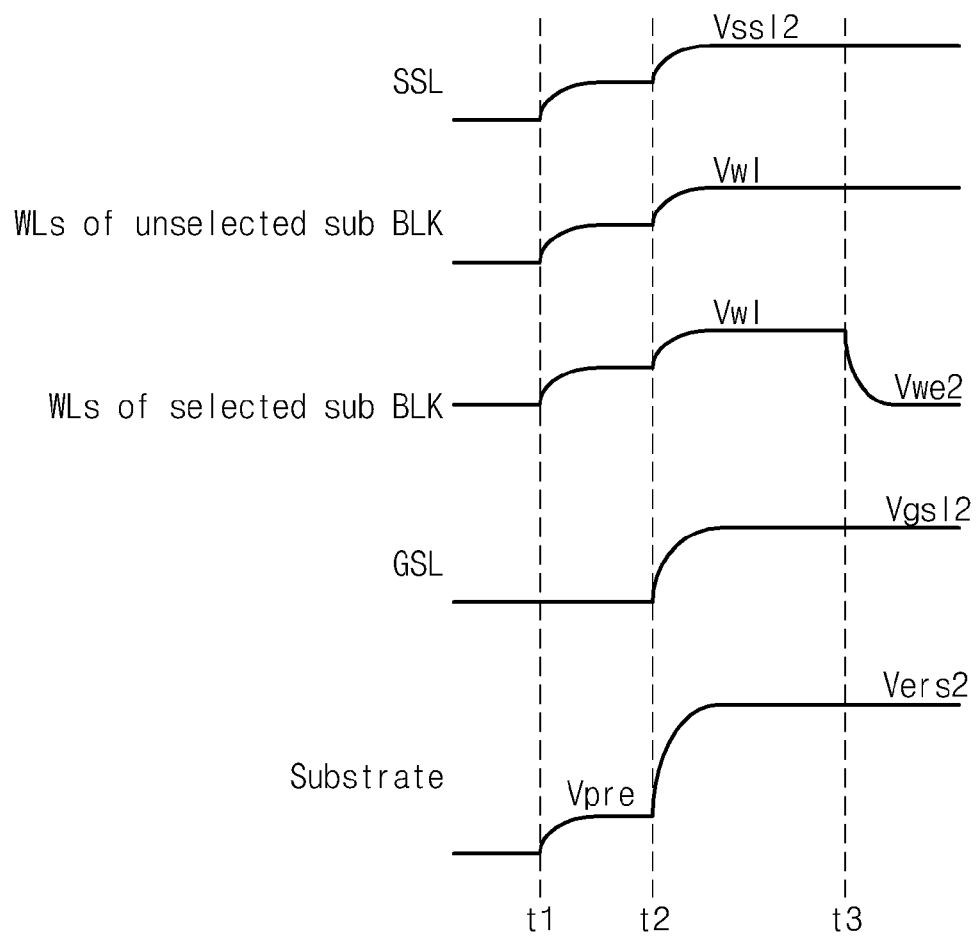
FIG. 48 is an example timing diagram illustrating a voltage change according to the voltage conditions of FIG. 47.

If the dummy memory cells DMC are not provided between sub blocks, voltage conditions and voltage changes during an erase operation of the memory block BLKo are the same as those shown in FIGS. 47 and 48.

FIG. 47 is a table illustrating voltage conditions when dummy memory cells DMC are not provided between sub blocks of the memory block BLKp of FIGS. 43 and 44. Except that a voltage condition of the dummy word line DWL is removed, the voltage conditions of FIG. 47 are the same as those of FIG. 45.

FIG. 48 is a timing diagram illustrating a voltage change according to the voltage conditions of FIG. 47. Except that a voltage change of the dummy word line DWL is removed, voltage changes of the FIG. 48 are the same as those of FIG. 46.

Exemplarily, influence of coupling between sub blocks is prevented or reduced by the dummy word line DWL during a voltage change shown in FIG. 46 and also influence of coupling between sub blocks is prevented or reduced by an insulation material 112' provided between sub blocks during a voltage change shown in FIG. 46.

For example, as described with reference to FIGS. 18 through 20, while a read operation is performed on a selected sub block among sub blocks of the memory block BLKp, each sub block of the memory block BLKp is selectively refreshed. For example, after data are written on a specific sub block of the memory block BLKp, when the number of reading operations on sub blocks of the memory block BLKp reaches a reference value, a specific sub block is refreshed.

Figure 49:
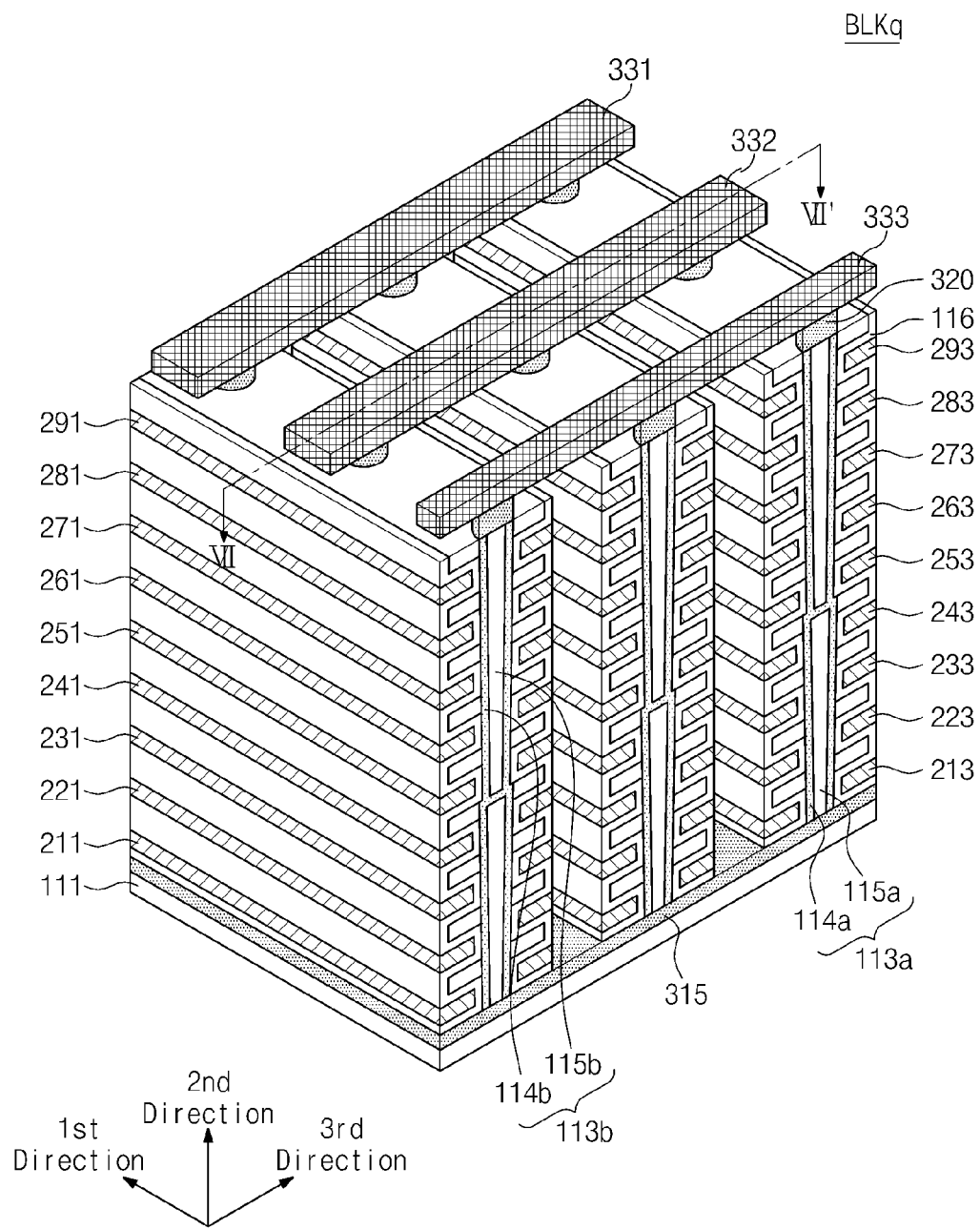
FIG. 49 is a perspective view of one of the memory blocks BLK1-BLKz according to example embodiments of inventive concepts.
Figure 50:
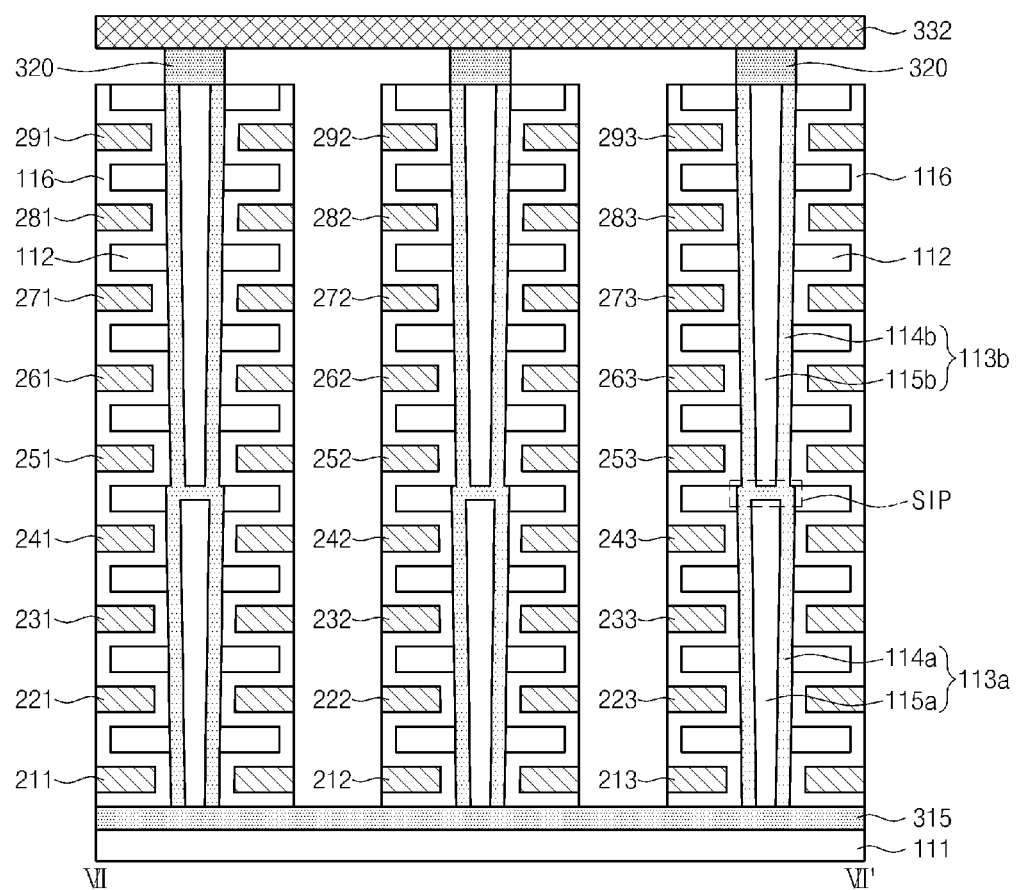
FIG. 50 is a sectional view taken along the line VII-VII' of the memory block BLKq of FIG. 43.

FIG. 49 is a perspective view of one of the memory blocks BLK1-BLKz according to example embodiments of inventive concepts. FIG. 50 is a sectional view taken along the line VII-VII' of the memory block BLKq of FIG. 43. Except that one pillar of the memory block BLKq includes a first sub pillar 113a and a second sub pillar 113b, the memory block BLKq has the same configuration as the memory block BLKp described with reference to FIGS. 43 through 44.

As described with reference to FIGS. 39 and 40, one pillar in the memory block BLKq includes a first sub-pillar 113a and a second sub-pillar 113b. The first sub pillars 113a and the second sub pillars 113b are the same as those described with reference to FIGS. 39 and 40.

As described with reference to FIGS. 43 and 44, an n-type doping region 315 forming a common source line CSL has a plate form.

Exemplarily, an erase operation of the memory block BLKq is performed according to the method described with reference to FIGS. 45 through 48.

Exemplarily, an equivalent circuit of the memory block BLKq may be illustrated as the equivalent circuit BLKi_1 shown in FIG. 8. Exemplarily, an equivalent circuit of the memory block BLKq may be illustrated as the equivalent circuits BLKi_2 to BLKi_8 shown in FIGS. 32 through 38. That is, each NAND string of the memory block BLKq may include a lateral transistor LTR. At least one dummy memory cell DMC may be provided between sub blocks of the memory block BLKq. The number of memory cells DMC, which may be further provided between sub blocks of the memory block BLKo, may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

Exemplarily, as described with reference to FIGS. 30 and 31, along the direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

As described with reference to FIGS. 39 and 40, first conductive materials 251, 252, and 253 having a height corresponding to the silicon pad SIP (i.e., a fifth height) form a dummy word line DWL and a dummy memory cell DMC. That is, the memory block BLKq may be divided into sub blocks based on a height corresponding to the silicon pad SIP.

For example, as described with reference to FIGS. 18 through 20, while a read operation is performed on a selected sub block among sub blocks of the memory block BLKq, each sub block of the memory block BLKq is selectively refreshed. For example, after data are written on a specific sub block of the memory block BLKq, when the number of reading operations on sub blocks of the memory block BLKq reaches a reference value, a specific sub block is refreshed.

Exemplarily, it is described that a pillar includes a first sub pillar 113a and a second sub pillar 113b. However, a pillar may include at least two sub pillars.

Figure 51:
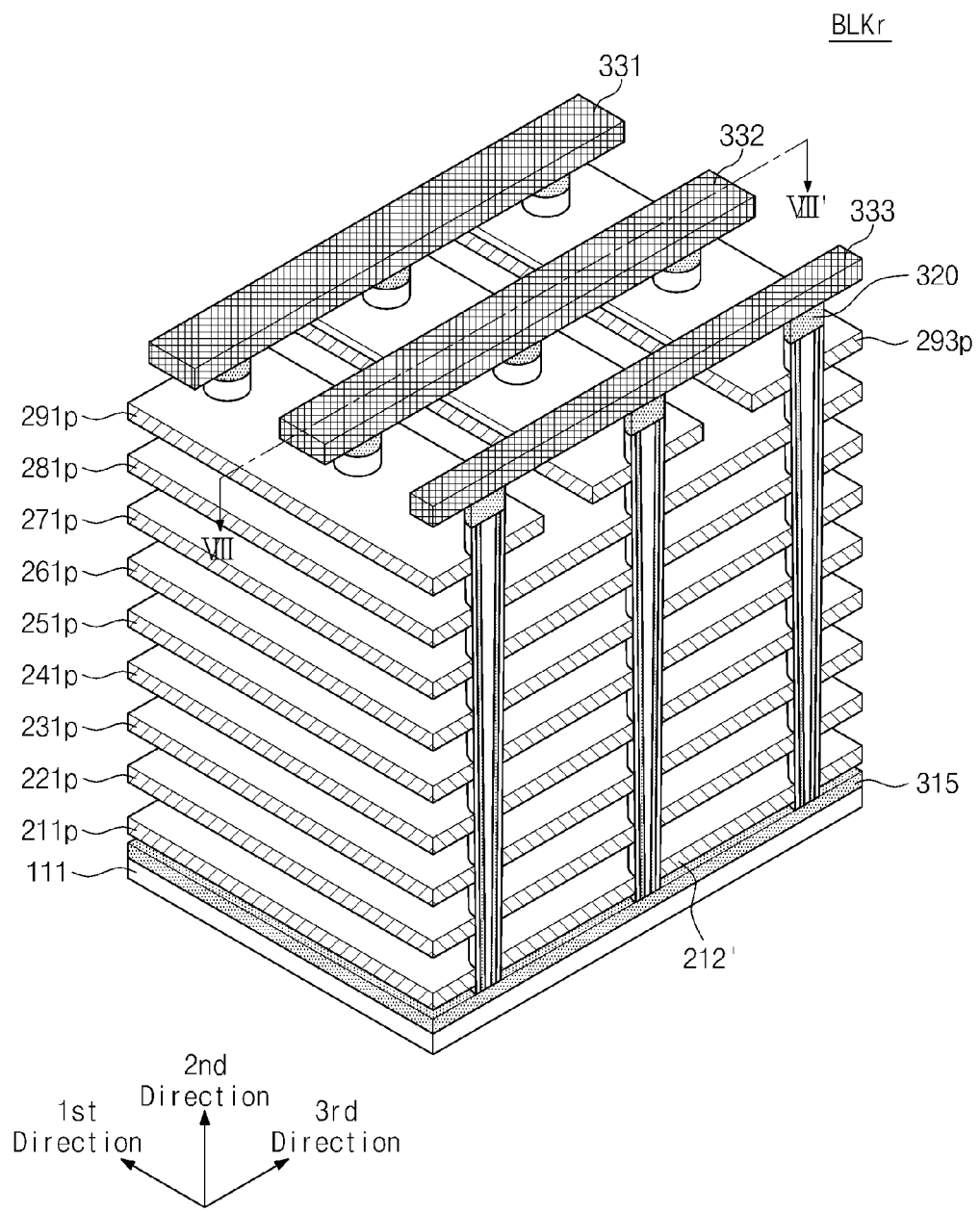
FIG. 51 is a perspective view of one of the memory blocks BLK1-BLKz according to example embodiments of inventive concepts.
Figure 52:
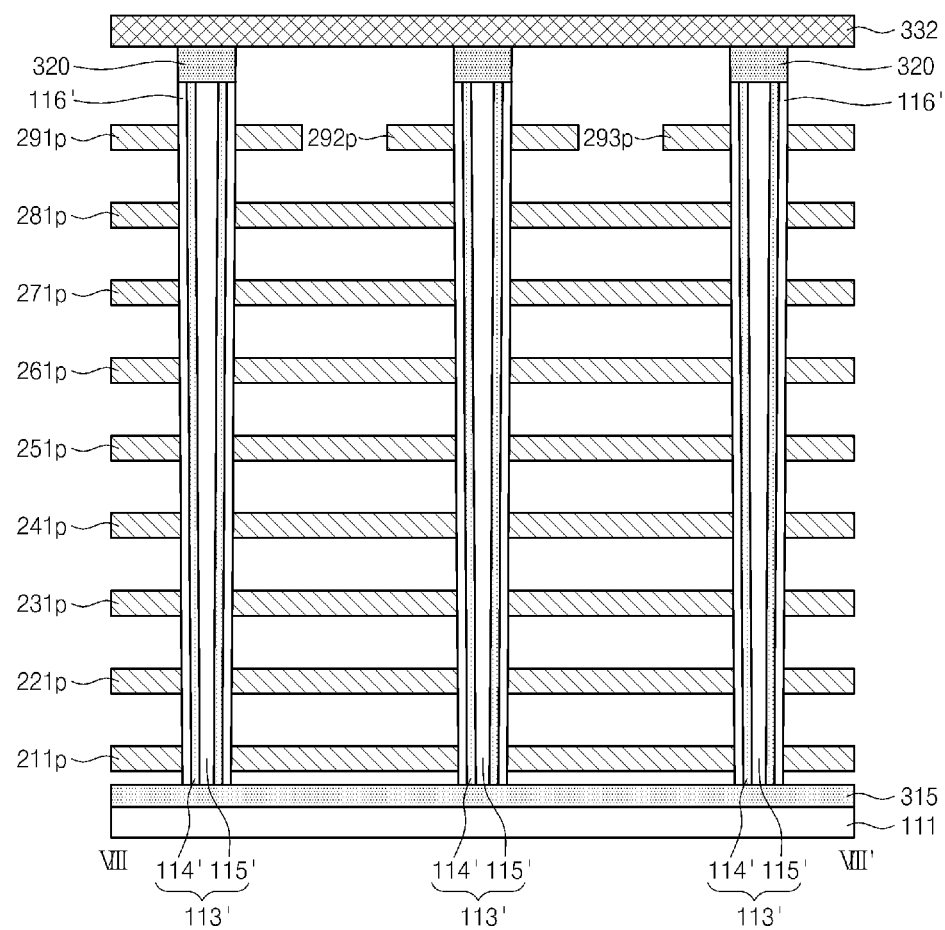
FIG. 52 is a sectional view taken along the line VIII-VIII' of the memory block BLKr of FIG. 51.

FIG. 51 is a perspective view of one of the memory blocks BLK1-BLKz according to example embodiments of inventive concepts. FIG. 52 is a sectional view taken along the line VIII-VIII' of the memory block BLKr of FIG. 51. Referring to FIGS. 51 and 52, as described with reference to FIGS. 43 and 44, an n-type doping region 315 forming a common source line CSL has a plate form.

Compared to the memory block BLKi described with reference to FIGS. 4 through 8, a first conductive material 211p having a first height used for forming a ground selection line GSL has a plate form. First conductive materials 221p to 281p having second to eighth heights used for forming first to seventh word lines WL1 to WL7 have a plate form. First conductive materials 291p, 292p, and 293p having a ninth height used for forming a string selection line SSL extend along the first direction and are spaced apart from each other by a specific distance along the second direction.

A surface layer 116' of each pillar 113' includes an insulation layer. The surface layer 116' of the pillar 113' is configured to store data like the insulation layer 116 described with reference to FIG. 6. For example, the surface layer 116' may include a tunneling insulation layer, a charge storage layer, and a blocking insulation layer. A middle layer 114' of the pillar 113' includes a p-type silicon. The middle layer 114' of the pillar 113' operates as a body of the second direction. An inner layer 115' of the pillar 113' includes an insulation material.

Exemplarily, an erase operation of the memory block BLKr is performed according to the method described with reference to FIGS. 45 through 48.

Exemplarily, an equivalent circuit of the memory block BLKr may be illustrated as the equivalent circuit BLKi_1 shown in FIG. 8. Exemplarily, an equivalent circuit of the memory block BLKr may be illustrated as the equivalent circuits BLKi_2 to BLKi_8 shown in FIGS. 32 through 38. That is, each NAND string of the memory block BLKr may include a lateral transistor LTR. At least one dummy memory cell DMC may be provided between sub blocks of the memory block BLKr. The number of memory cells DMC, which may be further provided between sub blocks of the memory block BLKr, may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

For example, as described with reference to FIGS. 21 through 26, instead of providing dummy memory cells DMC between sub blocks, a thickness of the insulation material 112' between sub blocks may be formed greater than those of other insulation materials 112.

For example, as described with reference to FIGS. 27 through 29, dummy memory cells DMC are not provided, and along a direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

Exemplarily, as described with reference to FIGS. 30 and 31, dummy memory cells DMC are provided between sub blocks and along the direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 18 through 20, while a read operation is performed on a selected sub block among sub blocks of the memory block BLKr, each sub block of the memory block BLKr is selectively refreshed. For example, after data are written on a specific sub block of the memory block BLKr, when the number of reading operations on sub blocks of the memory block BLKr reaches a reference value, a specific sub block is refreshed.

Figure 53:
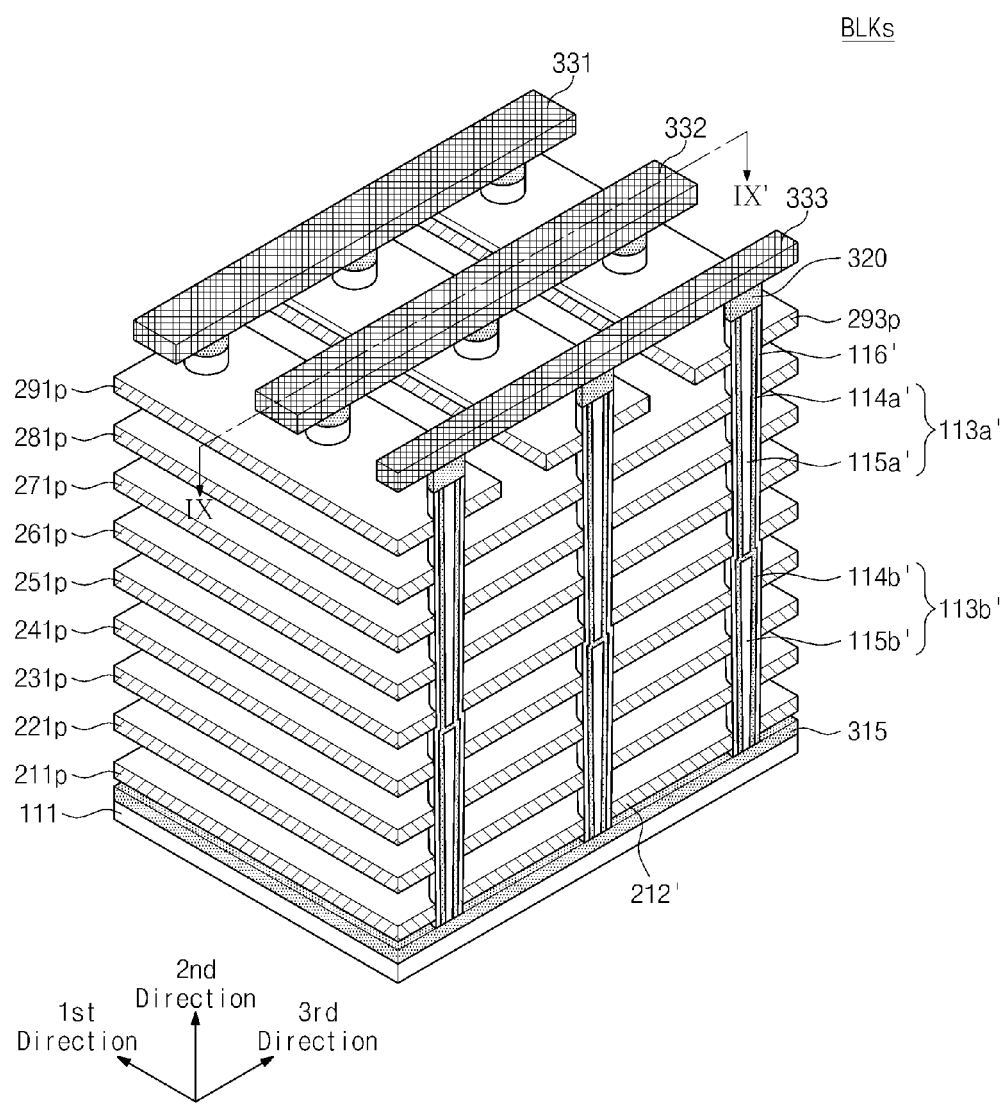
FIG. 53 is a perspective view of one of the memory blocks BLK1-BLKz according to example embodiments of inventive concepts.
Figure 54:
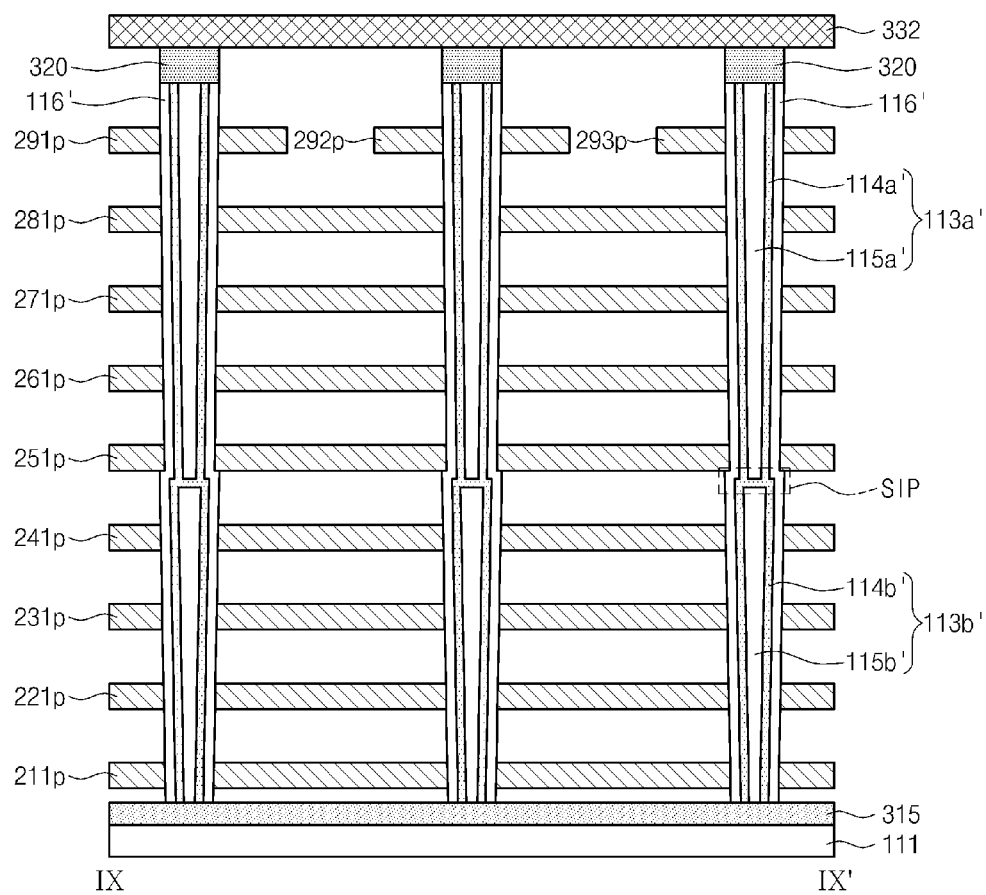
FIG. 54 is a sectional view taken along the line IX-IX' of the memory block BLKs of FIG. 51.

FIG. 53 is a perspective view of one of the memory blocks BLK1-BLKz according to example embodiments of inventive concepts. FIG. 54 is a sectional view taken along the line IX-IX' of the memory block BLKs of FIG. 51. Except that one pillar of the memory block BLKs includes a first sub pillars 113a and a second sub pillars 113b, the memory block BLKs is the same as that described with reference to FIGS. 51 and 52.

As described with reference to FIGS. 39 and 40, one pillar in the memory block BLKs includes a first sub-pillar 113a and a second sub-pillar 113b. The first sub pillars 113a and the second sub pillars 113b are the same as those described with reference to FIGS. 39 and 40.

Exemplarily, an equivalent circuit of the memory block BLKs may be illustrated as the equivalent circuit BLKi_1 shown in FIG. 8. Exemplarily, an equivalent circuit of the memory block BLKs may be illustrated as the equivalent circuits BLKi_2 to BLKi_8 shown in FIGS. 32 through 38. That is, each NAND string of the memory block BLKs may include a lateral transistor LTR. At least one dummy memory cell DMC may be provided between sub blocks of the memory block BLKs. The number of memory cells DMC, which may be further provided between sub blocks of the memory block BLKs, may vary.

In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

Exemplarily, as described with reference to FIGS. 30 and 31, along the direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

As described with reference to FIGS. 39 and 40, first conductive materials 251p, 252p, and 253p having a height corresponding to the silicon pad SIP (i.e., a fifth height) form a dummy word line DWL and a dummy memory cell DMC. That is, the memory block BLKs may be divided into sub blocks based on a height corresponding to the silicon pad SIP.

For example, as described with reference to FIGS. 18 through 20, while a read operation is performed on a selected sub block among sub blocks of the memory block BLKs, each sub block of the memory block BLKs is selectively refreshed. For example, after data are written on a specific sub block of the memory block BLKs, when the number of reading operations on sub blocks of the memory block BLKs reaches a reference value, a specific sub block is refreshed.

Exemplarily, it is described that a pillar includes a first sub pillar 113a and a second sub pillar 113b. However, a pillar may include at least two sub pillars.

Figure 55:
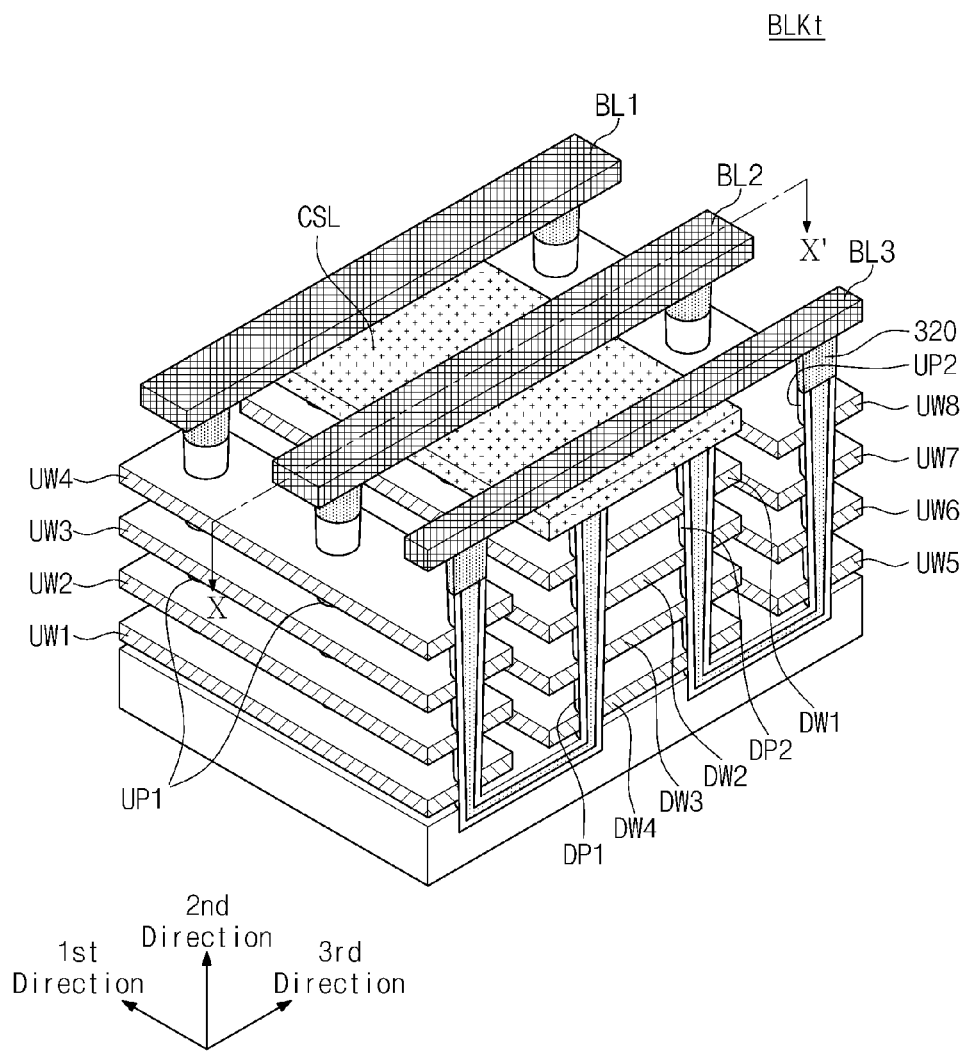
FIG. 55 is a perspective view of one of the memory blocks BLK1-BLKz according to example embodiments of inventive concepts.
Figure 56:
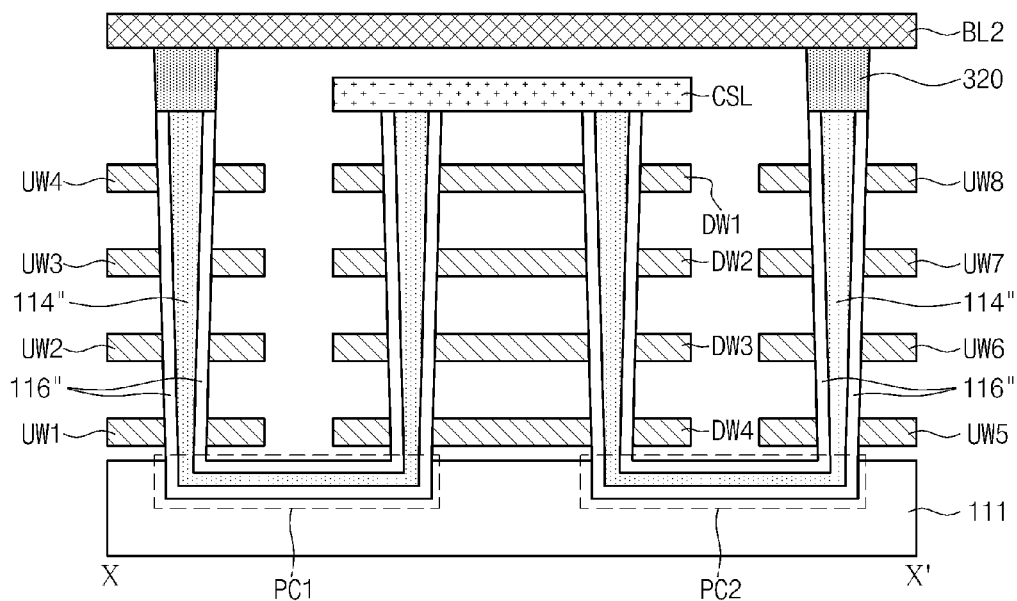
FIG. 56 is a sectional view taken along the line X-X of the memory block BLKt of FIG. 55.

FIG. 55 is a perspective view of one of the memory blocks BLK1-BLKz according to example embodiments of inventive concepts. FIG. 56 is a sectional view taken along the line X-X of the memory block BLKt of FIG. 55. Referring to FIGS. 55 and 56, first to fourth upper word lines UW 1 to UW4 extending in the first direction are provided on a substrate 111. The first to fourth upper word lines UW1 to UW4 are spaced a specific distance from each other along the second direction and first upper pillars UP1 penetrating the first to fourth upper word lines UW1 to UW4 along the second direction are provided.

First to fourth lower word lines DW1 to DW4 extending along the first direction are provided on the substrate. The first to fourth lower word lines DW1 to DW4 are spaced apart from each other along the second direction. The first to fourth lower word lines DW1 to DW4 are spaced a specific distance from the first to fourth upper word lines UW1 to UW4 along a third direction.

First upper pillars DP1 spaced a specific distance from each other along the first direction and penetrating the first to fourth lower word lines DW1 to DW4 along the second direction are provided. Moreover, second upper pillars DP2 spaced a specific distance from each other along the first direction and penetrating the first to fourth lower word lines DW 1 to DW4 along the second direction are provided. For example, the first lower pillars DP1 and the second lower pillars DP2 may be disposed parallel along the second direction. The first lower pillars DP1 and the second lower pillars DP2 are spaced a specific distance apart from each other along the third direction.

Fifth to eighth upper word lines UW5 to UW8 extending along the first direction are provided on the substrate 111. The fifth to eighth upper word lines UW5 to UW8 are spaced a specific distance from each other along the second direction. The fifth to eighth upper word lines UW5 to UW8 are spaced a specific distance apart from the first to fourth lower word lines DW1 to DW4 along the third direction. Second upper pillars UP2 spaced a specific distance apart from each other along the first direction and penetrating the fifth to eighth upper word lines UW5 to UW8 along the second direction are provided.

A common source line CSL extending in the first direction is provided on the top of the first and second lower pillars DP1 and DP2. Exemplarily, the common source line CSL includes an n-type silicon material. Exemplarily, if the common source line CSL is formed of a conductive material without a conductive type such as an n-type or a p-type, n-type sources may be additionally provided between the common source line CSL and the first and second lower pillars DP1 and DP2. For example, a region adjacent to the common source line CSL among regions of the first and second lower pillars DP1 and DP2 is doped with an n-type and thus may operate as a source. Exemplarily, each of the common source line CSL and the first and second lower pillars DP1 and DP2 may be connected through contact plugs. For example, the contact plugs are doped with an n-type and thus may operate as a source.

Drains 320 are provided on the tops of the first and second upper pillars UP1 and UP2, respectively. Exemplarily, the drains 320 may include an n-type silicon material. A plurality of bit lines BL1 to BL3 extending along the third direction are provided on the tops of the drains 320. For example, the bit lines BL1 to BL3 are spaced a specific distance apart from each other along the first direction. Exemplarily, the bit lines BL1 to BL3 are formed of metal. Exemplarily, the bit lines BL1 to BL3 and the drains 320 are connected through contact plugs (not shown).

Each of the first and second upper pillars UP1 and UP2 includes a surface layer 116" and an inner layer 114". As illustrated with reference to FIGS. 51 and 52, the surface layers 116" of the first and second upper pillars UP1 and UP2 and the first and second lower pillars DP1 and DP2 may include a blocking insulation layer, a charge storage layer, and a tunneling insulation layer.

Exemplarily, the tunnel insulation layer includes a thermal oxide layer. The charge storage layer includes a nitride layer or a metal oxide layer (e.g., aluminum oxide layer, a hafnium oxide layer and so on). The blocking insulation layer is formed of a single layer or a multi layer. The blocking insulation layer may be a high dielectric layer (e.g., aluminum oxide layer, a hafnium oxide layer and so on) having a higher dielectric constant than the tunnel insulation layer and the charge storage layer. Exemplarily, the tunnel insulation layer, the charge storage layer, and the blocking insulation layer may constitute oxide-nitride-oxide (ONO).

Inner layers 114" of the first and second upper pillars UP1 and UP2 and the first and second lower pillars DP1 and DP2 may include a p-type silicon material. The inner layers 114" of the first and second upper pillars UP1 and UP2 and the first and second lower pillars DP1 and DP2 operate as a body of the second direction.

The first upper pillars UP1 and the first lower pillars DP1 are connected through first pipeline contacts PC1. Exemplarily, each of the surface layers 116" of the first upper pillars UP1 and the first lower pillars DP1 are connected through the surface layers of the first pipeline contacts PC1. The surface layers of the first pipeline contacts PC1 are formed of the same materials as the surface layers 116" of the first upper pillars UP1 and the first lower pillars DP1.

Exemplarily, each of the inner layers 114" of the first upper pillars UP1 and the first lower pillars DP1 are connected through the inner layers of the first pipeline contacts PC1. The inner layers of the first pipeline contacts PC1 are formed of the same materials as the inner layers 114" of the first upper pillars UP1 and the first lower pillars DP1.

That is, the first upper pillars UP1 and the first to fourth upper word lines UW1 to UW4 form first upper strings, and the first lower pillars DP1 and the first to fourth lower word lines DW1 to DW4 form first lower strings. Each of the first upper strings and the first lower strings is connected through the first pipeline contacts PC1. The drains 320 and the bit lines BL1 to BL3 are connected to one ends of the first upper strings. The common source line CSL is connected to one ends of the first lower strings. That is, the first upper strings and the first lower strings form a plurality of strings connected between the bit lines BL1 to BL3 and the common source line CSL.

Likewise, the second upper pillars UP2 and the fifth to eighth upper word lines UW5 to UW8 form second upper strings, and the second lower pillars DP2 and the first to fourth lower word lines DW1 to DW4 form second lower strings. Each of the second upper strings and the second lower strings is connected through the second pipeline contacts PC2. The drains 320 and the bit lines BL1 to BL3 are connected to one ends of the second upper strings. The common source line CSL is connected to one ends of the second lower strings. That is, the second upper strings and the second lower strings form a plurality of strings connected between the bit lines BL1 to BL3 and the common source line CSL.

Exemplarily, except that eight transistors are provided in one string and two strings are connected to each of the first to third bit lines BL1 to BL3, an equivalent circuit of the memory block BLKt is the same as the BLKi_1 of FIG. 8. Additionally, except that eight transistors are provided in one string and two strings are connected to each of the first to third bit lines BL1 to BL3, an equivalent circuit of the memory block BLKt is the same as the BLKi_2 to BLKi_8 of FIGS. 32 through 38.

That is, each NAND string of the memory block BLKo may include a lateral transistor LTR. At least one dummy memory cell DMC may be provided between sub blocks of the memory block BLKo. The number of memory cells DMC, which may be further provided between sub blocks of the memory block BLKo, may vary. In each NAND string, at least two string selection transistors SST may be provided. In each NAND sting, at least two ground selection transistors GST may be provided. In each NAND string, at least one dummy memory cell DMC may be provided between the memory cells MC and the string selection transistor SST. In each NAND string, at least one dummy memory cell DMC may be provided between the memory cells MC and the ground selection transistor GST.

Exemplarily, in order to form channels in the inner layers 114" in the first and second pipeline contacts PC1 and PC2, first and second pipeline contact gates (not shown) may be provided respectively. Exemplarily, the first and second pipeline contact gates (not shown) may be provided on the surfaces of the first and second pipeline contacts PC1 and PC2.

For example, the first and second pipeline contact gates (not shown) may correspond to the dummy memory cells DMC shown in FIG. 8. That is, the memory block BLKt may be divided into sub blocks based on the first and second pipeline contact gates (not shown). Exemplarily, each of the first and second pipeline contact gates (not shown) may correspond to the two dummy memory cells DMC.

Exemplarily, it is described that the lower word lines DW1 to DW4 are shared in the adjacent lower pillars DP1 and DP2. However, when the upper pillars adjacent to the upper pillars UP 1 and UP2 are added along the third direction, the upper pillars adjacent along the third direction may be configured to share the upper word lines UW1 to UW4 or the upper word lines UW5 to UW8. Exemplarily, the upper word lines UW4 and UW8 having the highest height among the upper word lines UW1 to UW4 or the upper word lines UW5 to UW8 adjacent along the third direction may be spaced a specific distance apart from each other.

Exemplarily, as described with reference to FIGS. 30 and 31, along the direction intersecting (for example, perpendicular to) the substrate 111 in each sub block, each of the first to last memory cells MC1, MC3, MC4, and MC6 has a first size and each of the remaining memory cells MC2 and MC5 has a smaller second size than the first size.

For example, as described with reference to FIGS. 18 through 20, while a read operation is performed on a selected sub block among sub blocks of the memory block BLKo, each sub block of the memory block BLKo is selectively refreshed. For example, after data are written on a specific sub block of the memory block BLKo, when the number of reading operations on sub blocks of the memory block BLKo reaches a reference value, a specific sub block is refreshed.

In the above mentioned example embodiments, it is described that thicknesses of the first conductive materials forming the string selection transistor SST and the ground selection transistor GST are the same as those of the first conductive materials forming the memory cells MC in a sub block. However, thicknesses of the first conductive materials forming the string selection transistor SST and the ground selection transistor GST may be greater than those of the first conductive materials forming the memory cells MC in a sub block.

In the above mentioned example embodiments, it is described that a thickness of the insulation material 112 between the first conductive materials forming the string selection transistor SST and the first conductive materials forming the memory cells MC is the same as that of the insulation material 112 in a sub block. However, a thickness of the insulation material 112 between the first conductive materials forming the string selection transistor SST and the first conductive materials forming the memory cells MC may be greater than that of the insulation material 112 in a sub block.

In the above mentioned example embodiments, it is described that a thickness of the insulation material 112 between the first conductive materials forming the ground selection transistor GST and the first conductive materials forming the memory cells MC is the same as that of the insulation material 112 in a sub block. However, a thickness of the insulation material 112 between the first conductive materials forming the ground selection transistor GST and the first conductive materials forming the memory cells MC may be greater than that of the insulation material 112 in a sub block.

In the above mentioned example embodiments, it is described that selection transistors may have the same structure as memory cells that may include a first insulating layer, a charge trap layer, blocking layer and a gate electrode. Depending on the magnitude of a voltage applied to a gate electrode, selection transistors may perform the same function as memory cells. However, selection transistors need not have the same structure as memory cells. For example, selection transistors need not have charge trap layers or an active pillar.

Figure 57:
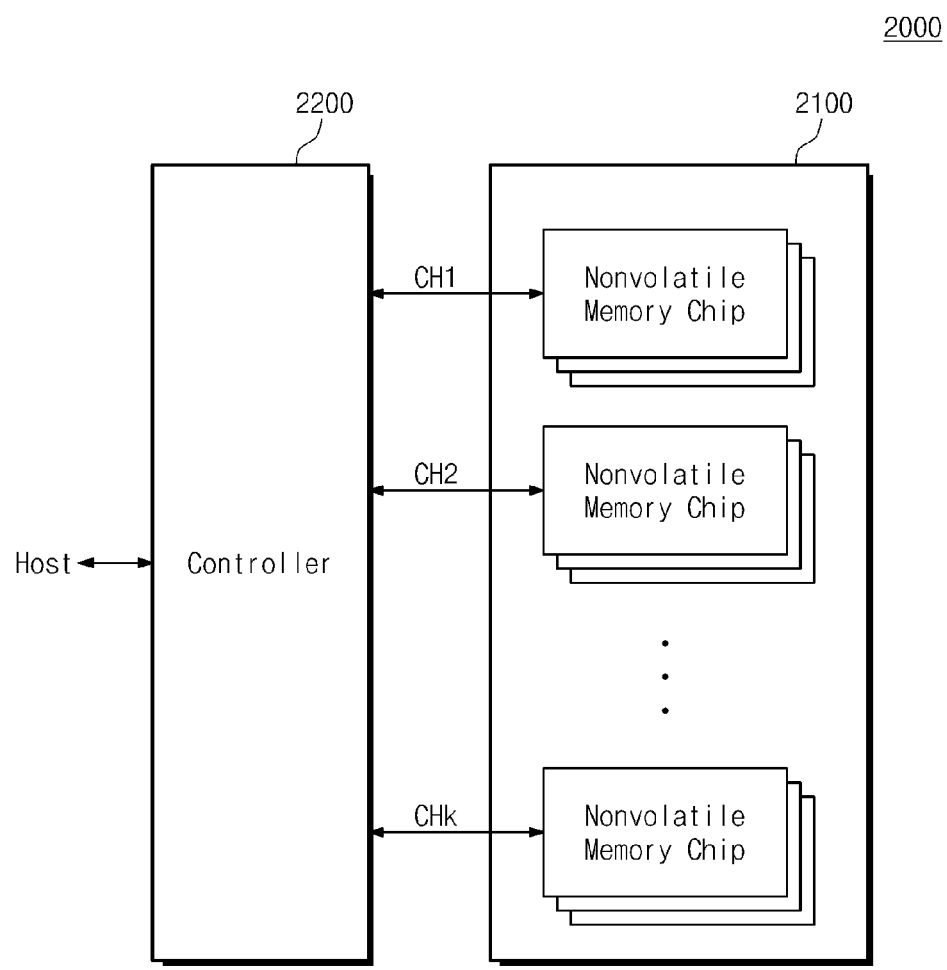
FIG. 57 is a block diagram illustrating an application example of the memory system 1000 of FIG. 1.

FIG. 57 is a block diagram illustrating an application example of the memory system 1000 of FIG. 1. Referring to FIG. 57, a memory system 2000 includes a nonvolatile memory device 2100 and/or a controller 2200. The nonvolatile memory device 2100 includes a plurality of nonvolatile memory chips. The plurality of nonvolatile memory chips are divided by groups. Each group of the nonvolatile memory chips is configured to communicate with the controller 2200 through one common channel. In FIG. 57, it is illustrated that the plurality of nonvolatile memory chips communicate with the controller 2200 through first to kth channels CH1 to CHk. Each nonvolatile memory chip has same configuration as the nonvolatile memory device 100 described with reference to FIGS. 1 through 56.

Exemplarily, the controller 2200 is configured to control the nonvolatile memory device 2100. For example, the controller 2200 is configured o control a refresh operation of the nonvolatile memory device 2100. As described with reference to FIGS. 18 through 20, the controller 2200 controls a refresh operation of the nonvolatile memory device 2100.

The controller 2200 communicates with a plurality of nonvolatile memory chips through a plurality of channels. Accordingly, when a refresh operation is performed in one nonvolatile memory chip connected to a specific channel, nonvolatile memory chips connected to another channel continue in a standby state. That is, while a refresh operation is performed in one nonvolatile memory chip connected to one channel, operations such as writing, reading, and erasing may be performed in the nonvolatile memory chip connected to another channel.

Figure 58:
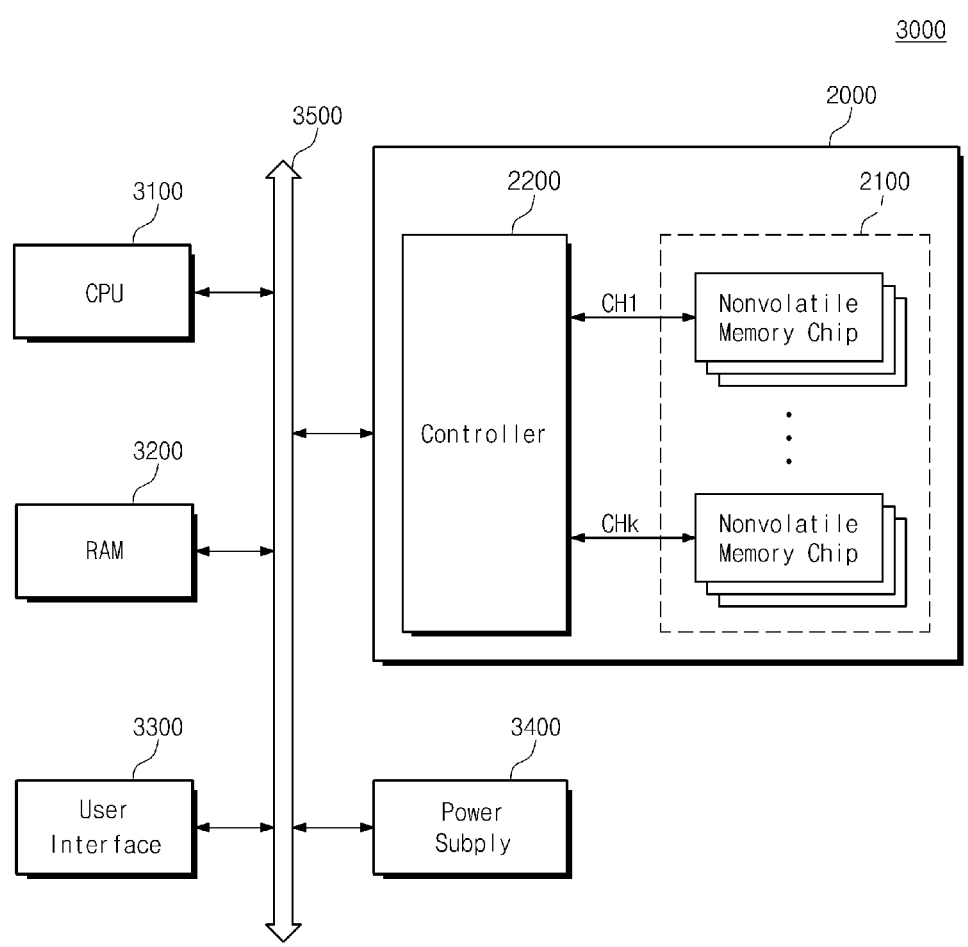
FIG. 58 is an example block diagram illustrating a computing system 300 with the memory system 2000 described with reference to FIG. 57.

FIG. 58 is a block diagram illustrating a computing system 3000 with the memory system 2000 described with reference to FIG. 57. Referring to FIG. 58, the computing system 3000 includes a central processing unit (CPU) 3100, a random access memory (RAM) 3200, a user interface 3300, a power 3400, a system bus 3500 and/or the memory system 2000.

The memory system 2000 is electrically connected to the CPU 3100, the RAM 3200, and the power 3400 through the system bus 3500. Data provided through a user interface 3300 or processed by the CPU 3100 are stored in the memory system 2000. The memory system 2000 includes a controller 2200 and a nonvolatile memory device 2100.

In FIG. 58, it is illustrated that the nonvolatile memory device 2100 is connected to the system bus 3500 through the controller 2200. However, the nonvolatile memory device 2100 may be directly connected to the system bus 3500. At t his point, the CPU 3100 controls a refresh operation of the nonvolatile memory device 2100.

In FIG. 58, it is described that the memory system 200 described with FIG. 57 is provided. However, the memory system 2000 may be replaced with the memory system 1000 described with FIG. 1.

Exemplarily, the computing system 3000 may be configured to include all the memory systems 1000 and 2000 described with reference to FIGS. 1 and 57.

According to example embodiments of inventive concepts, a memory block includes a plurality of sub blocks and performs an erase operation by a sub block unit. Since a merge unit is reduced, a nonvolatile memory device having an improved operating speed, an operating method of the same, and a memory system including the same may be provided.

According to example embodiments of inventive concepts, a sub block is refreshed according to the number of reading operations on a memory block after data are written into sub blocks. Since the number of reading operations on another sub block in the same memory block is considered, a nonvolatile memory device having an improved operating speed, an operating method of the same, and a memory system including the same may be provided.

According to example embodiments of inventive concepts, a dummy memory cell is provided at an interface of adjacent sub blocks. Since a medium voltage is applied to a dummy word line connected to a dummy memory cell, coupling between sub blocks is reduced. Accordingly, a nonvolatile memory device having an improved operating speed, an operating method of the same, and a memory system including the same may be provided.

According to example embodiments of inventive concepts, a distance between memory cells provided at an interface of adjacent sub blocks is longer than that between memory cells in each sub block. Since coupling between sub blocks is reduced, a nonvolatile memory device having an improved operating speed, an operating method of the same, and a memory system including the same may be provided.

According to example embodiments of inventive concepts, a size of a memory cell provided at the outline of a sub block is greater than that of a memory cell provided in the sub block. Since coupling between a memory cell at the outline of the sub block and a channel is enhanced, a nonvolatile memory device having an improved operating speed, an operating method of the same, and a memory system including the same may be provided.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of erasing at least one selected sub block of a nonvolatile memory device, the method comprising:
   allowing each of at least one string select lines to float, the nonvolatile memory device including the at least one string select line, the nonvolatile memory device including a memory cell array including a substrate and a plurality of memory blocks, each of the plurality of memory blocks including a plurality of memory cells stacked in a direction perpendicular to the substrate, each of the plurality of memory cells connected to at least one word line, each of the plurality of memory blocks further including at least one string select transistor connected to the at least one string select line, at least one ground select transistor connected to at least one ground select line, and at least one separator, connected to at least one dummy word line, separating the memory cells into a plurality of sub blocks;
   applying a first voltage to the at least one word line of the at least one selected sub block;
   applying a second voltage to the at least one dummy word line;
   allowing each of the at least one ground select lines to float; and
   applying an erase voltage to the substrate to erase the at least one selected sub block.

2. The method of claim 1, further comprising:
allowing each of the at least one word lines for unselected sub blocks of the plurality of sub blocks to float.

3. The method of claim 1, further comprising:
applying a word line erase-inhibit voltage to each of the at least one word lines for unselected sub blocks of the plurality of sub blocks.

4. The method of claim 1, wherein the plurality of memory cells each include a plurality of transistors, each acting as an individual memory cell, wherein a common active pillar acts as a channel for the plurality of transistors, and a first pillar and a second pillar act as a channel for the at least one ground select transistor and the at least one string select transistor, respectively and wherein the substrate, the first pillar, the second pillar, and the common active pillar have the same polarity.

5. The method of claim 4, wherein the erase voltage is transferred from the substrate to the first pillar and from the first pillar to the at least one ground select line to raise a voltage of the at least one ground select line to a ground select voltage, wherein a difference between the ground select voltage and the erase voltage is insufficient to turn on the at least one ground select transistor.

6. The method of claim 4, wherein the erase voltage is transferred from the substrate to the common active pillar and from the common active pillar to the at least one word lines connected to the plurality of transistors of the at least one selected sub block to raise a voltage of the at least one word lines of the plurality of transistors of the at least one selected sub block to a word line erase voltage, wherein a difference between the word line erase voltage and the erase voltage is sufficient to turn on the plurality of transistors of the at least one selected sub block.

7. The method of claim 4, wherein the erase voltage is transferred from the substrate to the common active pillar and from the common active pillar to the at least one dummy word line to raise a voltage of the at least one dummy word line to a dummy word line voltage, wherein a difference between the dummy word line voltage and the erase voltage insufficient to turn on the at least one dummy transistor.

8. The method of claim 4, wherein the erase voltage is transferred from the substrate to the second pillar and from the second pillar to the at least one string select line to raise a voltage of the at least one string select line to a string select line voltage, wherein a difference between the string select line voltage and the erase voltage is insufficient to turn on the at least one string select transistor.

9. The method of claim 4, wherein the erase voltage is transferred from the substrate to the common active pillar and from the common active pillar to the at least one word lines connected to the plurality of transistors of the of the unselected sub blocks to raise a voltage of the at least one word lines of the plurality of transistors of the unselected sub blocks to an unselected word line voltage, wherein a difference between the unselected word line voltage and the erase voltage is insufficient to turn on the plurality of transistors of the unselected sub blocks.

10. The method of claim 4, wherein the erase voltage is transferred from the substrate to the common active pillar and from the common active pillar to the at least one word lines connected to the plurality of transistors of the of the unselected sub blocks to raise a voltage of the at least one word lines of the plurality of transistors of the unselected sub blocks to an unselected word line voltage, wherein a difference between the unselected word line voltage and the erase voltage is insufficient to turn on the plurality of transistors of the unselected sub blocks.

11. The method of claim 1, wherein the erase voltage is greater than the first voltage.

12. The method of claim 1, wherein the first voltage is a ground voltage.

13. The method of claim 1, wherein the dummy word line voltage is between the erase voltage and the first voltage.

14. The method of claim 1, wherein the dummy word line voltage is between the erase voltage and an unselected word line voltage.

15. The method of claim 1, wherein
the at least one ground select transistor includes a plurality of ground select transistors connected to a corresponding one of the at least one ground select line,
the at least one string select transistor includes a plurality of string select transistors connected to a corresponding one of the at least one string select line,
the plurality of memory cells are arranged as a plurality of NAND strings, and
each one of the plurality of NAND strings includes a corresponding number of the plurality of memory cells stacked and electrically connected vertically on top of each other between a corresponding one of the ground select transistors and a corresponding one of the string select transistors.

16. The method of claim 1, wherein
the at least one separator separates the plurality of sub blocks into a first sub block and a second sub block, and
the plurality of memory cells of the second sub block are on top of the plurality of memory cells of the first sub block between the at least one string select transistor and the at least one ground select transistor.

17. A method of refreshing a nonvolatile memory device, including a substrate and a memory cell array, the memory cell array including a plurality of memory blocks, the method comprising:
performing a program operation on a memory block among the plurality of memory blocks;
counting a number of read cycles after the program operation for each of a plurality of sub blocks of the memory block, each of the plurality of memory blocks including a plurality of memory cells and at least one separator sharing a common active pillar acting as a channel for the plurality of memory cells, the at least one separator separating the memory cells into the plurality of sub blocks; and
when the number of read cycles of one of the plurality of sub blocks reaches a threshold, selectively refreshing the one of the plurality of sub blocks.

18. The method of claim 17, wherein
the at least one separator separates the plurality of sub blocks into a first sub block and a second sub block, and
memory cells of the second sub block are on top of memory cells of the first sub block.

19. The method of claim 17, wherein the plurality of memory cells and the at least one separator are vertically stacked and electrically connected each other on a substrate.

20. The method of claim 17, wherein when a read operation is performed on a sub block among the plurality of sub blocks, the read cycles for each of the plurality of sub blocks increase.

21. The method of claim 17, wherein first read cycles for a first sub block among the plurality of sub blocks are counted after the first sub block is programmed, and second read cycles for a second sub block among the plurality of sub blocks are counted after the second sub block is programmed.

* * * * *